(12) United States Patent
Okada et al.

(10) Patent No.: US 11,088,637 B2
(45) Date of Patent: Aug. 10, 2021

(54) POWER GENERATING ELEMENT

(71) Applicant: TRI-FORCE MANAGEMENT CORPORATION, Saitama (JP)

(72) Inventors: Kazuhiro Okada, Saitama (JP); Satoshi Era, Saitama (JP); Miho Okada, Saitama (JP)

(73) Assignee: TRI-FORCE MANAGEMENT CORPORATION, Saitama (JP)

( * ) Notice: Subject to any disclaimer, the term of this patent is extended or adjusted under 35 U.S.C. 154(b) by 266 days.

(21) Appl. No.: 16/210,479

(22) Filed: Dec. 5, 2018

(65) Prior Publication Data

US 2019/0199243 A1 Jun. 27, 2019

Related U.S. Application Data

(62) Division of application No. 14/914,854, filed as application No. PCT/JP2014/063526 on May 15, 2014, now Pat. No. 10,177,689.

(30) Foreign Application Priority Data

Sep. 4, 2013 (JP) .................................. 2013-182748

(51) Int. Cl.
 *H02N 2/18* (2006.01)
 *H01L 41/113* (2006.01)
 *H01L 41/053* (2006.01)
(52) U.S. Cl.
 CPC ........... *H02N 2/186* (2013.01); *H01L 41/053* (2013.01); *H01L 41/1136* (2013.01); *H02N 2/188* (2013.01)
(58) Field of Classification Search
 CPC ............... H01L 41/113; H01L 41/1132; H01L 41/1134; H01L 41/1136; H01L 41/1138
 (Continued)

(56) References Cited

U.S. PATENT DOCUMENTS

| 4,905,523 A | 3/1990 | Okada |
| 4,967,605 A | 11/1990 | Okada |

(Continued)

FOREIGN PATENT DOCUMENTS

| CN | 2014 14085 Y | 2/2010 |
| CN | 102710168 A | 10/2012 |

(Continued)

OTHER PUBLICATIONS

International Search Report (ISR) dated Sep. 4, 2013 for International Application No. PCT/JP2014/063526.

(Continued)

*Primary Examiner* — Derek J Rosenau
(74) *Attorney, Agent, or Firm* — Ladas & Parry LLP

(57) ABSTRACT

The power generation efficiency is to be enhanced by converting vibration energy including various direction components into electric energy without waste. A cantilever structure is adopted, in which a first plate-like bridge portion (120) and a second plate-like bridge portion (130) extend in a shape of a letter U from a fixing-portion (110) fixed to the device housing (200) and a weight body (150) is connected to the end. On the upper surface of the cantilever structure, a common lower layer electrode (E00), a layered piezoelectric element (300) and discrete upper layer electrodes (Ex1 to Ez4) are formed. The upper layer electrodes (Ez1 to Ez4) disposed on a center line (Lx, Ly) of each plate-like bridge portion take out charge generated in the piezoelectric element (300) due to deflection caused by the Z-axis direction vibration of the weight body (150). The upper layer electrodes (Ex1 to Ex4, Ey1 to Ey4) disposed on both sides of the center line (Lx, Ly) of the plate-like bridge portion take out charge generated in the piezoelectric element (300) due to deflection caused by the X-axis or Y-axis direction vibration of the weight body (150).

4 Claims, 27 Drawing Sheets

(58) Field of Classification Search
USPC .................................................. 310/329, 339
See application file for complete search history.

(56) References Cited

U.S. PATENT DOCUMENTS

| | | | |
|---|---|---|---|
| 4,969,366 A | 11/1990 | Okada | |
| 5,014,415 A | 5/1991 | Okada | |
| 5,035,148 A | 7/1991 | Okada | |
| 5,092,645 A | 3/1992 | Okada | |
| 5,182,515 A | 1/1993 | Okada | |
| 5,263,375 A | 11/1993 | Okada | |
| 5,295,386 A | 3/1994 | Okada | |
| 5,343,765 A | 9/1994 | Okada | |
| 5,365,799 A | 11/1994 | Okada | |
| 5,392,658 A | 2/1995 | Okada | |
| 5,406,848 A | 4/1995 | Okada | |
| 5,421,213 A | 6/1995 | Okada | |
| 5,437,196 A | 8/1995 | Okada | |
| 5,492,020 A | 2/1996 | Okada | |
| 5,497,668 A | 3/1996 | Okada | |
| 5,531,002 A | 7/1996 | Okada | |
| 5,531,092 A | 7/1996 | Okada | |
| 5,571,972 A | 11/1996 | Okada | |
| 5,639,973 A | 6/1997 | Okada | |
| 5,646,346 A | 7/1997 | Okada | |
| 5,668,318 A | 9/1997 | Okada | |
| 5,682,000 A | 10/1997 | Okada | |
| 5,744,718 A | 4/1998 | Okada | |
| 5,780,749 A | 7/1998 | Okada | |
| 5,811,693 A | 9/1998 | Okada | |
| 5,831,163 A | 11/1998 | Okada | |
| 5,850,040 A | 12/1998 | Okada | |
| 5,856,620 A | 1/1999 | Okada | |
| 5,962,878 A | 10/1999 | Okada et al. | |
| 5,987,985 A | 11/1999 | Okada | |
| 6,003,371 A | 12/1999 | Okada | |
| 6,053,057 A | 4/2000 | Okada | |
| 6,076,401 A | 6/2000 | Okada | |
| 6,098,461 A | 8/2000 | Okada | |
| 6,158,291 A | 12/2000 | Okada | |
| 6,159,761 A | 12/2000 | Okada | |
| 6,185,814 B1 | 2/2001 | Okada | |
| 6,205,856 B1 | 3/2001 | Okada | |
| 6,269,697 B1 | 8/2001 | Okada | |
| 6,282,956 B1 | 9/2001 | Okada | |
| 6,314,823 B1 | 11/2001 | Okada | |
| 6,367,326 B1 | 4/2002 | Okada | |
| 6,378,381 B1 | 4/2002 | Okada et al. | |
| 6,474,133 B1 | 11/2002 | Okada | |
| 6,477,903 B2 | 11/2002 | Okada | |
| 6,512,364 B1 | 1/2003 | Okada | |
| 6,530,283 B2 | 3/2003 | Okada et al. | |
| 6,716,253 B2 | 4/2004 | Okada | |
| 6,772,632 B2 | 8/2004 | Okada | |
| 6,779,408 B2 | 8/2004 | Okada | |
| 6,809,529 B2 | 10/2004 | Okada et al. | |
| 6,859,048 B2 | 2/2005 | Okada et al. | |
| 6,864,677 B1 | 3/2005 | Okada | |
| 6,865,943 B2 | 3/2005 | Okada | |
| 6,894,482 B2 | 5/2005 | Okada | |
| 6,915,709 B2 | 7/2005 | Okada | |
| 6,920,788 B2 | 7/2005 | Okada | |
| 6,941,810 B2 | 9/2005 | Okada | |
| 6,990,867 B2 | 1/2006 | Okada | |
| 7,059,188 B2 | 6/2006 | Okada | |
| 7,075,527 B2 | 7/2006 | Takagi et al. | |
| 7,121,147 B2 | 10/2006 | Okada | |
| 7,123,028 B2 | 10/2006 | Okada et al. | |
| 7,152,485 B2 | 12/2006 | Okada | |
| 7,219,561 B2 | 5/2007 | Okada | |
| 7,231,802 B2 | 6/2007 | Okada | |
| 7,360,455 B2 | 4/2008 | Okada | |
| 7,363,814 B2 | 4/2008 | Okada | |
| 7,533,582 B2 | 5/2009 | Okada | |
| 7,578,162 B2 | 8/2009 | Okada | |
| 7,882,740 B2 | 2/2011 | Okada | |
| 7,900,513 B2 | 3/2011 | Okada | |
| 8,408,075 B2 | 4/2013 | Okada | |
| 8,667,854 B2 | 3/2014 | Nishioki et al. | |
| 8,966,996 B2 | 3/2015 | Okada et al. | |
| 9,995,644 B2 | 6/2018 | Nishioki et al. | |
| 2007/0114890 A1 | 5/2007 | Churchill et al. | |
| 2013/0154439 A1 | 6/2013 | Lee et al. | |
| 2013/0239681 A1* | 9/2013 | Fujii | G01C 19/5607 73/504.12 |
| 2013/0313946 A1* | 11/2013 | Lee | H02N 2/186 310/339 |
| 2016/0041049 A1 | 2/2016 | Okada et al. | |

FOREIGN PATENT DOCUMENTS

| | | |
|---|---|---|
| DE | 100 59 785 A1 | 6/2002 |
| JP | 10-243667 A | 9/1998 |
| JP | 2008-537847 A | 9/2008 |
| JP | 2010-273408 A | 12/2010 |
| JP | 2011-152010 A | 8/2011 |
| JP | 2012-26453 A | 2/2012 |
| JP | 2013-143874 A | 7/2013 |
| JP | 2013-158117 A | 8/2013 |
| JP | 2013-243821 A | 12/2013 |
| JP | 5529328 B1 | 4/2014 |
| JP | 5674973 B1 | 1/2015 |
| JP | 5694597 B2 | 2/2015 |
| JP | 5775644 B2 | 7/2015 |
| JP | 5833790 B2 | 11/2015 |
| WO | 2012/026453 A1 | 3/2012 |
| WO | 2012/090452 A1 | 7/2012 |

OTHER PUBLICATIONS espacenet English abstract of JP 10-243667 A.
espacenet English abstract of JP 2011-152010 A.
J-PlatPat English translation of JP 2013-143874 A.
J-PlatPat English translation of JP 2008-537847 A.
J-PlatPat English translation of JP 2010-273408 A.
U.S. Appl. No. 14/904,559.
U.S. Appl. No. 09/653,790 (abandoned).
Japanese Office Action (Reason of Rejection) with an English translation dated Jul. 22, 2014 for Japanese Application No. 2014-0844.
International Preliminary Report on Patentability (IPRP) with an English translation dated Mar. 8, 2016 for International Application No. PCT/JP2014/063526.
Chinese Office Action dated Mar. 6, 2017 for Chinese Application 201480048632.3.
English translation of CN 102710168 A.
Decision to Grant a Patent dated Jan. 10, 2017 for Japanese Application No. 2016182328 with English translation.
Chinese Office Action dated Nov. 15, 2017 for Chinese Application No. 201480048632.3.
espacenet English abstract of JP 2013-158117 A.
espacenet English abstract of WO 2012/090452 A1.
espacenet English abstract of WO 2012/026453 A1.
espacenet English abstract of DE 100 59 785 A1.
Machine translation of DE 100 59 785 A1.
First Office Action dated Jan. 13, 2016 for Japanese Application No. 2015/213040.
espacenet English abstract of JP 2012-26453 A.
espacenet English abstract of JP 2013-243821 A.
espacenet English abstract of JP 2015-050889 A which corresponds to JP 5529328 B1.
espacenet English abstract of JP 2015-050922 A which corresponds to JP 5674973 B1.
espacenet English abstract of JP 2015-050935 A which corresponds to JP 5694597 B2.
espacenet English abstract of JP 2015-130794 A which corresponds to JP 5775644 B2.

(56) References Cited

OTHER PUBLICATIONS espacenet English abstract of JP 2015-19571 A which corresponds to JP 5833790 B2.

\* cited by examiner

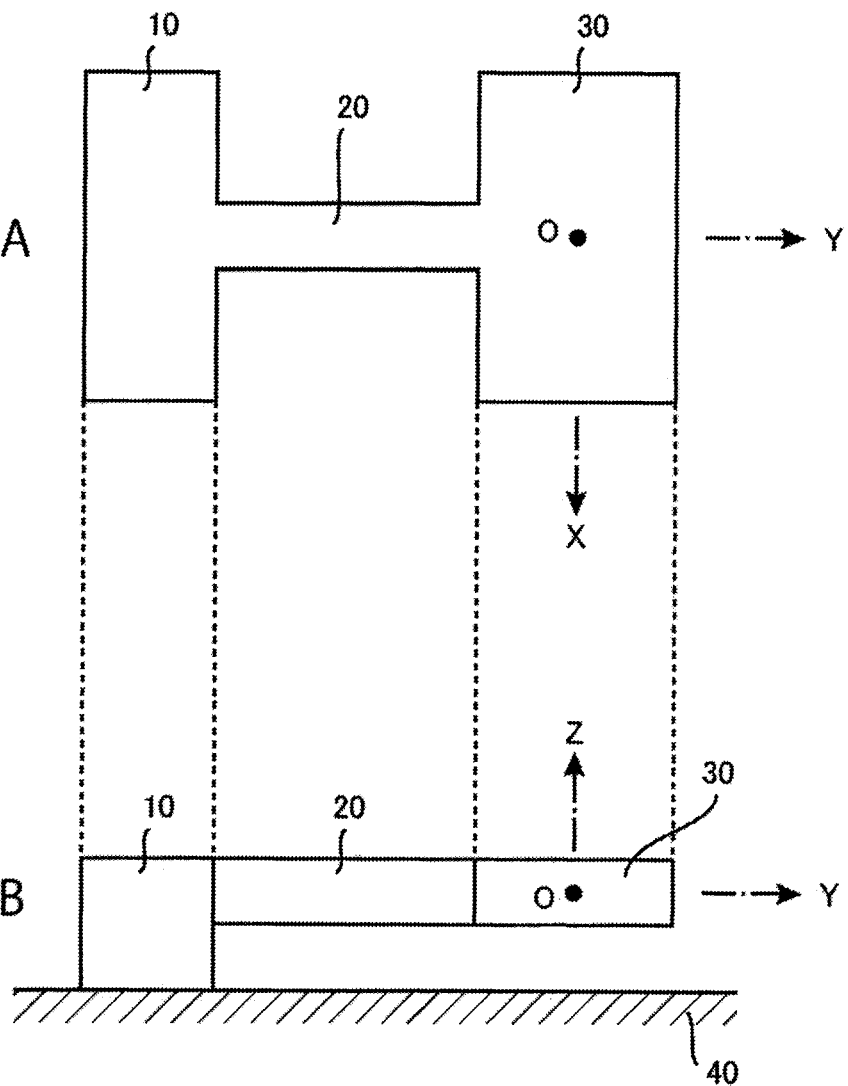

|  | E11 | E12 | E13 | E21 | E22 | E23 | E0 |
|---|---|---|---|---|---|---|---|
| Δx(+) | − | 0 | + | − | 0 | + | 0 |
| Δy(+) | 0 | 0 | 0 | 0 | 0 | 0 | 0 |
| Δz(+) | − | − | − | − | − | − | +++++ |

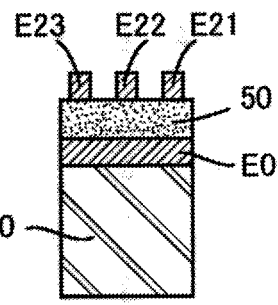
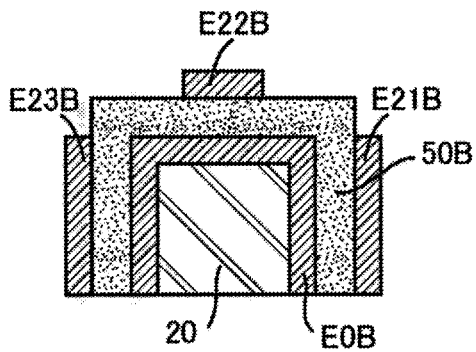
FIG. 8A  FIG. 8B
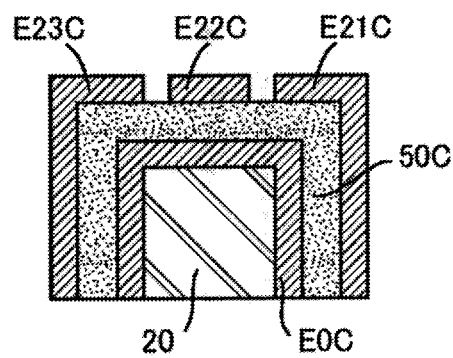
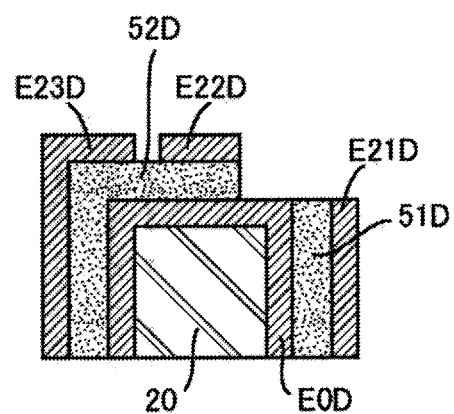
FIG. 8C  FIG. 8D

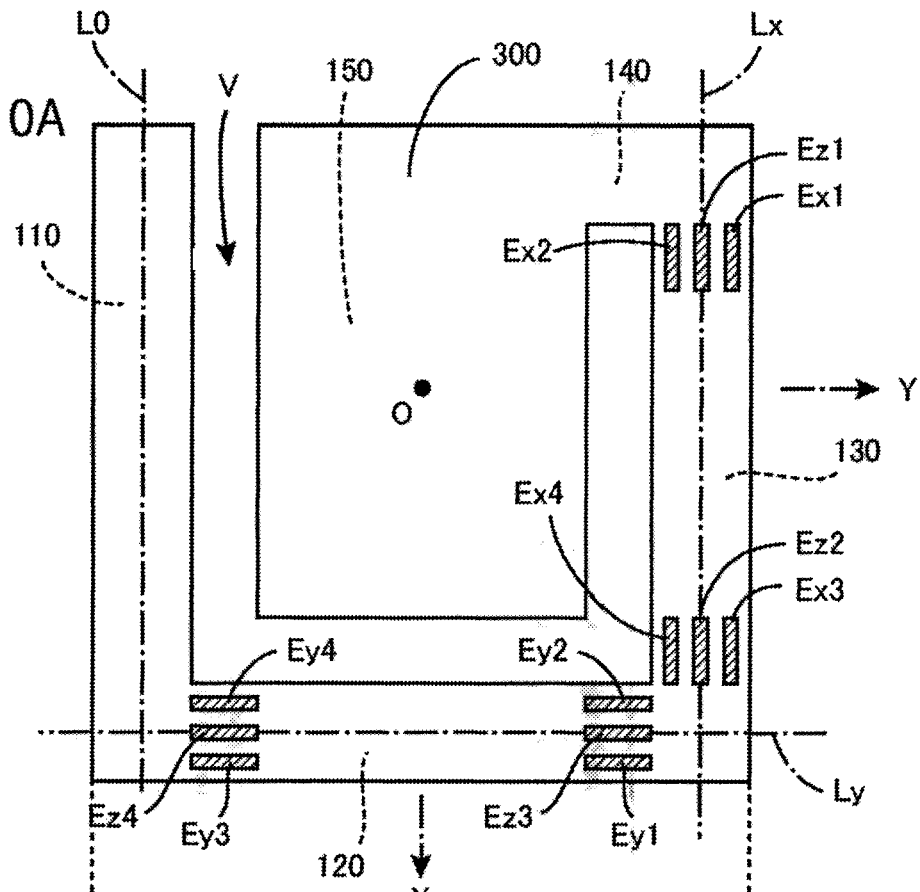
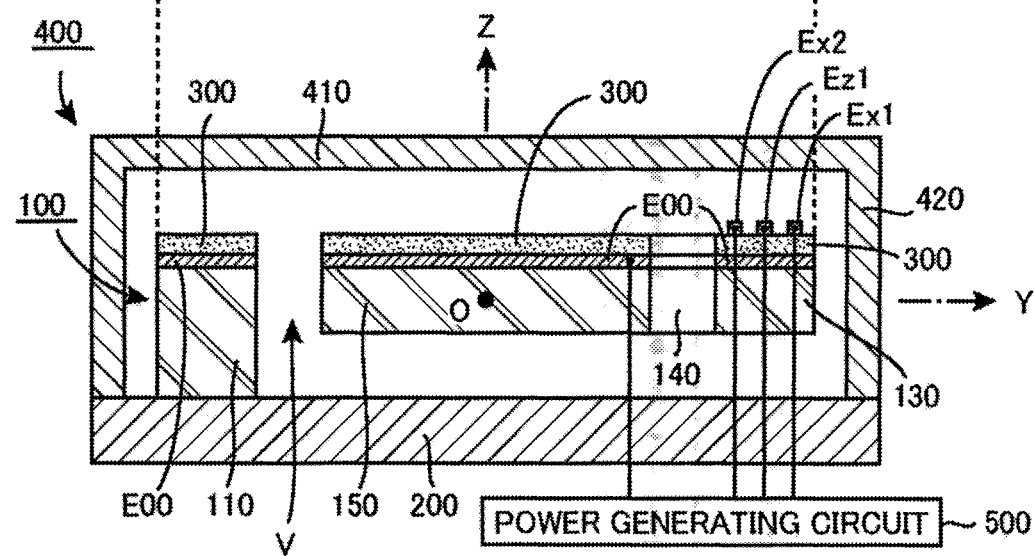

|  | Ex1 | Ex2 | Ex3 | Ex4 | Ey1 | Ey2 | Ey3 | Ey4 | Ez1 | Ez2 | Ez3 | Ez4 | E00 |
|---|---|---|---|---|---|---|---|---|---|---|---|---|---|
| $\Delta x(+)$ | + | − | + | − | + | − | − | + | 0 | 0 | 0 | 0 | 0 |
| $\Delta y(+)$ | + | − | − | + | − | + | − | + | 0 | 0 | 0 | 0 | 0 |
| $\Delta z(+)$ | + | + | − | − | + | + | − | − | + | − | + | − | 0 |

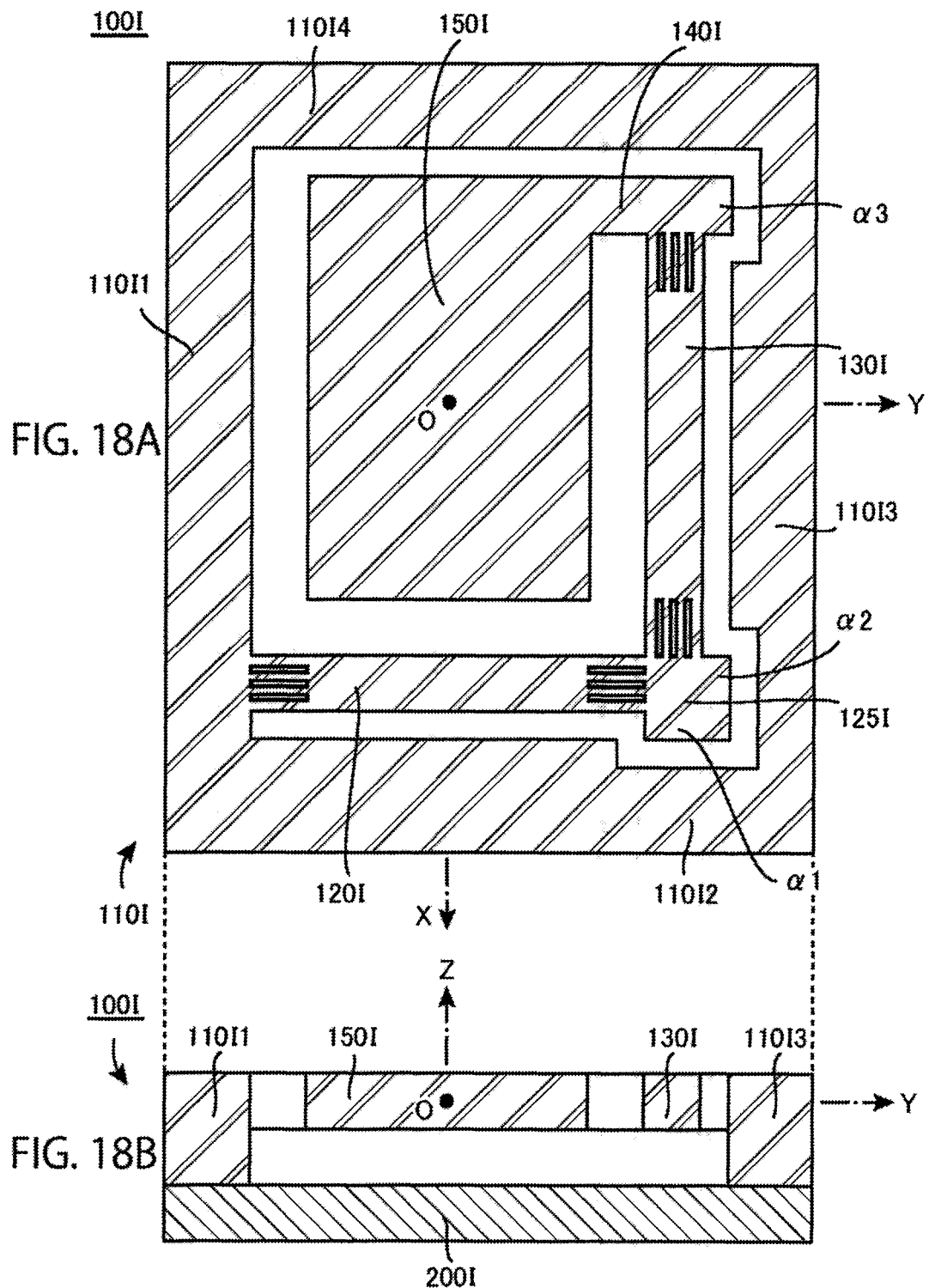

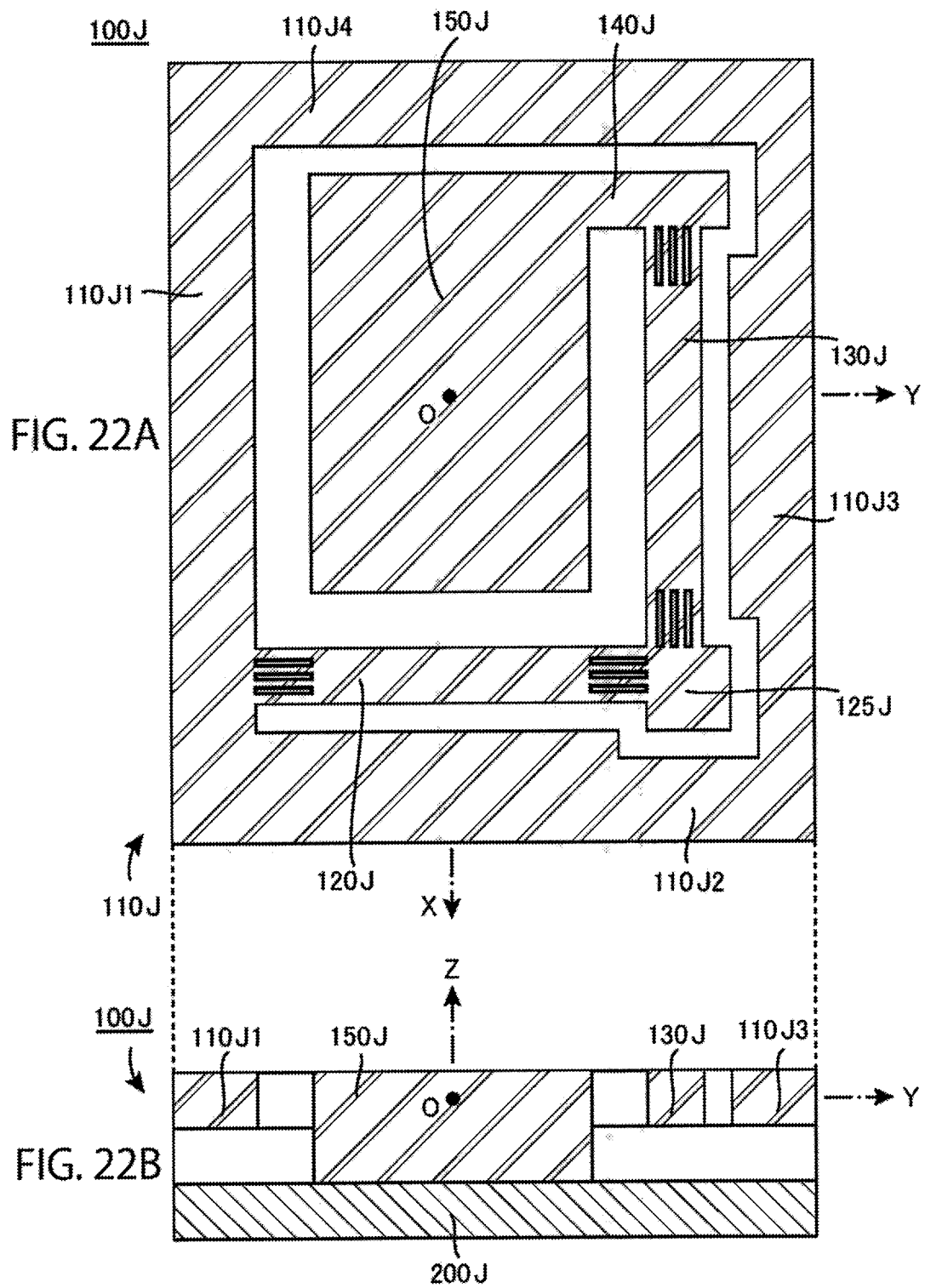

FIG. 28
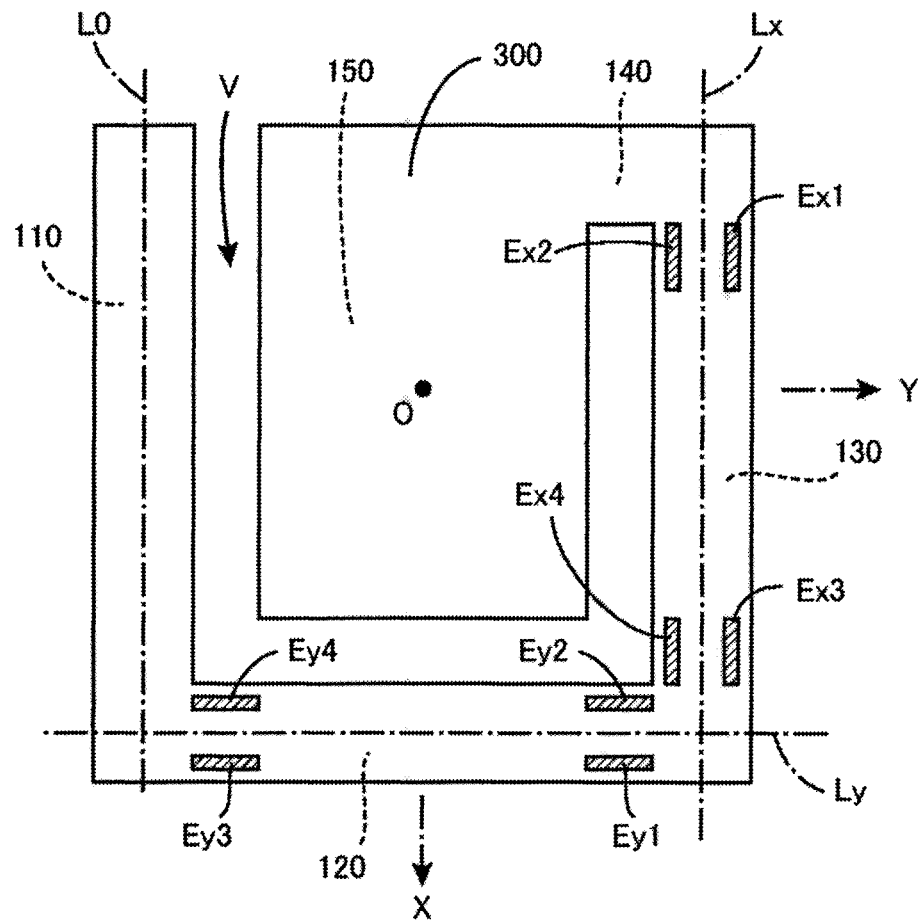
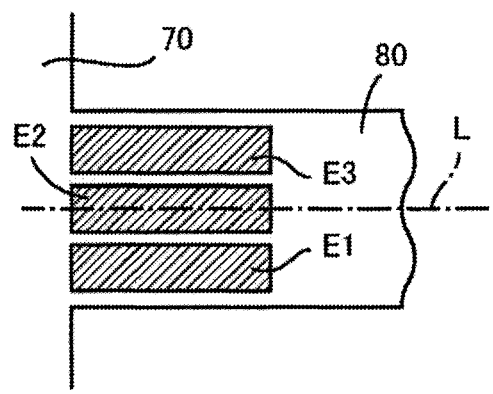
FIG. 29A
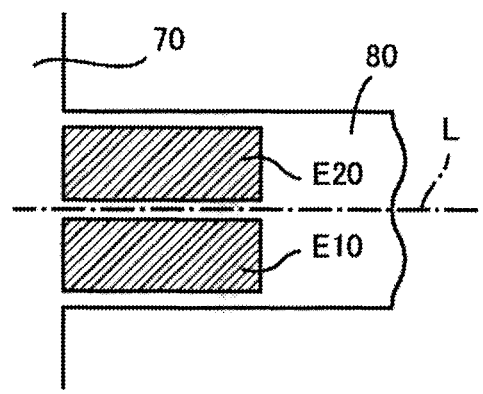
FIG. 29B

POWER GENERATING ELEMENT

RELATED APPLICATION

This application is a divisional of application Ser. No. 14/914,854 filed on Feb. 26, 2016, which is an application under 35 U.S.C. 371 of International Application No. PCT/JP2014/063526 filed on May 15, 2014, the entire contents of each of which are incorporated herein by reference.

FIELD OF THE INVENTION

The present invention relates to a power generating element and in particular to technology for generating electric power by converting vibration energy into electric energy.

BACKGROUND ART

In order to attain the effective use of limited resources, there have been proposed technologies for taking out electric energy through conversion of various types of energy. One of them is technology for taking out electric energy through conversion of vibration energy. For example, Patent Document 1 given below discloses a piezoelectric-type power generating element in which a layered piezoelectric element is laminated to form a piezoelectric element for power generation, and an external force is used to cause the piezoelectric element for power generation to vibrate, thereby generating electric power. Further, Patent Document 2 discloses a power generating element which has an MEMS (Micro Electro Mechanical System) structure using a silicon substrate.

A basic principle of the above-described power generating elements is to impart periodic deflection to a piezoelectric element by vibration of a weight body, thereby taking out to the outside charge generated on the basis of stress applied to the piezoelectric element. The above-described power generating element is mounted on automobiles, trains and ships, for example, by which it is possible to take out vibration energy applied during transportation as electric energy. The power generating element can be mounted on vibration sources such as refrigerators and air conditioners, thereby generating electric power.

PRIOR ART DOCUMENTS

Patent Documents

Patent Document 1:
 Japanese Patent Unexamined Publication No. H10-243667A
Patent Document 2:
 Japanese Patent Unexamined Publication No. 2011-152010A

SUMMARY OF THE INVENTION

Problems to be Solved by the Invention

In a general-type power generating element which has been proposed so far, there is adopted such a method that a cantilever beam, with one end being fixed, is used to structurally support a weight body, periodic deflection resulting from vertical vibration of the weight body is imparted to a bridge portion and the deflection is transmitted to a piezoelectric element to generate charge. However, the above-described method is able to use only vibration energy which causes the weight body to vibrate in a vertical direction. Therefore, it is difficult to generate electric power at sufficiently high efficiency.

Transportation equipment such as automobiles, trains and ships receive force in various directions at random during traveling. Therefore, in a power generating element which is mounted on the transportation equipment, vibration of a weight body includes various direction components. However, the above-described conventional power generating element is able to use only a specific one-axis direction component for conversion, of the vibration energy. Therefore, the power generating element is poor in conversion efficiency of the vibration energy into electric energy, resulting in difficulty in enhancing power generation efficiency.

Thus, an object of the present invention is to provide a power generating element which is able to convert vibration energy including various direction components into electric energy without waste, thereby enhancing power generation efficiency.

Means for Solving the Problems (1) The first feature of the present invention resides in a power generating element which converts vibration energy into electric energy to generate electric power,
 the power generating element, comprising:
 a flexible plate-like bridge portion which extends along a longitudinal direction axis;
 a weight body which is connected to an end of the plate-like bridge portion;
 a device housing which houses the plate-like bridge portion and the weight body;
 a fixing-portion which fixes another end of the plate-like bridge portion to the device housing;
 a lower layer electrode which is layered on a surface of the plate-like bridge portion;
 a piezoelectric element which is layered on a surface of the lower layer electrode;
 a group of upper layer electrodes composed of a plurality of upper layer electrodes which are formed locally on a surface of the piezoelectric element; and
 a power generating circuit which rectifies current produced on the basis of charge generated at the upper layer electrodes and the lower layer electrode to take out electric power; wherein
 the weight body is constituted so as to vibrate inside the device housing due to deflection of the plate-like bridge portion when there is applied an external force which causes the device housing to vibrate,
 the piezoelectric element is apt to polarize in a thickness direction by application of stress which expands or contracts in a layer direction,
 the group of upper layer electrodes is provided with two types of upper layer electrodes composed of a right side electrode and a left side electrode, and each of the upper layer electrodes is arranged so as to extend along the longitudinal direction axis and opposed to a predetermined domain of the lower layer electrode, facing each other with the piezoelectric element therebetween,
 when a center line along the longitudinal direction axis is defined at the plate-like bridge portion, the right side electrode is arranged on one side of the center line and the left side electrode is arranged on the other side of the center line.

(2) The second feature of the present invention resides in a power generating element according to the first feature, wherein the lower layer electrode is formed on an upper surface of the plate-like bridge portion, and the piezoelectric element is formed on an upper surface of the lower layer electrode, and the right side electrode and the left side electrode are formed on the upper surface of the plate-like bridge portion through the lower layer electrode and the piezoelectric element.

(3) The third feature of the present invention resides in a power generating element according to the first feature, wherein the lower layer electrode is formed not only on an upper surface of the plate-like bridge portion but also on side surfaces thereof, and the piezoelectric element is formed on a surface of the lower layer electrode, and the right side electrode and the left side electrode are formed respectively on a side surface of the plate-like bridge portion through the lower layer electrode and the piezoelectric element.

(4) The fourth feature of the present invention resides in a power generating element according to the first feature, wherein the lower layer electrode is formed not only on an upper surface of the plate-like bridge portion but also on side surfaces thereof, and the piezoelectric element is formed on a surface of the lower layer electrode, and the right side electrode and the left side electrode are formed respectively from the upper surface of the plate-like bridge portion to a side surface thereof through the lower layer electrode and the piezoelectric element.

(5) The fifth feature of the present invention resides in a power generating element according to the first to fourth features, wherein the group of upper layer electrodes is provided with a group of weight body side electrodes which is arranged in a vicinity of a connection portion of the plate-like bridge portion with the weight body and a group of fixing-portion side electrodes which is arranged in a vicinity of a connection portion of the plate-like bridge portion with the fixing-portion, and the group of weight body side electrodes and the group of fixing-portion side electrodes are each provided with two types of upper layer electrodes which are composed of a right side electrode and a left side electrode.

(6) The sixth feature of the present invention resides in a power generating element according to the first feature, wherein the group of upper layer electrodes is provided with a total of three types of upper layer electrodes such that a right side electrode, a left side electrode and a central electrode, each of the upper layer electrodes is arranged so as to extend along the longitudinal direction axis of the plate-like bridge portion and is opposed to a predetermined domain of the lower layer electrode, facing each other with the piezoelectric element therebetween, and the central electrode is arranged at a position of a center line along the longitudinal direction axis of the plate-like bridge portion, the right side electrode is arranged on one side of the central electrode, and the left side electrode is arranged on the other side of the central electrodes.

(7) The seventh feature of the present invention resides in a power generating element according to the sixth feature, wherein the lower layer electrode is formed on an upper surface of the plate-like bridge portion and the piezoelectric element is formed on an upper surface of the lower layer electrode, and the central electrode, the right side electrode and the left side electrode are formed on the upper surface of the plate-like bridge portion through the lower layer electrode and the piezoelectric element.

(8) The eighth feature of the present invention resides in a power generating element according to the sixth feature, wherein the lower layer electrode is formed not only on an upper surface of the plate-like bridge portion but also on side surfaces thereof, and the piezoelectric element is formed on a surface of the lower layer electrode, the central electrode is formed on the upper surface of the plate-like bridge portion through the lower layer electrode and the piezoelectric element, and the right side electrode and the left side electrode are formed respectively on a side surface of the plate-like bridge portion through the lower layer electrode and the piezoelectric element.

(9) The ninth feature of the present invention resides in a power generating element according to the sixth feature, wherein the lower layer electrode is formed not only on an upper surface of the plate-like bridge portion but also on side surfaces thereof and a piezoelectric element is formed on a surface of the lower layer electrode, the central electrode is formed on the upper surface of the plate-like bridge portion through the lower layer electrode and the piezoelectric element, and the right side electrode and the left side electrode are formed respectively from the upper surface of the plate-like bridge portion to a side surface thereof through the lower layer electrode and the piezoelectric element.

(10) The tenth feature of the present invention resides in a power generating element according to the sixth to ninth features, wherein the group of upper layer electrodes is provided with a group of weight body side electrodes which is arranged in a vicinity of a connection portion of the plate-like bridge portion with the weight body and a group of fixing-portion side electrodes which is arranged in a vicinity of a connection portion of the plate-like bridge portion with the fixing-portion, each of the group of weight body side electrodes and the group of fixing-portion side electrodes is provided with three types of upper layer electrodes such that a central electrode, a right side electrode and a left side electrode.

(11) The eleventh feature of the present invention resides in a power generating element which converts vibration energy in respective coordinate directions of an XYZ three-dimensional coordinate system into electric energy to generate electric power, the power generating element, comprising:

a flexible first plate-like bridge portion which extends along a first longitudinal direction axis parallel to a Y-axis;

a flexible second plate-like bridge portion which is directly or indirectly connected to the first plate-like bridge portion and extends along a second longitudinal direction axis parallel to an X-axis;

a weight body which is directly or indirectly connected to the second plate-like bridge portion;

a device housing which houses the first plate-like bridge portion, the second plate-like bridge portion and the weight body;

a fixing-portion which fixes an end of the first plate-like bridge portion to the device housing;

a lower layer electrode which is layered on a surface of the first plate-like bridge portion and on a surface of the second plate-like bridge portion;

a piezoelectric element which is layered on a surface of the lower layer electrode;

a group of upper layer electrodes composed of a plurality of upper layer electrodes which are formed locally on a surface of the piezoelectric element; and a power generating circuit which rectifies current produced on the basis of charge generated at the upper layer electrodes and the lower layer electrode to take out electric power; wherein the fixing-portion fixes a base end of the first plate-like bridge portion to the device housing, a leading end of the first plate-like bridge portion is directly or indirectly connected to a base end of the second plate-like bridge portion, and the weight body is directly or indirectly connected to a leading end of the second plate-like bridge portion, the weight body is constituted so as to vibrate in a direction of each coordinate axis inside the device housing due to deflection of the first plate-like bridge portion and the second plate-like bridge portion, when there is applied an external force which causes the device housing to vibrate, the piezoelectric element is apt to polarize in a thickness direction due to application of stress which expands or contracts in a layer direction, the group of upper layer electrodes is provided with a group of first upper layer electrodes which is formed on the surface of the first plate-like bridge portion through the lower layer electrode and the piezoelectric element and a group of second upper layer electrodes which is formed on the surface of the second plate-like bridge portion through the lower layer electrode and the piezoelectric element, the group of first upper layer electrodes is provided with two types of upper layer electrodes composed of a first right side electrode and a first left side electrode, and each of the first upper layer electrodes is arranged so as to extend along the first longitudinal direction axis and opposed to a predetermined domain of the lower layer electrode, facing each other with the piezoelectric element therebetween, when a first center line along the first longitudinal direction axis is defined at the first plate-like bridge portion, the first right side electrode is arranged on one side of the first center line, and the first left side electrode is arranged on the other side of the first center line, the group of second upper layer electrodes is provided with two types of upper layer electrodes composed of a second right side electrode and a second left side electrode, and each of the second upper layer electrodes is arranged so as to extend along the second longitudinal direction axis and opposed to a predetermined domain of the lower layer electrode, facing each other with the piezoelectric element therebetween, when a second center line along the second longitudinal direction axis is defined at the second plate-like bridge portion, the second right side electrode is arranged on one side of the second center line, and the second left side electrode is arranged on the other side of the second center line.

(12) The twelfth feature of the present invention resides in a power generating element according to the eleventh feature, wherein the leading end of the first plate-like bridge portion is connected to the base end of the second plate-like bridge portion through an intermediate connection portion so that the first plate-like bridge portion and the second plate-like bridge portion are arranged in an L-letter shape, the leading end of the second plate-like bridge portion is connected to a corner of the weight body through a weight body connection portion so that the weight body is arranged beside the second plate-like bridge portion, and a lower surface of the fixing-portion is fixed to an upper surface of a bottom plate of the device housing, and the first plate-like bridge portion, the second plate-like bridge portion and the weight body are in a suspended state of floating above the bottom plate of the device housing, with no external force applied.

(13) The thirteenth feature of the present invention resides in a power generating element according to the twelfth feature, wherein the intermediate connection portion is provided with an eaves structure portion which projects outside from a side surface of the leading end of the first plate-like bridge portion and an eaves structure portion which projects outside from a side surface of the base end of the second plate-like bridge portion, and the weight body connection portion is provided with an eaves structure portion which projects outside from a side surface of the leading end of the second plate-like bridge portion.

(14) The fourteenth feature of the present invention resides in a power generating element according to the twelfth of thirteenth feature, wherein the fixing-portion is constituted with a fixing-portion plate-like member which extends along a fixing-portion longitudinal direction axis parallel to the X-axis, and the base end of the first plate-like bridge portion is fixed to one end of the fixing-portion plate-like member, and a structure body which is constituted with the fixing-portion plate-like member, the first plate-like bridge portion and the second plate-like bridge portion is given as a U-letter shaped structure body so that a projection image on the XY plane assumes the U-letter shape, and the weight body of plate-like is arranged in an internal domain surrounded by the U-letter shaped structure body.

(15) The fifteenth feature of the present invention resides in a power generating element according to the twelfth of thirteenth feature, wherein the fixing-portion is constituted with an annular structure body, and a first plate-like bridge portion, a second plate-like bridge portion and a weight body are arranged in an internal domain surrounded by the annular structure body.

(16) The sixteenth feature of the present invention resides in a power generating element, wherein in order that roles of the fixing-portion and those of the weight body in the power generating element of the fifteenth feature are reversed, by which the annular structure body which has functioned as the fixing-portion in the power generating element of the fifteenth feature is allowed to function as a weight body and a plate-like body which has functioned as the weight body in the power generating element of the fifteenth feature is allowed to function as a fixing-portion, a lower surface of the plate-like body is fixed to an upper surface of a bottom plate of a device housing, and the annular structure body is in a suspended state of floating above the bottom plate of the device housing, with no external force applied.

(17) The seventeenth feature of the present invention resides in a power generating element according to the eleventh feature, wherein a third plate-like bridge portion to a Kth plate-like bridge portion (where, K≥3) are installed between the second plate-like bridge portion and the weight body, a leading end of an ith plate-like bridge portion (where, 1≤i≤K−1) is directly or indirectly connected to a base end of an (i+1)th plate-like bridge portion, and a leading end of the Kth plate-like bridge portion is directly or indirectly connected to the weight body, and a jth plate-like bridge portion (where, $1 \leq j \leq K$) extends along a jth longitudinal direction axis parallel to the Y-axis in case that j is an odd number, and it extends along a jth longitudinal direction axis parallel to the X-axis in case that j is an even number.

(18) The eighteenth feature of the present invention resides in a power generating element according to the seventeenth feature, wherein the leading end of the ith plate-like bridge portion (where, $1 \leq i \leq K-1$) is connected to the base end of the (i+1)th plate-like bridge portion through an ith intermediate connection portion, and the leading end of the Kth plate-like bridge portion is connected to the weight body through the weight body connection portion, and the ith intermediate connection portion is provided with an eaves structure portion which projects outside from a side surface of the leading end of the ith plate-like bridge portion, and the weight body connection portion is provided with an eaves structure portion which projects outside from a side surface of the leading end of the Kth plate-like bridge portion.

(19) The nineteenth feature of the present invention resides in a power generating element according to the seventeenth or eighteenth feature, wherein a structure body from the base end of the first plate-like bridge portion to the leading end of the Kth plate-like bridge portion is given as a spiral channel and the weight body is arranged at a center position surrounded by the spiral channel.

(20) The twentieth feature of the present invention resides in a power generating element according to the seventeenth to nineteenth features, wherein a lower layer electrode, a piezoelectric element and a group of upper layer electrodes are also installed on surfaces of the third plate-like bridge portion to the Kth plate-like bridge portion, and a power generating circuit takes out electric power also from charge generated from said upper layer electrodes and said lower layer electrode.

(21) The twenty-first feature of the present invention resides in a power generating element according to the seventeenth to twentieth features, wherein the fixing-portion is constituted with an annular structure body, and the first plate-like bridge portion to the Kth plate-like bridge portion and the weight body are arranged inside an internal domain surrounded by the annular structure body.

(22) The twenty-second feature of the present invention resides in a power generating element, wherein in order that roles of the fixing-portion and those of the weight body in the power generating element of the twenty-first feature are reversed, by which the annular structure body which has functioned as the fixing-portion in the power generating element of the twenty-first feature is allowed to function as a weight body and a plate-like body which has functioned as the weight body in the power generating element of the twenty-first feature is allowed to function as a fixing-portion, a lower surface of the plate-like body is fixed to an upper surface of a bottom plate of a device housing, and the annular structure body is in a suspended state of floating above the bottom plate of the device housing, with no external force applied.

(23) The twenty-third feature of the present invention resides in a power generating element according to the eleventh to twenty-second features, wherein the lower layer electrode is formed on upper surfaces of the first plate-like bridge portion and the second plate-like bridge portion, and the piezoelectric element is formed on an upper surface of the lower layer electrode, the first right side electrode and the first left side electrode are formed on the upper surface of the first plate-like bridge portion through the lower layer electrode and the piezoelectric element, and the second right side electrode and the second left side electrode are formed on the upper surface of the second plate-like bridge portion through the lower layer electrode and the piezoelectric element.

(24) The twenty-fourth feature of the present invention resides in a power generating element according to the eleventh to twenty-second features, wherein the lower layer electrode is formed not only on the upper surfaces of the first plate-like bridge portion and the second plate-like bridge portion but also on side surfaces thereof and the piezoelectric element is formed on a surface of the lower layer electrode, the first right side electrode and the first left side electrode are formed respectively on a side surface of the first plate-like bridge portion through the lower layer electrode and the piezoelectric element, and the second right side electrode and the second left side electrode are formed respectively on a side surface of the second plate-like bridge portion through the lower layer electrode and the piezoelectric element.

(25) The twenty-fifth feature of the present invention resides in a power generating element according to the eleventh to twenty-second features, wherein the lower layer electrode is formed not only on the upper surfaces of the first plate-like bridge portion and the second plate-like bridge portion but also on side surfaces thereof and the piezoelectric element is formed on a surface of the lower layer electrode, the first right side electrode and the first left side electrode are formed respectively from the upper surface of the first plate-like bridge portion to a side surface thereof through the lower layer electrode and the piezoelectric element, and the second right side electrode and the second left side electrode are formed respectively from the upper surface of the second plate-like bridge portion to a side surface thereof through the lower layer electrode and the piezoelectric element.

(26) The twenty-sixth feature of the present invention resides in a power generating element according to the eleventh to twenty-fifth features, wherein the group of first upper layer electrodes is provided with a group of first base end-side electrodes arranged in a vicinity of the base end of the first plate-like bridge portion and a group of first leading end-side electrodes arranged in a vicinity of the leading end of the first plate-like bridge portion, the group of second upper layer electrodes is provided with a group of second base end-side electrodes arranged in a vicinity of the base end of the second plate-like bridge portion and a group of second leading end-side electrodes arranged in a vicinity of the leading end of the second plate-like bridge portion, and each of the group of first base end-side electrodes, the group of first leading end-side electrodes, the group of second base end-side electrodes and the group of second leading end-side electrodes is provided with two types of upper layer electrodes composed of a right side electrode and a left side electrode.

(27) The twenty-seventh feature of the present invention resides in a power generating element according to the eleventh to twenty-second features, wherein the group of first upper layer electrodes is provided with a total of three types of upper layer electrodes such that a first right side electrode, a first left side electrode and also a first central electrode, each of upper layer electrodes which constitutes the group of first upper layer electrodes is arranged so as to extend along a first longitudinal direction axis and opposed to a predetermined domain of the lower layer electrode, facing each other with the piezoelectric element therebetween, the first central electrode is arranged at a position of the center line along the first longitudinal direction axis of the first plate-like bridge portion, and the first right side electrode is arranged on one side of the first central electrode, and the first left side electrode is arranged on the other side of the first central electrodes, the group of second upper layer electrodes is provided with a total of three types of upper layer electrodes such that a second right side electrode, a second left side electrode and also a second central electrode, each of upper layer electrodes which constitutes the group of second upper layer electrodes is arranged so as to extend along a second longitudinal direction axis and opposed to a predetermined domain of the lower layer electrode, facing each other with the piezoelectric element therebetween, and the second central electrodes are arranged at a position of the center line along the longitudinal direction axis of the second plate-like bridge portion, and the second right side electrode is arranged on one side of the second central electrode, and the second left side electrode is arranged on the other side of the second central electrode.

(28) The twenty-eighth feature of the present invention resides in a power generating element according to the twenty-seventh feature, wherein the lower layer electrode is formed on upper surfaces of the first plate-like bridge portion and the second plate-like bridge portion, and the piezoelectric element is formed on an upper surface of the lower layer electrode, the first central electrode, the first right side electrode and the first left side electrode are formed on the upper surface of the first plate-like bridge portion through the lower layer electrode and the piezoelectric element, and the second central electrode, the second right side electrode and the second left side electrode are formed on the upper surface of the second plate-like bridge portion through the lower layer electrode and the piezoelectric element.

(29) The twenty-ninth feature of the present invention resides in a power generating element according to the twenty-seventh feature, wherein the lower layer electrode is formed not only on the upper surfaces of the first plate-like bridge portion and the second plate-like bridge portion but also on side surfaces thereof, and the piezoelectric element is formed on a surface of the lower layer electrode, the first right side electrode and the first left side electrode are formed respectively on a side surface of the first plate-like bridge portion through the lower layer electrode and the piezoelectric element, the first central electrode is formed on the upper surface of the first plate-like bridge portion through the lower layer electrode and the piezoelectric element, the second right side electrode and the second left side electrode are formed respectively on a side surface of the second plate-like bridge portion through the lower layer electrode and the piezoelectric element, and the second central electrode is formed on the upper surface of the second plate-like bridge portion through the lower layer electrode and the piezoelectric element.

(30) The thirtieth feature of the present invention resides in a power generating element according to the twenty-seventh feature, wherein the lower layer electrode is formed not only on the upper surfaces of the first plate-like bridge portion and the second plate-like bridge portion but also on side surfaces thereof and the piezoelectric element is formed on a surface of the lower layer electrode, the first right side electrode and the first left side electrode are formed respectively from the upper surface of the first plate-like bridge portion to a side surface thereof through the lower layer electrode and the piezoelectric element, the first central electrode is formed on the upper surface of the first plate-like bridge portion through the lower layer electrode and the piezoelectric element, the second right side electrode and the second left side electrode is formed respectively from the upper surface of the second plate-like bridge portion to a side surface thereof through the lower layer electrode and the piezoelectric element, and the second central electrode is formed on the upper surface of the second plate-like bridge portion through the lower layer electrode and the piezoelectric element.

(31) The thirty-first feature of the present invention resides in a power generating element according to the twenty-seventh to thirtieth features, wherein the group of first upper layer electrodes is provided with a group of first base end-side electrodes arranged in a vicinity of the base end of the first plate-like bridge portion and a group of first leading end-side electrodes arranged in a vicinity of the leading end of the first plate-like bridge portion, the group of second upper layer electrodes is provided with a group of second base end-side electrodes arranged in a vicinity of the base end of the second plate-like bridge portion and a group of second leading end-side electrodes arranged in a vicinity of the leading end of the second plate-like bridge portion, and each of the group of first base end-side electrodes, the group of first leading end-side electrodes, the group of second base end-side electrodes, and the group of second leading end-side electrodes is provided with three types of upper layer electrode composed of a central electrode, a right side electrode and a left side electrode.

(32) The thirty-second feature of the present invention resides in a power generating element which converts vibration energy in respective coordinate directions of an XYZ three-dimensional coordinate system into electric energy to generate electric power, the power generating element, comprising:

a flexible first plate-like bridge portion and a flexible second plate-like bridge portion;

a weight body which is directly or indirectly connected to a leading end of the first plate-like bridge portion and a leading end of the second plate-like bridge portion;

a device housing which houses the first plate-like bridge portion, the second plate-like bridge portion and the weight body;

a fixing-portion which fixes a base end of the first plate-like bridge portion and a base end of the second plate-like bridge portion to the device housing;

a lower layer electrode which is layered on a surface of the first plate-like bridge portion and on a surface of the second plate-like bridge portion;

a piezoelectric element which is layered on a surface of the lower layer electrode;

a group of upper layer electrodes composed of a plurality of upper layer electrodes which are formed locally on a surface of the piezoelectric element; and a power generating circuit which rectifies current produced on the basis of charge generated at the upper layer electrodes and the lower layer electrode to take out electric power; wherein the base end of the first plate-like bridge portion and the base end of the second plate-like bridge portion are connected to a same starting portion of the fixing-portion, a leading end vicinity of the first plate-like bridge portion extends in a direction parallel to the X-axis, a base end vicinity of the first plate-like bridge portion extends in a direction parallel to the Y-axis, and an intermediate portion between the leading end vicinity of the first plate-like bridge portion and the base end vicinity thereof is curved or bent, a leading end vicinity of the second plate-like bridge portion extends in a direction parallel to the Y-axis, a base end vicinity of the second plate-like bridge portion extends in a direction parallel to the X-axis, and an intermediate portion between the leading end vicinity of the second plate-like bridge portion and the base end vicinity thereof is curved or bent, the weight body is constituted so as to vibrate in a direction of each coordinate axis inside the device housing due to deflection of the first plate-like bridge portion and the second plate-like bridge portion, when there is applied an external force which causes the device housing to vibrate, the piezoelectric element is apt to polarize in a thickness direction due to application of stress which expands or contracts in a layer direction, the group of upper layer electrodes is provided with a group of first leading end-side upper layer electrodes which is formed on a surface of the leading end vicinity of the first plate-like bridge portion through the lower layer electrode and the piezoelectric element, a group of first base end-side upper layer electrodes which is formed on a surface of the base end vicinity of the first plate-like bridge portion through the lower layer electrode and the piezoelectric element, a group of second leading end-side upper layer electrodes which is formed on a surface of the leading end vicinity of the second plate-like bridge portion through the lower layer electrode and the piezoelectric element, and a group of second base end-side upper layer electrodes which is formed on a surface of the base end vicinity of the second plate-like bridge portion through the lower layer electrode and the piezoelectric element, the group of first leading end-side upper layer electrodes is provided with two types of upper layer electrodes composed of a first leading end-side right side electrode and a first leading end-side left side electrode, each of these upper layer electrodes is arranged so as to extend along a direction of the X-axis and opposed to a predetermined domain of the lower layer electrode, facing each other with the piezoelectric element therebetween, when a first leading end-side center line parallel to the X-axis is defined at the leading end vicinity of the first plate-like bridge portion, the first leading end-side right side electrode is arranged on one side of the first leading end-side center line, and the first leading end-side left side electrode is arranged on the other side of the first leading end-side center line, the group of first base end-side upper layer electrodes is provided with two types of upper layer electrodes composed of a first base end-side right side electrode and a first base end-side left side electrode, each of these upper layer electrodes is arranged so as to extend along the direction of the Y-axis and opposed to a predetermined domain of the lower layer electrode, facing each other with the piezoelectric element therebetween, when a first base end-side center line parallel to the Y-axis is defined at the base end vicinity of the first plate-like bridge portion, the first base end-side right side electrode is arranged on one side of the first base end-side center line, and the first base end-side left side electrode is arranged on the other side of the first base end-side center line, the group of second leading end-side upper layer electrodes is provided with two types of upper layer electrodes composed of a second leading end-side right side electrode and a second leading end-side left side electrode, each of these upper layer electrodes is arranged so as to extend along a direction of the Y-axis and opposed to a predetermined domain of the lower layer electrode, facing each other with the piezoelectric element therebetween, when a second leading end-side center line parallel to the Y-axis is defined at the leading end vicinity of the second plate-like bridge portion, the second leading end-side right side electrode is arranged on one side of the second leading end-side center line, and the second leading end-side left side electrode is arranged on the other side of the second leading end-side center line, and the group of second base end-side upper layer electrodes is provided with two types of upper layer electrodes composed of a second base end-side right side electrode and a second base end-side left side electrode, each of these upper layer electrodes is arranged so as to extend along the direction of the X-axis and opposed to a predetermined domain of the lower layer electrode, facing each other with the piezoelectric element therebetween, when a second base end-side center line parallel to the X-axis is defined at the base end vicinity of the second plate-like bridge portion, the second base end-side right side electrode is arranged on one side of the second base end-side center line, and the second base end-side left side electrode is arranged on the other side of the second base end-side center line.

(33) The thirty-third feature of the present invention resides in a power generating element according to the thirty-second feature, wherein an intermediate connection portion is provided which is connected to both the leading end of the first plate-like bridge portion and the leading end of the second plate-like bridge portion, and the weight body is connected to the intermediate connection portion, and a lower surface of the fixing-portion is fixed to an upper surface of a bottom plate of the device housing, and the first plate-like bridge portion, the second plate-like bridge portion, the intermediate connection portion and the weight body are in a suspended state of floating above the bottom plate of the device housing, with no external force applied.

(34) The thirty-fourth feature of the present invention resides in a power generating element according to the thirty-third feature, wherein the intermediate connection portion is provided with eaves structure portions which project laterally to both sides from side surfaces of the leading end of the first plate-like bridge portion and eaves structure portions which project laterally to both sides from side surfaces of the leading end of the second plate-like bridge portion, and the fixing-portion is provided with eaves structure portions which project laterally to both sides from side surfaces of the base end of the first plate-like bridge portion and eaves structure portions which project laterally to both sides from side surfaces of the base end of the second plate-like bridge portion.

(35) The thirty-fifth feature of the present invention resides in a power generating element according to the thirty-second to thirty-fourth features, wherein the fixing-portion is constituted with an annular structure body so that the first plate-like bridge portion, the second plate-like bridge portion and the weight body are arranged in an internal domain surrounded by the annular structure body, and the weight body is arranged inside a domain, a periphery of which is surrounded by the first plate-like bridge portion and the second plate-like bridge portion.

(36) The thirty-sixth feature of the present invention resides in a power generating element, wherein in order that roles of the fixing-portion and those of the weight body in the power generating element of the thirty-fifth feature are reversed, by which the annular structure body which has functioned as the fixing-portion in the power generating element of the thirty-fifth feature is allowed to function as a weight body and a plate-like body which has functioned as the weight body in the power generating element of the thirty-fifth feature is allowed to function as a fixing-portion, a lower surface of the plate-like body is fixed to an upper surface of a bottom plate of a device housing, and the annular structure body is in a suspended state of floating above the bottom plate of the device housing, with no external force applied.

(37) The thirty-seventh feature of the present invention resides in a power generating element according to the thirty-second to thirty-sixth features, wherein the lower layer electrode is formed on upper surfaces of the first plate-like bridge portion and the second plate-like bridge portion, and the piezoelectric element is formed on an upper surface of the lower layer electrode, the first leading end-side right side electrode, the first leading end-side left side electrode, the first base end-side right side electrode and the first base end-side left side electrode are formed on the upper surface of the first plate-like bridge portion through the lower layer electrode and the piezoelectric element, and the second leading end-side right side electrode, the second leading end-side left side electrode, the second base end-side right side electrode and the second base end-side left side electrode are formed on the upper surface of the second plate-like bridge portion through the lower layer electrode and the piezoelectric element.

(38) The thirty-eighth feature of the present invention resides in a power generating element according to the thirty-second to thirty-sixth features, wherein the lower layer electrode is formed not only on the upper surfaces of the first plate-like bridge portion and the second plate-like bridge portion but also on side surfaces thereof and the piezoelectric element is formed on a surface of the lower layer electrode, the first leading end-side right side electrode, the first leading end-side left side electrode, the first base end-side right side electrode and the first base end-side left side electrode are formed respectively on a side surface of the first plate-like bridge portion through the lower layer electrode and the piezoelectric element, and the second leading end-side right side electrode, the second leading end-side left side electrode, the second base end-side right side electrode and the second base end-side left side electrode are formed respectively on a side surface of the second plate-like bridge portion through the lower layer electrode and the piezoelectric element.

(39) The thirty-ninth feature of the present invention resides in a power generating element according to the thirty-second to thirty-sixth features, wherein the lower layer electrode is formed not only on the upper surfaces of the first plate-like bridge portion and the second plate-like bridge portion but also on side surfaces thereof and the piezoelectric element is formed on a surface of the lower layer electrode, the first leading end-side right side electrode, the first leading end-side left side electrode, the first base end-side right side electrode and the first base end-side left side electrode are formed respectively from the upper surface of the first plate-like bridge portion to a side surface thereof through the lower layer electrode and the piezoelectric element, and the second leading end-side right side electrode, the second leading end-side left side electrode, the second base end-side right side electrode and the second base end-side left side electrode are formed respectively from the upper surface of the second plate-like bridge portion to a side surface thereof through the lower layer electrode and the piezoelectric element.

(40) The fortieth feature of the present invention resides in a power generating element according to the eleventh to thirty-ninth features, wherein a stopper projection projecting in a direction to the weight body is installed at the fixing-portion, a stopper groove which houses a leading end of the stopper projection is installed on the weight body, and the leading end of the stopper projection is in a state of being fitted into the stopper groove, with a predetermined void area maintained between an external surface of the leading end of the stopper projection and an inner surface of the stopper groove.

(41) The forty-first feature of the present invention resides in a power generating element according to the eleventh to fortieth features, wherein a three-dimensional orthogonal coordinate system in which an X-axis, a Y-axis and a Z-axis are orthogonal to each other is used as the XYZ three-dimensional coordinate system.

(42) The forty-second feature of the present invention resides in a power generating element according to the eleventh to fortieth features, wherein a three-dimensional non-orthogonal coordinate system in which at least an X-axis and a Y-axis are not orthogonal to each other is used as the XYZ three-dimensional coordinate system.

(43) The forty-third feature of the present invention resides in a power generating element according to the first to forty-second features, wherein the power generating circuit is provided with a capacitive element, positive charge rectifier cells in which a direction moving from each of the upper layer electrodes to a positive electrode of the capacitive element is given as a forward direction so as to guide positive charge generated at each of the upper layer electrodes toward the positive electrode of the capacitive element, and negative charge rectifier cells in which a direction moving from a negative electrode of the capacitive element to each of the upper layer electrodes is given as a forward direction so as to guide negative charge generated at each of the upper layer electrodes toward the negative electrode of the capacitive element, thereby rectifying and supplying electric energy converted from vibration energy by using the capacitive element.

(44) The forty-fourth feature of the present invention resides in a power generating element which converts vibration energy into electric energy to generate electric power,
the power generating element, comprising:
a flexible bridge portion which extends along a longitudinal direction axis;
a weight body which is connected to an end of the bridge portion;
a device housing which houses the bridge portion and the weight body;
a fixing-portion which fixes another end of the bridge portion to the device housing;
a piezoelectric element which is fixed at a predetermined position on a surface of the bridge portion; and
a power generating circuit which rectifies current produced on the basis of charge generated at the piezoelectric element to take out electric power; wherein
the weight body is constituted so as to vibrate inside the device housing due to deflection of the bridge portion, when there is applied an external force which causes the device housing to vibrate, and
the piezoelectric element is arranged at a position on a surface of the bridge portion at which expansion/contraction deformation occurs resulting from the vibration, said position deviating from a center line along the longitudinal direction axis, thereby generating charge on the basis of the expansion/contraction deformation.

(45) The forty-fifth feature of the present invention resides in a power generating element which converts vibration energy into electric energy to generate electric power,
the power generating element, comprising:
a flexible first bridge portion which extends along a first longitudinal direction axis;
a flexible second bridge portion which is directly or indirectly connected to the bridge portion and extends along a second longitudinal direction axis;
a weight body which is directly or indirectly connected to the second bridge portion;
a device housing which houses the first bridge portion, the second bridge portion and the weight body;
a fixing-portion which fixes an end of the first bridge portion to the device housing;
a piezoelectric element which is fixed at a predetermined position on a surface of each of the first bridge portion and the second bridge portion, and
a power generating circuit which rectifies current produced on the basis of charge generated at the piezoelectric element to take out electric power; wherein
the fixing-portion fixes a base end of the first bridge portion to the device housing, a leading end of the first bridge portion is directly or indirectly connected to a base end of the second bridge portion, and the weight body is directly or indirectly connected to a leading end of the second bridge portion,
the weight body is constituted so as to vibrate inside the device housing due to deflection of the first bridge portion and the second bridge portion when there is applied an external force which causes the device housing to vibrate, and
the piezoelectric element is arranged at a position at which expansion/contraction deformation occurs resulting from the vibration, on the surface of each of the first bridge portion and the second bridge portion, thereby generating charge on the basis of the expansion/contraction deformation.

(46) The forty-sixth feature of the present invention resides in a power generating element which converts vibration energy into electric energy to generate electric power,
the power generating element, comprising;
a flexible first bridge portion and a flexible second bridge portion;
a weight body which is directly or indirectly connected to both a leading end of the first bridge portion and a leading end of the second bridge portion;
a device housing which houses the first bridge portion, the second bridge portion and the weight body;
a fixing-portion which fixes a base end of the first bridge portion and a base end of the second bridge portion to the device housing;
a piezoelectric element which is fixed at a predetermined position on the surface of each of the first bridge portion and the second bridge portion; and
a power generating circuit which rectifies current produced on the basis of charge generated at the piezoelectric element to take out electric power; wherein
the base end of the first bridge portion and the base end of the second bridge portion are connected to a same starting portion of the fixing-portion, an intermediate portion between a leading end vicinity of the first bridge portion and a base end vicinity thereof is curved or bent, and an intermediate portion between a leading end vicinity of the second bridge portion and a base end vicinity thereof is curved or bent,
the weight body is constituted so as to vibrate inside the device housing due to deflection of the first bridge portion and the second bridge portion when there is applied an external force which causes the device housing to vibrate, and
the piezoelectric element is arranged at a position at which expansion/contraction deformation occurs resulting from the vibration, on the surface of each of the first bridge portion and the second bridge portion, thereby generating charge on the basis of the expansion/contraction deformation.

(47) The forty-seventh feature of the present invention resides in a power generating device which is provided with a plurality of power generating elements according to the forty-first feature, thereby supplying to an outside electric power which is taken out by an individual power generating elements.

(48) The forty-eighth feature of the present invention resides in a power generating device according to the forty-seventh feature, wherein
one or some of power generating elements are arranged so as to be different in direction of the X-axis or direction of the Y-axis or both directions thereof from the other power generating elements in the power generating device.

(49) The forty-ninth feature of the present invention resides in a power generating device according to the forty-eighth feature, wherein
four sets of power generating elements are provided and the direction of the X-axis and the direction of the Y-axis of a first power generating element are given as references, a second power generating element is arranged in a direction at which the direction of the Y-axis is reversed, a third power generating element is arranged in a direction at which the direction of the X-axis is reversed, and a fourth power generating element is arranged in a direction at which both the direction of the X-axis and the direction of the Y-axis are reversed.

(50) The fiftieth feature of the present invention resides in a power generating device according to the forty-seventh to forty-ninth features, wherein each of weight bodies of the plurality of power generating elements is provided with a resonance frequency different from each other.

(51) The fifty-first feature of the present invention resides in a power generating device according to the fiftieth feature, wherein the weight bodies are set so as to be different from each other in area of a projection image on the XY plane, or they are set so as to be different in thickness in a direction of a Z-axis, or both of them are set, by which the weight bodies of the plurality of power generating elements are set so as to be different in mass from each other.

(52) The fifty-second feature of the present invention resides in a power generating device according to the fiftieth or fifty-first feature, wherein the first plate-like bridge portion or the second plate-like bridge portion or both of them of each of the plurality of power generating elements are set so as to be mutually different in area of a projection image on the XY plane, or they are set so as to be mutually different in thickness in a direction of a Z-axis, or both of them are set, by which the weight bodies of the plurality of power generating elements are mutually different in resonance frequency.

Effects of the Invention

The power generating element according to the present invention adopts such a structure that one end of a plate-like bridge portion which constitutes a cantilever beam is fixed and the other end thereof is connected to a weight body, by which it is possible to use not only vibration energy in a direction perpendicular to the plate-like bridge portion but also vibration energy in a direction horizontal thereto. Therefore, the vibration energy can be converted into electric energy without waste to attain high power generation efficiency.

In particular, in a basic embodiment of the power generating element according to the present invention, a layered piezoelectric element is formed at a plate-like bridge portion which constitutes a cantilever beam, and several sets of three types of upper layer electrodes, that is, a central electrode, a right-hand side electrode and a left-hand side electrode, are locally formed on the surface of the piezoelectric element. Here, since the central electrode is arranged at a position of the center line along a longitudinal direction axis on the upper surface of the plate-like bridge portion, charge can be efficiently generated according to deflection in a direction perpendicular to the plate-like bridge portion. On the other hand, the right-hand side electrode and the left-hand side electrode are arranged on both sides of the central electrode. Therefore, they are able to efficiently generate charge according to deflection in a direction perpendicular to the plate-like bridge portion and also efficiently generate charge according to deflection in a direction horizontal to the plate-like bridge portion. It is, thereby, possible to convert vibration energy which includes perpendicular and horizontal direction components into electric energy without waste and attain high power generation efficiency.

Further, according to the embodiment which uses a first plate-like bridge portion arranged in a direction parallel to the Y-axis and a second plate-like bridge portion arranged in a direction parallel to the X-axis in an XYZ three-dimensional coordinate system, it is possible to convert vibration energy in the direction of the X-axis, that in the direction of the Y-axis and that in the direction of the Z-axis into electric energy by a right-hand side electrode and a left-hand side electrode which are formed at the first and the second plate-like bridge portions, still further, a central electrode which is installed at each of the first and the second plate-like bridge portions, by which it is possible to convert vibration energy in the direction of the Z-axis into electric energy. Therefore, vibration energy which includes components in all coordinate axis directions in the XYZ three-dimensional coordinate system can be converted into electric energy without waste to attain higher power generation efficiency.

BRIEF DESCRIPTION OF THE DRAWINGS

FIG. 1A is a plan view and FIG. 1B is a side view, each of which shows a basic structure body constituting a power generating element according to a first embodiment of the present invention.

FIGS. 8A, 8B, 8C and 8D are front sectional views which show variations of arrangement modes of the upper layer electrodes in the power generating element according to the present invention.

FIG. 10A is a plan view of the power generating element according to the second embodiment of the present invention and FIG. 10B is a side sectional view when the power generating element is cut along the YZ plane.

FIG. 18A is a plan view which shows a structure of a basic structure body of a power generating element according to a modification example of the power generating element shown in FIGS. 10A and 10B hatching is given to interior parts of the structure body in order to clearly indicate a planar shape thereof) and FIG. 18B is a side sectional view when the basic structure body is cut along the YZ plane.

FIG. 22A is a plan view which shows a structure of a basic structure body of a power generating element which is a modification example of the power generating element shown in FIGS. 18A and 18B (hatching is given to interior parts of the structure body in order to clearly indicate a planar shape thereof) and FIG. 22B is a side sectional view when the basic structure body is cut along the YZ plane.

FIG. 28 is a plan view which shows a modification example in which the central electrode in the embodiment shown in FIGS. 10A and 10B is omitted.

FIG. 29A is a plan view which shows an example in which three types of upper layer electrodes, that is, a central electrode, a right-hand side electrode, and a left-hand side electrode, are formed and FIG. 29B is a plan view which shows a comparative example in which two types of upper layer electrodes, that is, a right-hand side electrode and a left-hand side electrode, are formed (hatching is given in order to clearly indicate the shape of each electrode).

BEST MODE FOR CARRYING OUT THE INVENTION

Figure 2A:
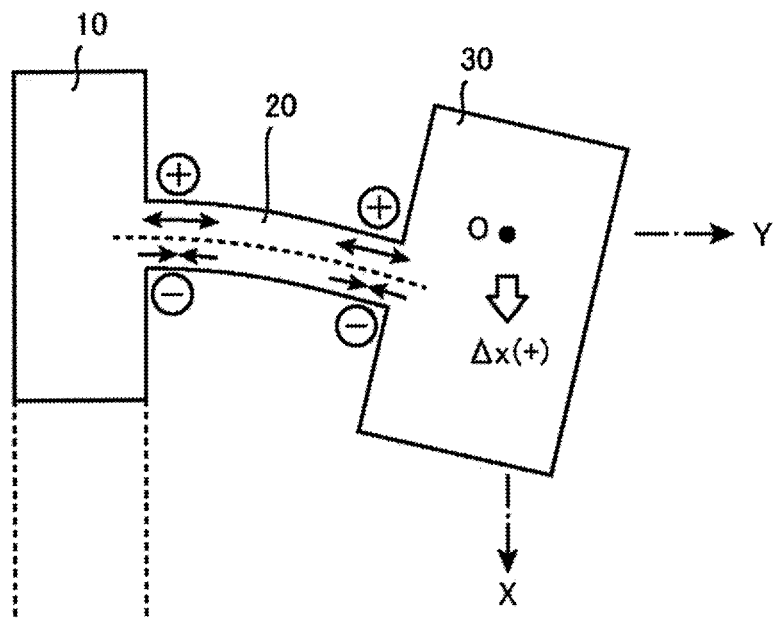
FIG. 2A is a plan view which shows a state that a weight body 30 of the basic structure body given in FIGS. 1A and 1B yields displacement $\Delta x(+)$ in the positive direction of the X-axis and FIG. 2B is a side view which shows a state that the weight body 30 yields displacement $\Delta z(+)$ in the positive direction of the Z-axis.

Chapter 1. First Embodiment (Two-Axis Power Generation Type)

FIG. 1A is a plan view of a basic structure body which constitutes a power generating element according to a first embodiment of the present invention and FIG. 1B is a side view. As shown in FIG. 1A, the basic structure body is constituted with a fixing-portion 10, a plate-like bridge portion 20 and a weight body 30. The side view of FIG. 1B shows a state that a lower surface of the fixing-portion 10 is fixed to an upper surface of a bottom plate 40 of a device housing. Here, for convenience of description, the device housing is omitted for a detailed illustration and in FIG. 1B, hatching is given to a part of the bottom plate 40 only for indication. Actually, there is installed the device housing which houses the basic structure body in its entirety.

The plate-like bridge portion 20 is such that the left end thereof shown in the drawing is fixed by the fixing-portion 10 and the right end thereof is connected to the weight body 30. The plate-like bridge portion 20 functions as a cantilever beam and plays a role of holding the weight body 30 in a suspended state above the bottom plate 40 of the device housing. Hereinafter, an end on the fixing-portion 10 side at the plate-like bridge portion 20 (the left end in the drawing) is referred to as a base end and an end on the weight body 30 side (the right end in the drawing) is referred to as a leading end.

Since the plate-like bridge portion 20 is flexible, deflection occurs upon application of an external force. Thus, when vibration is applied to the device housing from the outside, vibration energy thereof applies force to the weight body 30 and the force is applied on the leading end of the plate-like bridge portion 20. As the base end of the plate-like bridge portion 20 is fixed, deflection occurs at the plate-like bridge portion 20, resulting in vibration of the weight body 30 inside the device housing.

Here, for convenience of describing a vibration direction, in a state that the device housing is kept stationary, an origin O is placed at a position of the center of gravity of the weight body 30, thereby defining an XYZ three-dimensional coordinate system as shown in the drawing. That is, in the plan view of FIG. 1A, the X-axis is defined below the drawing, the Y-axis is defined on the right-hand side in the drawing, and the Z-axis is defined above in a direction perpendicular to the sheet surface of the drawing. In the side view of FIG. 1B, the Z-axis is defined above in the drawing, the Y-axis is defined on the right-hand side in the drawing, and the X-axis is defined above in a direction perpendicular to the sheet surface. In each of the subsequent drawings of the present application as well, each of the respective coordinate axes is to be defined in a similar direction.

Further, for convenience of description, it is assumed that the device housing is attached to a vibration source (for example, a vehicle) in such a direction that the XY plane of the above-described three-dimensional coordinate system is given as a horizontal surface and the Z-axis is given as a perpendicular axis. Resultantly, in the present application, with regard to the basic structure body, generally speaking, "above" refers to the positive direction of the Z-axis, and generally speaking, "below" refers to the negative direction of the Z-axis (of course, "above in the drawing" or "below the drawing" refers to above or below the drawing concerned).

FIG. 2A is a plan view which shows a deformed state when the weight body 30 yields displacement $\Delta x(+)$ in the positive direction of the X-axis on the basis of a position of the fixing-portion 10 in the basic structure body shown in FIGS. 1A and 1B. The above-described displacement will occur upon application of acceleration in the positive direction of the X-axis on the weight body 30. The weight body 30 undergoes displacement below the drawing, by which an upper side of the plate-like bridge portion 20 in the drawing extends in the direction of the Y-axis, while a lower side of the plate-like bridge portion 20 in the drawing contracts in the direction of the Y-axis. In other words, an upper part from the center line in the drawing which is indicated by the broken line in the drawing extends in the direction of the Y-axis, and a part which is lower in the drawing contracts in the direction of the Y-axis. In the drawings of the present application, for convenience of description, a symbol of "+" which is placed in a small circle denotes an expanding part, while a symbol of "−" which is placed in a small circle denotes a contracting part.

FIG. 2A shows a state of displacement $\Delta x(+)$ occurring in the positive direction of the X-axis. On displacement $\Delta x(-)$ occurring in the negative direction of the X-axis, the weight body 30 undergoes displacement above in the drawing. An expansion/contraction state of each part of the plate-like bridge portion 20 is reverse to the state shown in FIG. 2A. Consequently, when vibration energy having a vibration component in the direction of the X-axis is applied on the device housing, the shape of the basic structure body is deformed, with the state shown in FIG. 2A and a reverse state thereof repeated alternately. The weight body 30 then vibrates in the direction of the X-axis (horizontal direction) inside the device housing.

Figure 2B:
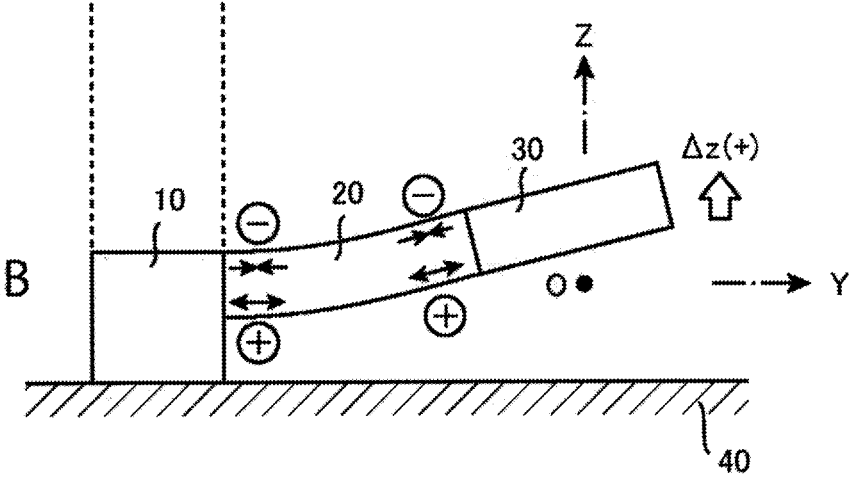

On the other hand, FIG. 2B is a side view which shows a deformed state when the weight body 30 undergoes displacement $\Delta z(+)$ in the positive direction of the Z-axis on the basis of a position of the fixing-portion 10 in the basic structure body shown in FIGS. 1A and 1B. The above-described displacement will occur upon application of acceleration in the positive direction of the Z-axis on the weight body 30. The weight body 30 undergoes displacement above in the drawing, by which an upper surface of the plate-like bridge portion 20 in the drawing contracts in the direction of the Y-axis, while a lower surface of the plate-like bridge portion 20 in the drawing expands in the direction of the Y-axis. In other words, an upper part of the plate-like bridge portion 20 contracts in the direction of the Y-axis and a lower part thereof expands in the direction of the Y-axis.

FIG. 2B shows a state of displacement $\Delta z(+)$ occurring in the positive direction of the Z-axis. Upon displacement $\Delta z(-)$ occurring in the negative direction of the Z-axis, the weight body 30 undergoes displacement below the drawing. An expansion/contraction state of each part of the plate-like bridge portion 20 is reverse to a state shown in FIG. 2B. Therefore, when vibration energy having a vibration component in the direction of the Z-axis is applied on the device housing, the shape of the basic structure body is deformed, with the state shown in FIG. 2B and a reverse state thereof repeated alternately. The weight body 30 then vibrates in the direction of the Z-axis (vertical direction) inside the device housing.

Here, there is omitted illustration of a deformed state of displacement $\Delta y(+)$ or $\Delta y(-)$ occurring in the direction of the Y-axis. Of course, when acceleration in the direction of the Y-axis is applied on the weight body 30, the plate-like bridge portion 20 undergoes overall expansion and contraction in the direction of the Y-axis, by which the weight body 30 is displaced in the direction of the Y-axis. However, when vibration energy equal in quantity is applied, displacement $\Delta y(+)$ or $\Delta y(-)$ in the direction of the Y-axis is smaller in quantity than displacement $\Delta x(+)$ or $\Delta x(-)$ in the direction of the X-axis or displacement $\Delta z(+)$ or $\Delta z(-)$ in the direction of the Z-axis. That is, expansion/contraction of the plate-like bridge portion 20 caused by vibration energy in the direction of the Y-axis is smaller in quantity than expansion/contraction of the plate-like bridge portion 20 caused by vibration energy in the direction of the X-axis or in the direction of the Z-axis.

This may be due to the fact that vibration of the weight body 30 in the direction of the X-axis and the vibration in the direction of the Z-axis are caused by deformation motion which bends the plate-like bridge portion 20 in a predetermined direction, as shown in FIG. 2A or FIG. 2B, whereas vibration in the direction of the Y-axis is caused by deformation motion which expands or compresses the plate-like bridge portion 20 as a whole and the vibration is low in mechanical deformation efficiency.

Because of the above-described reason, the power generating element of the first embodiment is designed as a two-axis power generation type generating element in which electric power is generated on the basis of vibration of the weight body 30 in the direction of the X-axis and vibration thereof in the direction of the Z-axis, with no vibration in the direction of the Y-axis taken into account. Of course, actually, electric power can be generated even when vibration energy in the direction of the Y-axis is applied, which is, however, substantially lower in power generation efficiency than when vibration energy in the direction of the X-axis or in the direction of the Z-axis is applied.

In the case of the above-described example, the basic structure body composed of the fixing-portion 10, the plate-like bridge portion 20 and the weight body 30 are all constituted with an integrated structure body cut out from a silicon substrate. In the case of this example, the plate-like bridge portion 20 has a beam structure with the following dimensions; the width in the direction of the X-axis is 1 mm, the length in the direction of the Y-axis is 4 mm, the thickness in the direction of the Z-axis is about 0.5 mm. The weight body 30 is 5 mm in width in the direction of the X-axis, 3 mm in width in the direction of the Y-axis and 0.5 mm in thickness in the direction of the Z-axis. The fixing-portion 10 is 5 mm in width in the direction of the X-axis, 2 mm in width in the direction of the Y-axis and 1 mm in the thickness in the direction of the Z-axis.

Of course, each portion can be set so as to give any dimensions. In short, the plate-like bridge portion 20 may be given such suitable dimensions that have flexibility which causes deformation as shown in FIGS. 2A and 2B. The weight body 30 may be given such dimensions that have sufficient mass which causes deformation shown in FIGS. 2A and 2B at the plate-like bridge portion 20 by the vibration energy from the outside. The fixing-portion 10 may be given such dimensions that can securely attach the basic structure body in its entirety to a bottom plate 40 of the device housing.

As shown in FIG. 2B, the fixing-portion 10 is greater in thickness than the plate-like bridge portion 20 and the weight body 30 so that the weight body 30 is held in a suspended state inside the device housing, thereby securing a space for causing vibration in the vertical direction. As described above, the basic structure body is to be housed inside the device housing. And, it is preferable that a clearance between an inner wall surface of the device housing (for example, an upper surface of the bottom plate 40 shown in FIG. 2B) and the weight body 30 is set to be a predetermined dimension so that the inner wall surface of the device housing functions as a control member for controlling excessive displacement of the weight body 30. Thereby, even where excessive acceleration (acceleration which may break the plate-like bridge portion 20) is applied on the weight body 30, excessive displacement of the weight body 30 can be controlled to avoid such a situation that the plate-like bridge portion 20 may be broken. However, an excessively narrow clearance will be influenced by air damping to decrease the power generation efficiency, and therefore this is to be noted.

A description has been given above of a structure of the basic structure body which is a constituent of the power generating element of the first embodiment and the deformation motion thereof by referring to FIGS. 1A and 1B and FIGS. 2A and 2B. The power generating element is constituted by adding some elements to the basic structure body.

Figure 3A:
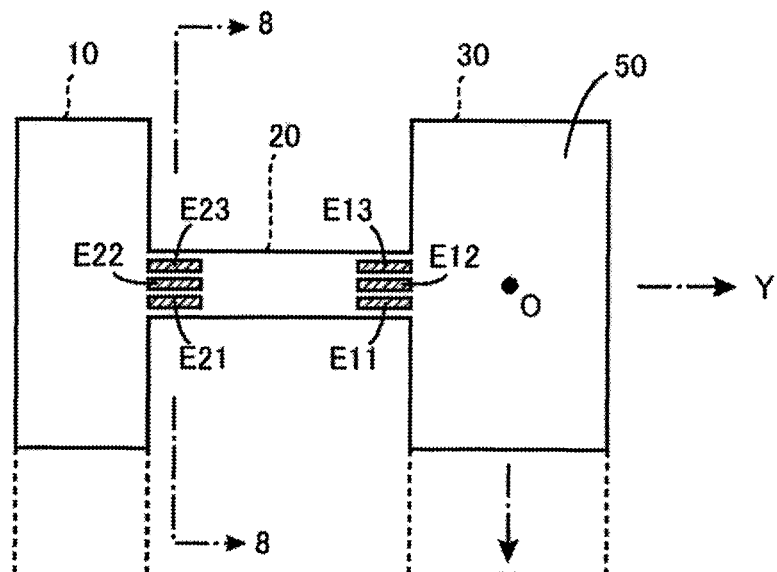
FIG. 3A is a plan view of the power generating element according to a first embodiment of the present invention and FIG. 3B is a side sectional view when the power generating element is cut along the YZ plane.
Figure 3B:
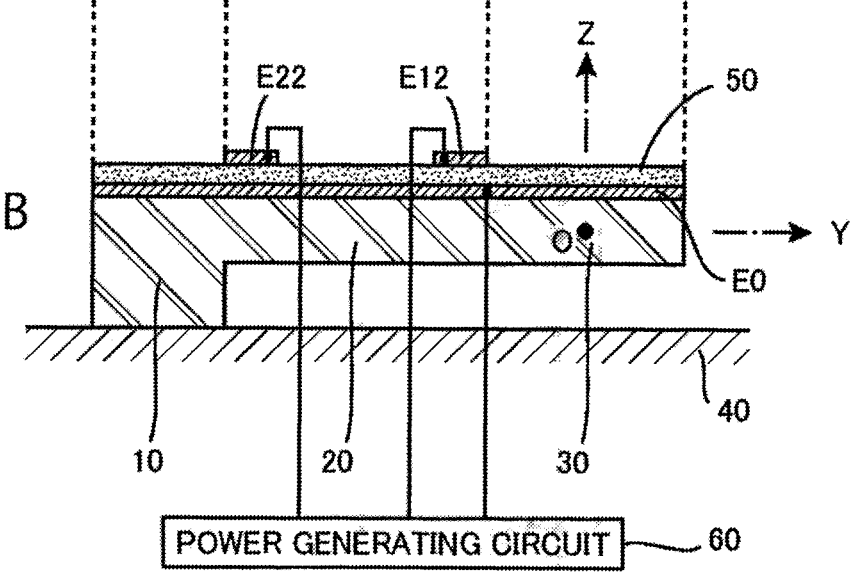

FIG. 3A is a plan view of the power generating element of the first embodiment, and FIG. 3B is a side sectional view when the power generating element is cut along the YZ plane. As shown in the side sectional view of FIG. 3B, a layered lower-layer electrode E0 is formed all over on the upper surface of the basic structure body (the fixing-portion 10, the plate-like bridge portion 20, the weight body 30) as shown in FIG. 1B. In addition, a layered piezoelectric element 50 is formed all over on the further upper surface thereof. And, on the upper surface of the piezoelectric element 50, there is formed a group of upper layer electrodes which is composed of a plurality of upper layer electrodes which are locally formed.

In the case of this example, as shown in FIG. 3A, the group of upper layer electrodes is constituted with six upper layer electrodes E11 to E23 (hatching on the drawing is given for clearly indicating an electrode forming domain and not for indicating a cross section). In the side sectional view of FIG. 3B, of these electrodes, only the upper layer electrodes E12, E22 appear on a YZ cross section. FIG. 3A is a plan view when the power generating element is observed from above. Therefore, the piezoelectric element 50 which covers an entire surface of the basic structure body comes into sight. However, for convenience of description, in FIG. 3A, the position of each of the fixing-portion 10, the plate-like bridge portion 20 and the weight body 30 is given by a symbol having an outgoing line of the broken line.

Here, of the six upper layer electrodes E11 to E23 shown in FIG. 3A, three electrodes E11, E12, E13 formed at the weight body 30 side are referred to as a group of weight body side electrodes, and three electrodes E21, E22, E23 formed at the fixing-portion 10 side are referred to as a group of fixing-portion side electrodes. Further, with regard to the group of weight body side electrodes, the electrode E12 arranged at the center is referred to as a central electrode, and the electrodes E11, E13 arranged on both sides thereof are respectively referred to as a right-hand side electrode and a left-hand side electrode. Similarly, with regard to the group of fixing-portion side electrodes, the electrode E22 arranged at the center is referred to as a central electrode, and the electrodes E21, E23 arranged on both sides thereof are respectively referred to as a right-hand side electrode and a left-hand side electrode.

The terms of "the right-hand side" and "the left-hand side" in the present application are used for distinguishing a pair of electrodes arranged on the both sides of the central electrode from each other. For convenience of description, the terms refer to the right and the left where the upper surface of the plate-like bridge portion is observed from the base end-side thereof. Of course, where the upper surface of the plate-like bridge portion is observed from the leading end-side thereof the right and the left are reversed. However, in the present application, the terms of "the right-hand side" and "the left-hand side" are to be used constantly on the basis of the right and the left where the upper surface of the plate-like bridge portion is observed from the base end-side.

In the case of the example shown here, the basic structure body (the fixing-portion 10, the plate-like bridge portion 20 and the weight body 30) is constituted with a silicon substrate. Further, the lower layer electrode E0 and the upper layer electrodes E11 to E23 may be formed by using a generally-used conductive material such as metal. In the case of the example shown here, a thin-film like metal layer with the thickness of about 300 nm (a metal layer composed of two layers of titanium and platinum films) is used to form the lower layer electrode E0 and the upper layer electrodes E11 to E23. On the other hand, PZT (lead zirconate titanate), KNN (potassium sodium niobate), etc., is made into a thin-film form, which may be used as the piezoelectric element 50. In the case shown here, a thin-film like piezoelectric element with the thickness of about 2 μm is formed.

As shown in FIG. 3B, the power generating element is also provided with a power generating circuit 60. In FIG. 3B, the power generating circuit 60 is simply depicted as a block, and a specific circuit diagram will be described below. As illustrated in the drawing, wiring is given to the power generating circuit 60 and also between the lower layer electrode E0 and the six upper layer electrodes E11 to E23, and charge generated at each of the upper layer electrodes E11 to E23 is taken out via the wiring by the power generating circuit 60. Actually, wiring can be individually formed by a conductive pattern formed on the upper surface of the piezoelectric element 50 together with each of the upper layer electrodes E11 to E23. Further, where the basic structure body is constituted with a silicon substrate, the power generating circuit 60 can be formed on the silicon substrate (for example, at a part of the fixing-portion 10).

In FIGS. 3A and 3B, illustration of the device housing is omitted (the bottom plate 40 shown in FIG. 3B constitutes a part of the device housing). Actually, the structure in its entirety shown in FIG. 3B is housed inside the device housing which is not illustrated.

Resultantly, the power generating element of the first embodiment is a power generating element which has a function to generate electric power by converting vibration energy into electric energy. Then, the power generating element is provided with the flexible plate-like bridge portion 20 which extends along a predetermined longitudinal direction axis (the Y-axis in the example shown in the drawing), the weight body 30 which is connected to one end (leading end) of the plate-like bridge portion 20, the device housing which houses the plate-like bridge portion 20 and the weight body 30, the fixing-portion 10 which fixes the other end of the plate-like bridge portion 20 (base end) to the device housing (the upper surface of the bottom plate 40 in the example shown in the drawing), the lower layer electrode E0 which is layered on the surface of the plate-like bridge portion 20, the piezoelectric element 50 which is layered on the surface of the lower layer electrode E0, the group of upper layer electrodes which is composed of a plurality of upper layer electrodes E11 to E23 locally formed on the surface of the piezoelectric element 50, and the power generating circuit 60 which takes out electric power by rectifying current produced on the basis of charge generated at the upper layer electrodes E11 to E23 and at the lower layer electrode E0.

As described above, in the above-structured power generating element, upon application of an external force which applies vibration to the device housing, the plate-like bridge portion 20 undergoes deflection, by which the weight body 30 vibrates inside the device housing. Then, deflection of the plate-like bridge portion 20 is transmitted to the piezoelectric element 50, thereby causing similar deflection at the piezoelectric element 50. Here, the piezoelectric element 50 is apt to polarize in the thickness direction due to application of stress which yields expansion/contraction in the layer direction. Therefore, charge is generated on the upper surface and the lower surface thereof. The thus generated charge is taken out from the upper layer electrodes E11 to E23 and the lower layer electrode E0.

In the case of the example shown here, there is used the piezoelectric element 50 in which upon application of stress which expands in the layer direction, positive charge occurs on the upper surface and negative charge occurs on the lower surface. In contrast, upon application of stress which contracts in the layer direction, negative charge occurs on the upper surface and positive charge occurs on the lower surface. Of course, a certain piezoelectric element has polarization characteristics exactly reverse to those that have been described above. A piezoelectric element which has either of the polarization characteristics may be used in the power generating element of the present invention.

Next, the specific power generating motion of the power generating element is considered. In the case of the example shown in FIG. 3A, the group of upper layer electrodes is divided into a group of weight body side electrodes E11 to E13 which is arranged in the vicinity of a connection of the plate-like bridge portion 20 with the weight body 30 and a group of fixing-portion side electrodes E21 to E23 which is arranged in the vicinity of a connection of the plate-like bridge portion 20 with the fixing-portion 10. Then, the group of weight body side electrodes is constituted with three types of electrodes, that is, a central electrode E12, a right-hand side electrode E11 and a left-hand side electrode E13. The group of fixing-portion side electrodes is also constituted with three types of electrodes, that is, a central electrode E22, a right-hand side electrode E21 and a left-hand side electrode E23.

All the six upper layer electrodes E11 to E23 are arranged so as to extend along the longitudinal direction axis (Y-axis) of the plate-like bridge portion 20 and opposed to a predetermined domain of the lower layer electrode E0, facing each other with the piezoelectric element 50 therebetween. In other words, the lower layer electrode E0 and the piezoelectric element 50 are arranged commonly, whereas the six upper layer electrodes E11 to E23 are arranged locally and individually. As a result, each of six power generating bodies is to be arranged accordingly at a specific position.

Here, each of the central electrodes E12, E22 is arranged at a position of the center line along the longitudinal direction axis (Y-axis) on the upper surface of the plate-like bridge portion 20 (the center line is defined as a line obtained by moving the Y-axis in parallel up to the upper surface of the piezoelectric element 50). These electrodes are installed for the purpose of efficiently taking out charge when the weight body 30 vibrates in the direction of the Z-axis.

Further, the right-hand side electrode E11 is arranged on one side of the central electrode E12 (on the right-hand side when observed from the base end-side), and the left-hand side electrode E13 is arranged on the other side of the central electrode E12 (on the left-hand side when observed from the base end-side). Similarly, the right-hand side electrode E21 is arranged on one side of the central electrode E22 (on the right-hand side when observed from the base end-side), and the left-hand side electrode E23 is arranged on the other side of the central electrode E22 (on the left-hand side when observed from the base end-side). Each of these side electrodes is an electrode which is installed for the purpose of efficiently taking out charge when the weight body 30 vibrates in the direction of the X-axis.

Figures 4, 5:
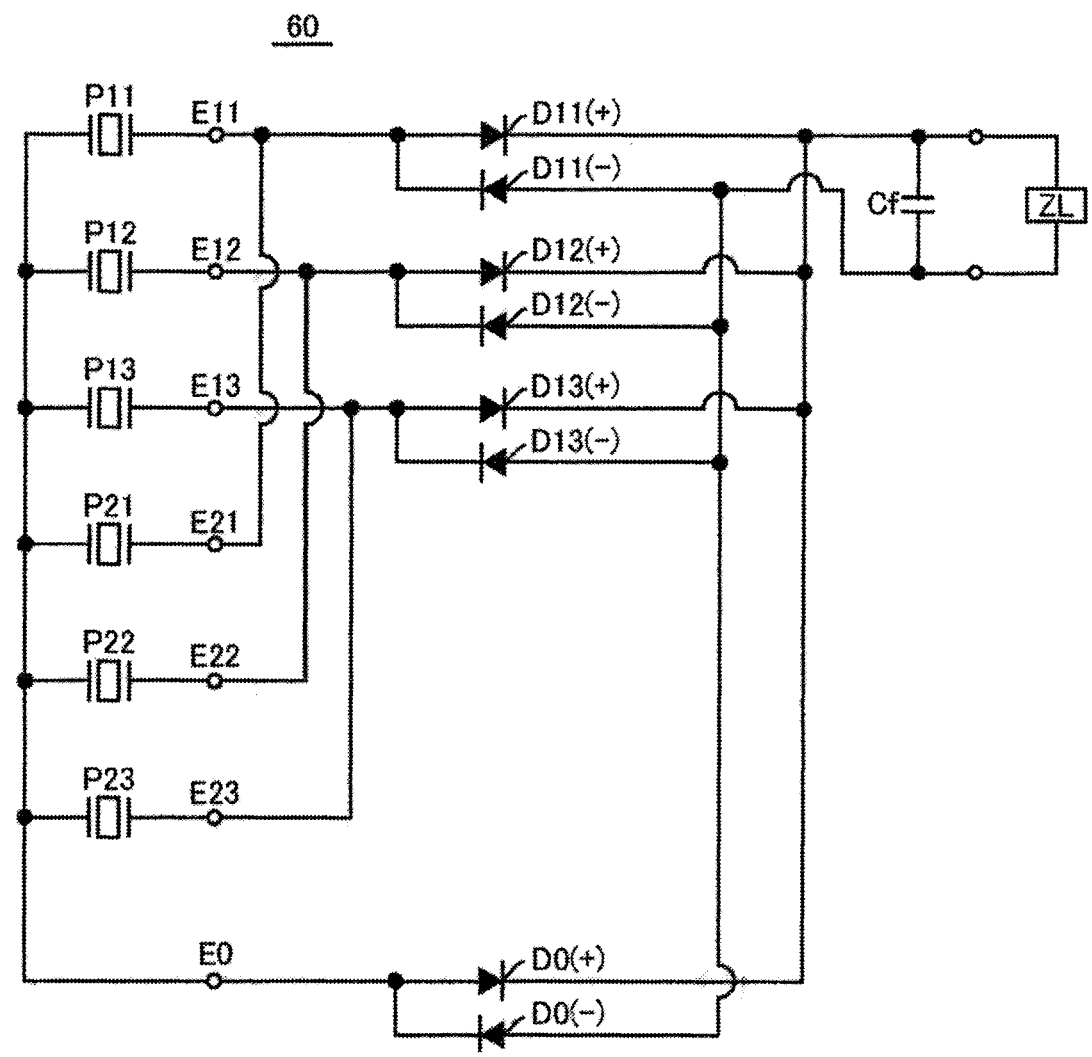
FIG. 4 is a table which shows polarity of charge generated at each of upper layer electrodes E11 to E23 when displacement in the direction of each coordinate axis occurs at the weight body 30 of the power generating element shown in FIGS. 3A and 3B.
FIG. 5 is a circuit diagram which shows a specific constitution of a power generating circuit 60 used in the power generating element shown in FIGS. 3A and 3B.

FIG. 4 is a table which shows the polarity of charge generated at each of the upper layer electrodes E11 to E23 and at the lower layer electrode E0 when displacement in the direction of each coordinate axis occurs at the weight body 30, with the lower layer electrode E0 given as a common electrode, in the power generating element shown in FIGS. 3A and 3B. A symbol of "+" in the table denotes generation of positive charge, while a symbol of "−" denotes generation of negative charge. Further, a symbol of "0" denotes a state that charge is not generated at all or a state that charge is generated in a smaller quantity than the case indicated by the symbol of "+" or the symbol of "−." Charge indicated in a column corresponding to the symbol of "O" is in practice not generated in a significant quantity, therefore the charge will be disregarded in the following description.

When displacement in the direction of each coordinate axis occurs at the weight body 30, deflection shown in FIGS. 2A and 2B occurs at the plate-like bridge portion 20. On the other hand, as described above, the piezoelectric element 50 has polarization characteristics of generating positive charge on the upper surface and negative charge on the lower surface, upon application of stress which allows the piezoelectric element to expand in the layer direction and, in contrast, generating negative charge on the upper surface and positive charge on the lower surface upon application of stress which allows the piezoelectric element to contract in the layer direction. With the above point taken into account, it will be easily understood that the results shown in table of FIG. 4 are obtained.

For example, upon displacement Δx(+) occurring in the positive direction of the X-axis, there is found deformation shown in FIG. 2A. Therefore, a piezoelectric element directly under the right-hand side electrodes E11, E21 contracts in the longitudinal direction, thereby generating negative charge in the right-hand side electrodes E11, E21. On the other hand, a piezoelectric element directly under the left-hand side electrodes E13, E23 expands in the longitudinal direction, thereby generating positive charge in the left-hand side electrodes E13, E23. At this time, a piezoelectric element directly under the central electrodes E12, E22 arranged on the center line expands at one half thereof and contracts at the other half thereof. Therefore, the thus generated charge is offset, resulting in no generation of charge in the central electrodes E12, E22. In contrast, at the lower layer electrode E0, there is generated charge which is reverse in polarity to the charge generated at each of the upper layer electrodes E11, E13, E21, E23. Since a sum of the charge generated in each of the upper layer electrodes is zero, the charge generated at the lower layer electrode E0 is also zero.

Further, displacement Δz(+) occurring in the positive direction of the Z-axis will result in deformation shown in FIG. 2B. Therefore, the piezoelectric element directly under the six upper layer electrodes E11 to E23 contracts in its entirety in the longitudinal direction to generate negative charge at all the upper layer electrodes. In contrast, the lower layer electrode E0 is to generate charge (positive charge) reverse in polarity which is equal to a sum of the charge (negative charge) generated at each of the upper layer electrodes E11 to E23. In the table shown in FIG. 4, a symbol of "++++++" given in the column of the lower layer electrode E0 at the row of the displacement Δz(+) indicates the above-described state.

On the other hand, upon displacement Δy(+) occurring in the positive direction of the Y-axis, the piezoelectric element directly under the six upper layer electrodes E11 to E23 expands in its entirety in the longitudinal direction. Therefore, positive charge is generated at all the upper layer electrodes. However, as described above, displacement Δy(+) in the direction of the Y-axis upon application of acceleration in the direction of the Y-axis on the weight body 30 is smaller in quantity than displacement Δx(+) in the direction of the X-axis upon application of acceleration in the direction of the X-axis or displacement Δz(+) in the direction of the Z-axis upon application of acceleration in the direction of the Z-axis, thus resulting in a small quantity of generation of positive charge. Then, in the table of FIG. 4, a symbol of "O" is given in all the columns of Δy(+), thereby indicating that no significant power is generated.

It is noted that the table of FIG. 4 indicates results that charge is generated at each of the upper layer electrodes upon displacement Δx(+), Δy(+), Δz(+) occurring in the positive direction of each coordinate axis on the weight body 30. Upon displacement Δx(−), Δy(−), Δz(−) occurring in the negative direction of each coordinate axis, there are obtained such results that the symbols in the table of FIG. 4 are reversed. In most cases, when vibration energy is applied from the outside, the weight body 30 vibrates inside the device housing to synchronize with a period of the vibration, and the symbols shown in the table of FIG. 4 are reversed. Then, generation of the charge is periodically increased or decreased.

Actually, vibration energy applied from the outside is to have a direction component of each coordinate axis in an XYZ three-dimensional coordinate system, and displacement of the weight body 30 will result in synthesis of Δx(±), Δy(±), Δz(±) and also will change over time. Therefore, when, for example, displacement Δx(+) and Δz(+) occur at the same time, positive charge and negative charge are both generated at the upper layer electrodes E13, E23, as shown in the table of FIG. 4. Thus, charge generated at the upper layer electrodes E13, E23 is to be partially offset and cannot be effectively taken out.

As described above, depending on a certain vibration mode of the weight body 30, electric power is not necessarily generated efficiently at 100%. However, generally speaking, electric power can be generated by taking out both vibration energy of the weight body 30 in the direction of the X-axis and vibration energy thereof in the direction of the Z-axis. Therefore, the power generating element according to the first embodiment of the present invention is characterized in that, of vibration energy of the weight body 30, two-axis direction components can be utilized to generate electric power. Due to the above-described characteristics, vibration energy which includes various direction components can be converted into as much electric energy as possible without waste to realize an object which is to generate electric power at high efficiency.

The power generating circuit 60 plays a role of rectifying current produced on the basis of charge generated at the upper layer electrodes E11 to E23 and the lower layer electrode E20 to take out electric power. In the case of the example shown here, the lower layer electrode E0 performs a function to secure a reference potential as a common electrode. Therefore, actually, current flowing from the upper layer electrodes E11 to E23 and current flowing into the upper layer electrodes E11 to E23 may be collected individually to store electricity.

FIG. 5 is a circuit diagram which shows a specific constitution of the power generating circuit 60 used in the power generating element shown in FIGS. 3A and 3B. Here, P11 to P23 indicate parts of the piezoelectric element 50 and correspond respectively to parts directly under the upper layer electrodes E11 to E23. Further, E0 indicated by the white circle on the circuit diagram corresponds to the lower layer electrode, and E11 to E23 indicated by the white circle correspond to the upper layer electrodes. Each of D11 (+) to D13 (−) shows a rectifier cell (diode), and each of the rectifier cells to which a symbol (+) is given plays a role of taking out positive charge generated at each of the upper layer electrodes. Each of the rectifier cells to which a symbol (−) is given plays a role of taking out negative charge generated at each of the upper layer electrodes. Similarly, each of D0 (+) and D0 (−) is also a rectifier cell (diode) and plays a role of taking out positive charge and negative charge generated at the lower layer electrode E0.

On the other hand, a symbol of Cf shows a smoothing capacitive element (capacitor). The thus taken out positive charge is supplied to a positive-electrode terminal thereof (an upper terminal in the drawing), and the thus taken out negative charge is supplied to a negative-electrode terminal (a lower terminal in the drawing). As described above, charge generated by vibration of the weight body 30 is increased or decreased in quantity, depending on a period of the vibration. Thus, current which flows through each of the rectifier cells is given as a pulsating current. The capacitive element Cf plays a role of smoothing the pulsating current. At a stationary time when the weight body 30 is stable in vibration, impedance of the capacitive element Cf is substantially negligible.

ZL which is connected in parallel to the capacitive element Cf indicates a load of an appliance to which power generated by the power generating element is supplied. In order to improve the power generation efficiency, it is preferable that impedance of the load ZL is matched with internal impedance of the piezoelectric element 50. Therefore, where an appliance to which electric power is supplied is assumed in advance, it is preferable that the power generating element is designed by adopting a piezoelectric element having internal impedance which is matched with impedance of the load ZL of the appliance concerned.

Resultantly, the power generating circuit 60 is provided with the capacitive element Cf, the rectifier cells for positive charge D11 (+) to D23 (+) in which a direction of moving from each of the upper layer electrodes E11 to E23 to the positive electrode of the capacitive element Cf for guiding positive charge generated at each of the upper layer electrodes E11 to E23 toward the positive electrode side of the capacitive element Cf is given as a forward direction, and the rectifier cells for negative charge D11 (−) to D23 (−) in which a direction of moving from the negative electrode of the capacitive element Cf to each of the upper layer electrodes E11 to E23 for guiding negative charge generated at each of the upper layer electrodes E11 to E23 toward the negative electrode of the capacitive element Cf is given as a forward direction. And, the power generating circuit 60 performs a function to smooth electric energy converted from vibration energy by using the capacitive element Cf, thereby supplying the electric energy to the load ZL.

As apparent from the circuit diagram of FIG. 5, positive charge taken out from the rectifier cells for positive charge D11 (+) to D13 (+) and negative charge taken out from the rectifier cells for negative charge D11 (−) to D13 (−) are supplied to the load ZL. Therefore, in principle, a total quantity of positive charge generated at the individual upper layer electrodes E11 to E23 is at each instant made equal to a total quantity of negative charge thereof; thus making it possible to generate electric power at the highest efficiency. In other words, where a total quantity of positive charge generated is not balanced with a total quantity of negative charge at a certain instant, only a mutually equal quantity of charge is utilized as electric power by the load ZL.

Of course, actually, charge generated at the piezoelectric element is temporarily stored at the smoothing capacitive element Cf. Therefore, actual behavior of power generating motion is not to be taken as an instantaneous phenomenon but to be taken as a phenomenon based on time average, and an accurate analysis thereof requires setting of complicated parameters. However, in general, it is preferable that a total quantity of positive charge generated at the individual upper layer electrodes E11 to E23 is made equal at each instant to a total quantity of negative charge thereof in terms of efficient power generation.

In the case of the example shown here, at the upper layer electrodes shown in FIGS. 3A and 3B, the right-hand side electrode E11 and the left-hand side electrode E13 assume plane symmetry with the YZ plane. Similarly, the right-hand side electrode E21 and the left-hand side electrode E23 assume plane symmetry with the YZ plane. Where the above-described symmetric structure is adopted and the weight body 30 vibrates in the direction of the X-axis, it is suggested that the thus generated positive charge is made equal in total quantity to the thus generated negative charge in these four upper layer electrodes. A pair of electrodes, that is, a right-hand side electrode and a left-hand side electrode, are arranged on both sides of a central electrode, which is advantageous in that, as described above, with regard to vibration in the direction of the X-axis, there is obtained such an effect that positive charge is made equal in total quantity to negative charge.

Finally, as a matter to be added, there is provided a condition for efficient power generation on the basis of vibration applied from the outside.

That is, resonance frequency of the weight body 30 is matched with frequency of vibration applied from the outside. In general, a vibration system has resonance frequency which is determined unambiguously depending on its specific structure. When the frequency of vibration applied from the outside is matched with the resonance frequency, an oscillator can be vibrated most efficiently and oscillation thereof becomes greatest. Therefore, where frequency of vibration applied from the outside is assumed in advance (for example, where the power generating element is set to be mounted on a certain vehicle in advance and frequency applied from the vehicle is known), it is preferable that the element is designed so that the resonance frequency is matched with the frequency concerned at a stage of designing a structure of the power generating element.

Chapter 2. Modification Examples of First Embodiment

Here, a description will be given of some modification examples of the two-axis power generation type power generating element of the first embodiment described in Chapter 1.

2-1. Modification Example on the Number of Upper Layer Electrodes

Figures 6, 7:
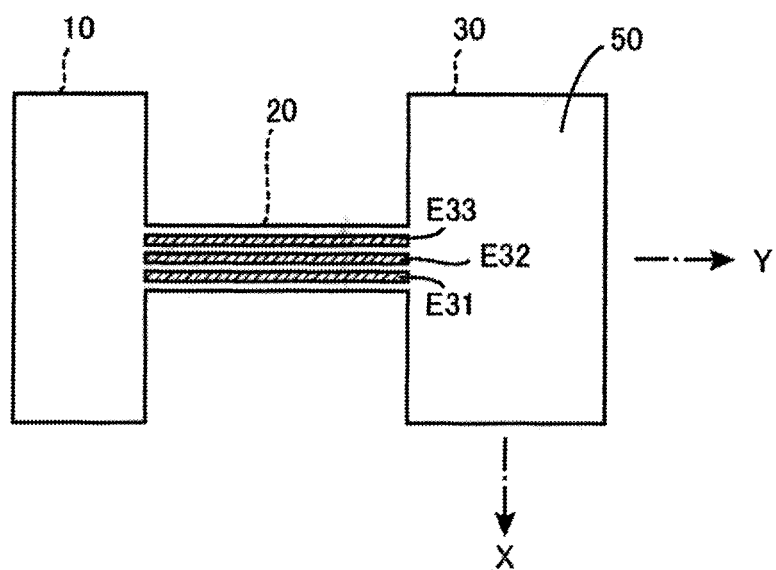
FIG. 6 is a plan view which shows a modification example of the power generating element shown in FIGS. 3A and 3B.
FIG. 7 is a table which shows polarity of charge generated at each of upper layer electrodes E31 to E33 when displacement in the direction of each coordinate axis occurs at the weight body 30 of the power generating element shown in FIG. 6.

FIG. 6 is a plan view which shows a modification example of the power generating element shown in FIGS. 3A and 3B. They are different only in the number of upper layer electrodes and the length thereof. That is, in the case of the power generating element shown in FIGS. 3A and 3B, as described above, a total of six upper layer electrodes E11 to E23 are formed. On the other hand, in the case of the power generating element shown in FIG. 6, a total of only three upper layer electrodes E31 to E33 are formed. Since they are similar in other structures, a detailed description will be omitted for a structure of the modification example shown in FIG. 6 (of course, in place of the power generating circuit shown in FIG. 5, used is such a power generating circuit that rectifier cells are connected to three sets of upper layer electrodes E31 to E33 to take out electric power).

Here, in the case of the power generating element shown in FIGS. 3A and 3B, the group of upper layer electrodes is constituted with the group of weight body side electrodes E11 to E13 which is arranged in the vicinity of a connection portion of the plate-like bridge portion 20 with the weight body 30 and the group of fixing-portion side electrodes E21 to E23 which is arranged in the vicinity of a connection portion of the plate-like bridge portion 20 with the fixing-portion 10. The length in the longitudinal direction (the direction of the Y-axis) is set to be a length which is necessary for arrangement in the vicinity of the connection. In contrast, the three sets of upper layer electrodes E31 to E33 in the modification example shown in FIG. 6 correspond to an integration in which the group of weight body side electrodes E11 to E13 and the group of fixing-portion side electrodes E21 to E23 in the example shown in FIGS. 3A and 3B are extended respectively in the direction of the others and coupled to each other. Therefore, the upper layer electrodes E31 to E33 are equal in length to the plate-like bridge portion 20.

FIG. 7 is a table which shows the polarity of charge generated at each of the upper layer electrodes E31 to E33 upon displacement in the direction of each coordinate axis at the weight body 30 of the power generating element shown in FIG. 6. When consideration is given to the results of the table of FIG. 4 on the basis of the power generating element shown in FIGS. 3A and 3B, it will be easily understood that results of the table of FIG. 7 are obtained on the basis of the power generating element shown in FIG. 6. Therefore, a power generating circuit similar to that shown in FIG. 5 is provided for the power generating element shown in FIG. 6, by which charge generated at each of the upper layer electrodes E31 to E33 can be taken out as electric power.

Actually, where the weight body 30 vibrates in the direction of the X-axis as shown in FIG. 2A or where it vibrates in the direction of the Z-axis as shown in FIG. 2B, expansion/contraction stress in the longitudinal direction (in the direction of the Y-axis) occurring at the plate-like bridge portion 20 will concentrate at a part indicated by a circular symbol in FIGS. 2A and 2B to which "+" or "−" is given, that is, in the vicinity of a connection portion with the weight body 30 and in the vicinity of a connection portion with the fixing-portion 10. The example shown in FIGS. 3A and 3B is an example in which the upper layer electrodes E11 to E23 are arranged only at a part at which the stress will concentrate, that is, an example in which the electrodes are arranged most efficiently. In contrast, the example shown in FIG. 6 is such that the upper layer electrodes are arranged in an entire domain including a part at which the stress will not concentrate, thus making it possible to reduce the number of electrodes, although power generation in relation to a unit electrode area is not necessarily efficient.

In both of the above-described examples, the upper layer electrodes are constituted with three types of electrodes, that is, a central electrode, a right-hand side electrode and a left-hand side electrode. As described in Chapter 1, it is possible to generate electric power on the basis of vibration energy of the weight body 30 in the direction of the Z-axis and vibration energy thereof in the direction of the X-axis. It is also possible to obtain such an effect that positive charge generated by vibration in the direction of the X-axis can be balanced in total quantity with negative charge thereof as much as possible.

2-2. Modification Example on Lateral Arrangement of Upper Layer Electrodes

In both of the example shown in FIGS. 3A and 3B and the example shown in FIG. 6, the lower layer electrode E0 is formed on the upper surface of the plate-like bridge portion 20, the piezoelectric element 50 is formed on the upper surface of the lower layer electrode E0 and three types of upper layer electrodes, that is, a central electrode, a right-hand side electrode and a left-hand side electrode, are formed on the upper surface of the plate-like bridge portion 20 through the lower layer electrode E0 and the piezoelectric element 50. Of the upper layer electrodes, some or all of the right-hand side electrodes and the left-hand side electrodes may be formed on side surfaces of the plate-like bridge portion 20 through the lower layer electrode E0 and the piezoelectric element 50.

FIGS. 8A, 8B, 8C and 8D cover front sectional views which show variations of an arrangement mode of the upper layer electrodes of the power generating element in the present invention. FIG. 8A is a front sectional view which shows a cross section obtained by cutting the plate-like bridge portion 20 of the example shown in FIGS. 3A and 3B along the cutting plane line 8-8 in the drawing. As illustrated in the drawing, a lower layer electrode E0 and a piezoelectric element 50 are laminated on the upper surface of the plate-like bridge portion 20, and three types of upper layer electrodes E21, E22, E23 are also arranged on the upper surface of the lamination. Therefore, the piezoelectric element 50 will develop a polarization phenomenon in the vertical direction of the drawing. The example shown in FIG. 6 is also similar in arrangement of the upper layer electrodes.

In contrast, a right-hand side electrode and a left-hand side electrode are laterally arranged in the example shown in FIG. 8B. That is, in this example, a lower layer electrode E0B is formed on the side surfaces of the plate-like bridge portion 20, together with the upper surface thereof and a piezoelectric element 50B is formed on the surface of the lower layer electrode E0B. That is, in the front sectional view, the lower layer electrode E0B and the piezoelectric element 50B are also formed in the U-letter shape and formed integrally from the upper surface of the plate-like bridge portion 20 to the side surfaces on both sides. Then, three types of electrodes which constitute a group of upper layer electrodes are arranged in such a manner that a central electrode E22B is formed on the upper surface of the plate-like bridge portion 20 through the lower layer electrode E0B and the piezoelectric element 50B, which remains unchanged.

However, a right-hand side electrode E21B and a left-hand side electrode E23B are formed on the side surfaces of the plate-like bridge portion 20 through the lower layer electrode E0B and the piezoelectric element 50B. FIG. 8B shows only a group of fixing-portion side electrodes E21B to E23B. A group of weight body side electrodes E11B to E13B is also arranged in a similar manner.

In this case, each part of the piezoelectric element 50B develops a polarization phenomenon in the thickness direction. Therefore, a part formed on the upper surface of the plate-like bridge portion 20 develops a polarization phenomenon in the vertical direction in the drawing and a part formed on the side surface of the plate-like bridge portion 20 develops a polarization phenomenon in the lateral direction in the drawing. Therefore, stress occurring at each part of the plate-like bridge portion 20 generates charge with a predetermined polarity at each of the six upper layer electrodes E11B to E13B; E21B to E23B. An expansion/contraction state at each part of the plate-like bridge portion 20 shown in FIG. 2A remains unchanged also on the side surfaces thereof. Therefore, resultantly, a circuit similar to the power generating circuit 60 shown in FIG. 5 is provided, by which electric power can be taken out on the basis of the thus generated charge.

In comparison with the example shown in FIG. 8A, the example shown in FIG. 8B is wider in area of each of the upper layer electrodes and accordingly charge generated at the group of upper layer electrodes is increased in quantity. Thus, as compared with the former, the latter is increased in power generation efficiency. However, the latter is required to form the lower layer electrode, the piezoelectric element and the upper layer electrodes not only on the upper surface of the plate-like bridge portion 20 but also on the side surfaces, thus resulting in increased production costs.

On the other hand, in the example shown in FIG. 8C, a right-hand side electrode and a left-hand side electrode are arranged so as to continue from the upper surface to the side surfaces. Also in this example, as with the example shown in FIG. 8B, a lower layer electrode E0C is formed on side surfaces of the plate-like bridge portion 20, together with an upper surface thereof and a piezoelectric element 50C is formed on the surface of the lower layer electrode E0C. Resultantly, in the front sectional view, the lower layer electrode E0C and the piezoelectric element 50C are formed in the U-letter shape and formed integrally from the upper surface of the plate-like bridge portion 20 to side surfaces on both sides.

Here, three types of electrodes which constitute a group of upper layer electrodes are arranged in such a manner that a central electrode E22C is formed on the upper surface of the plate-like bridge portion 20 through the lower layer electrode E0C and the piezoelectric element 50C, which remains unchanged. A right-hand side electrode E21C and a left-hand side electrode E23C are formed from the upper surface of the plate-like bridge portion 20 to the side surfaces thereof through the lower layer electrode E0C and the piezoelectric element 50C. FIG. 8C shows only a group of fixing-portion side electrodes E21C to E23C, with a group of weight body side electrodes E11C to E13 also arranged in a similar manner.

As described above, each part of the piezoelectric element 50B develops a polarization phenomenon in the thickness direction. Therefore, also in the case of the example shown in FIG. 8C, stress occurring at each part of the plate-like bridge portion 20 will generate charge with a predetermined polarity at each of the six upper layer electrodes E11C to E13C; E21C to E23C. A circuit similar to the power generating circuit 60 shown in FIG. 5 is provided, by which electric power on the basis of the thus generated charge can be taken out.

In comparison with the example shown in FIG. 8B, the example shown in FIG. 8C can secure a wider area of the right-hand side electrode and the left-hand side electrode and accordingly charge generated by the group of upper layer electrodes is increased in quantity. It is, thereby, possible to enhance the power generation efficiency. However, the latter is required to form the right-hand side electrode and the left-hand side electrode from the upper surface to the side surfaces, which will result in increased manufacturing costs.

Of course, an arrangement mode of the upper layer electrodes in each of the examples shown in FIG. 8A to FIG. 80C may be combined individually for every part. In FIG. 8D, a right half thereof is formed by adopting the arrangement mode shown in FIG. 8B and a left half thereof is formed by adopting the arrangement mode shown in FIG. 8C. Further, in this example, a piezoelectric element is formed not by giving an integrated structure but by dividing a structure into two portions, 51D and 52D.

Specifically, in the example shown in FIG. 8D, a lower layer electrode E0D is formed not only on the upper surface of a plate-like bridge portion 20 but also on the side surfaces thereof and the piezoelectric elements 51D, 52D are formed on the surface of the lower layer electrode. The piezoelectric element 51D is formed at a position which covers the right side surface of the lower layer electrode E0D, and the piezoelectric element 52D is formed at a position which covers the upper surface of the lower layer electrode E0D and the left side surface thereof. Then, three types of electrodes which constitute a group of upper layer electrodes are arranged in such a manner that a central electrode E22D is formed on the upper surface of the plate-like bridge portion 20 through the lower layer electrode E0D and the piezoelectric element 52D, a right-hand side electrode E21D is formed on the right side surface of the plate-like bridge portion 20 through the lower layer electrode E0D and the piezoelectric element 51D, and a left-hand side electrode E23D is formed from the upper surface of the plate-like bridge portion 20 to the side surface thereof through the lower layer electrode E0D and the piezoelectric element 52D.

As described above, the right-hand side electrode and the left-hand side electrode are not necessarily bilaterally symmetrical. However, in order that positive charge generated by vibration in the direction of the X-axis may be balanced in total quantity with negative charge thereof as much as possible, it is preferable that they are bilaterally symmetrical as described in the examples shown in FIG. 8A to 8C.

Further, the piezoelectric element is not necessarily formed to give an integrated structure. As shown in FIG. 8D, the piezoelectric element may be arranged independently at a position corresponding to each of the upper layer electrodes. Actually, however, the integrated structure can be more easily formed in a manufacturing process. Similarly, the lower layer electrode may be arranged independently at a position corresponding to each of the upper layer electrodes. Actually, however, the integrated structure can be more easily formed in a manufacturing process.

As described above, a description has been given of the examples shown in FIG. 8B to 8D as variations of the example shown in FIGS. 3A and 3B (the front sectional view corresponds to FIG. 8A). Of course, similar variations will also be made available for the example shown in FIG. 6. Further, similar variations of an arrangement mode of the upper layer electrodes will also be made available for a second embodiment to be described below.

Chapter 3. Second Embodiment (Three-Axis Power Generation Type)

Next, a description will be given of second embodiment of the present invention. The first embodiment described in Chapter 1 is a two-axis power generation type power generating element in which vibration energy applied on the weight body 30 in the direction of the X-axis and vibration energy thereof in the direction of the Z-axis are converted into electric energy, thereby generating electric power. The second embodiment to be described here is a three-axis power generation type power generating element which has a function to additionally convert vibration energy in the direction of the Y-axis into electric energy.

Of course, the first embodiment is also able to convert vibration energy in the direction of the Y-axis into electric energy. However, as described above, the vibration energy is quite low in conversion efficiency and negligible as compared with vibration energy in the direction of the X-axis or in the direction of the Z-axis. The second embodiment to be described here is such that in principle, two sets of plate-like bridge portions in the first embodiment are provided and they are combined in a direction at which these are orthogonal with each other. Thereby, even where the weight body vibrates in any direction of the X-axis, Y-axis and Z-axis, the vibration energy thereof can be efficiently converted into electric energy.

Figure 9A:
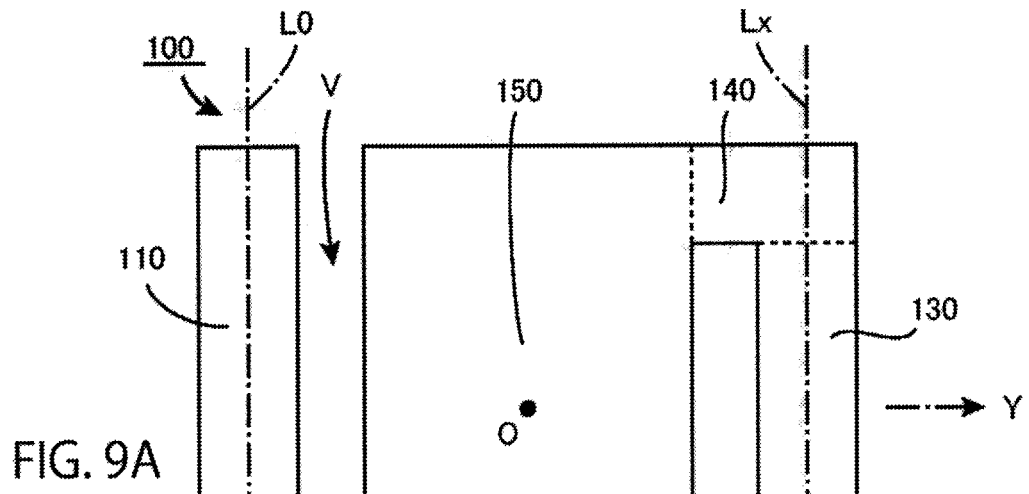
FIG. 9A is a plan view of a basic structure body 100 which constitutes a power generating element according to a second embodiment of the present invention and FIG. 9B is a side sectional view when the basic structure body is cut along the YZ plane.
Figure 9B:
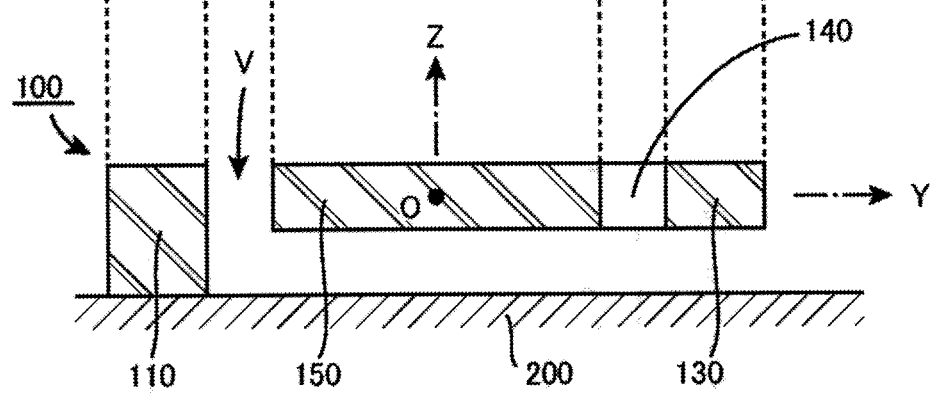

FIG. 9A covers a plan view of a basic structure body 100 which constitutes a power generating element of the second embodiment in the present invention and FIG. 9B is a side sectional view thereof. As shown in FIG. 9A, the basic structure body 100 is a spiral structure body which has portions such as a fixing-portion plate-like member 110, a first plate-like bridge portion 120, an intermediate connection portion 125, a second plate-like bridge portion 130, a weight body connection portion 140 and a weight body 150.

Here, for convenience of describing a vibration direction, in a state that the weight body 150 is held stationary, an origin O is placed at the center of gravity of the weight body 150, thereby defining an XYZ three-dimensional coordinate system as illustrated in the drawing. That is, in the plan view of FIG. 9A, the X-axis is defined below the drawing, the Y-axis is defined on the right-hand side in the drawing, and the Z-axis is defined above in a direction perpendicular to the sheet surface. In the side sectional view of FIG. 9B, the Z-axis is defined above in the drawing, the Y-axis is defined on the right-hand side in the drawing, and the X-axis is defined above in a direction perpendicular to the sheet surface. The side sectional view of FIG. 9B corresponds to a drawing in which the basic structure body 100 in the plan view of FIG. 9A is cut along the YZ plane. It is noted that although illustration is omitted in FIG. 9A, the basic structure body 100 is actually housed inside a device housing. In FIG. 9B, a bottom plate 200 which is a part of the device housing is illustrated to give a state that a lower surface of the fixing-portion plate-like member 110 is firmly attached to an upper surface of the bottom plate 200.

The fixing-portion plate-like member 110 performs a function similar to that of the fixing-portion 10 of the first embodiment and is a constituent which fixes the base end of the first plate-like bridge portion 120 (the left end in the drawing) to the bottom plate 200 of the device housing. On the other hand, the base end of the second plate-like bridge portion 130 is connected to the leading end of the first plate-like bridge portion 120 (on the right-hand side in the drawing) through the intermediate connection portion 125. The weight body 150 is connected to the leading end of the second plate-like bridge portion 130 through the weight body connection portion 140. As shown in FIG. 9A, the weight body 150 is a rectangular structure body having sufficient mass for performing a function as an oscillator and is held supported by constituents 110, 120, 125, 130, 140 which are arranged in a spiral manner.

In FIG. 9B, although neither the first plate-like bridge portion 120 nor the intermediate connection portion 125 is not illustrated, the first plate-like bridge portion 120, the intermediate connection portion 125, the second plate-like bridge portion 130, the weight body connection portion 140 and the weight body 150 are all equal in thickness (the dimension in the direction of the Z-axis). In contrast, the fixing-portion plate-like member 110 is provided below with a part which is excessively thick. Thus, as shown in FIG. 9B, in a state that the lower surface of the fixing-portion plate-like member 110 is fixed to the upper surface of the bottom plate 200, the first plate-like bridge portion 120, the intermediate connection portion 125, the second plate-like bridge portion 130, the weight body connection portion 140 and the weight body 150 are all in a state that they are floating above the upper surface of the bottom plate 200, and the weight body 150 is held in a suspended state.

Here, at least, the first plate-like bridge portion 120 and the second plate-like bridge portion 130 are flexible and, therefore, they undergo deflection by application of an external force. Therefore, when vibration is applied to the device housing from the outside, a force is applied to the weight body 150 by vibration energy thereof; and the weight body 150 vibrates inside the device housing. For example, when the device housing is attached to a vibration source such as a vehicle in a direction so that the XY plane is a horizontal plane and the Z-axis is a perpendicular axis, vibration energy in the direction of each of XYZ coordinate axes is applied to the weight body 150 by vibration in the perpendicular direction and in the horizontal direction transmitted from the vibration source.

Resultantly, the basic structure body 100 shown in FIG. 9 has a structure in which the leading end of the first plate-like bridge portion 120 is connected to the base end of the second plate-like bridge portion 130 through the intermediate connection portion 125 so that the first plate-like bridge portion 120 and the second plate-like bridge portion 130, each of which is flexible, are arranged to give the L-letter shape and also the leading end of the second plate-like bridge portion 130 is connected to a corner of the weight body 150 through the weight body connection portion 140 so that the weight body 150 is arranged beside the second plate-like bridge portion 130. In addition, the base end of the first plate-like bridge portion 120 is fixed to the upper surface of the bottom plate 200 of the device housing by the fixing-portion plate-like member 110 which performs a function as a fixing-portion. Therefore, the first plate-like bridge portion 120, the second plate-like bridge portion 130 and the weight body 150 are in a suspended state in which they are floating above the bottom plate 200 of the device housing, with no external force applied.

In particular, in the basic structure body 100 shown in FIGS. 9A and 9B, the fixing-portion is constituted with the fixing-portion plate-like member 110 which extends along a longitudinal direction axis L0 for fixing-portion which is parallel to the X-axis, and the base end of the first plate-like bridge portion 120 is fixed to one end of the fixing-portion plate-like member 110. Further, the first plate-like bridge portion 120 is arranged so as to extend in the direction of the Y-axis, with a first longitudinal direction axis Ly parallel to the Y-axis given as the center. The second plate-like bridge portion 130 is arranged so as to extend in the direction of the X-axis, with a second longitudinal direction axis Lx parallel to the X-axis given as the center. Therefore, the structure body constituted with the fixing-portion plate-like member 110, the first plate-like bridge portion 120 and the second plate-like bridge portion 130 is given as a U-letter shaped structure body so that a projection image thereof on the XY plane is formed in the U-letter shape and structured in such a manner that the plate-like weight body 150 is arranged in an internal domain surrounded by the U-letter shaped structure body.

The above-described basic structure body 100 is structurally suitable for mass production. That is, as apparent from the plan view of FIG. 9A, the basic structure body 100 can be mass-produced by a process in which a void area V having a U-letter shape is formed in a planar manner on a rectangular plate-like member by etching, etc., to fabricate a spiral structure body as a whole.

For example, the embodiment shown here is such that there is provided a square silicon substrate with one side dimension of 5 mm, a groove with the width of about 0.3 mm is formed thereon by etching to form the void area V in the U-letter shape, and the U-letter shaped structure body with the width of about 0.5 mm is used to form the fixing-portion plate-like member 110, the first plate-like bridge portion 120, the intermediate connection portion 125, the second plate-like bridge portion 130 and the weight body connection portion 140. Further, with regard to the thickness of each portion, the first plate-like bridge portion 120, the intermediate connection portion 125, the second plate-like bridge portion 130, the weight body connection portion 140 and the weight body 150 are individually 0.5 mm in thickness, and the fixing-portion plate-like member 110 is 1 mm in thickness.

Of course, dimensions of each portion can be set arbitrarily. In short, the first plate-like bridge portion 120 and the second plate-like bridge portion 130 may be set at such a dimension to have appropriate flexibility so that the weight body 150 causes vibration in the direction of each coordinate axis with certain oscillation kept. The weight body 150 may be set at such a dimension that has a sufficient mass which causes vibration necessary for electric power generation by the vibration energy from the outside. The fixing-portion plate-like member 110 may be set at such a dimension that the basic structure body 100 in its entirety is firmly attached to the bottom plate 200 of the device housing.

A description has been given above of a structure of the basic structure body 100, that is, a constituent of the power generating element of the second embodiment, with reference to FIGS. 9A and 9B. The power generating element is constituted by adding some other elements to the basic structure body 100.

FIG. 10A is a plan view of the power generating element of the second embodiment (the device housing is not illustrated), and FIG. 10B is a side sectional view obtained by cutting the power generating element along the YZ plane (the device housing is illustrated). As shown in FIG. 10B, a layered lower layer electrode E00 is formed all over the upper surface of the basic structure body 100, and a layered piezoelectric element 300 is formed all over the still upper surface thereof. Then, a group of upper layer electrodes composed of a plurality of upper layer electrodes formed locally is formed on the upper surface of the piezoelectric element 300 (since FIG. 10B is a sectional view of the YZ plane, only three upper layer electrodes Ex1, Ex2, Ez1 arranged behind the cross section appear in the drawing).

The lower layer electrode and the upper layer electrodes may be formed by using a generally accepted conductive material such as metal, as with the first embodiment. In the case of the example shown here, a thin-film metal layer with the thickness of about 300 nm (a metal layer composed of two layers of titanium film and platinum film) is used to form the lower layer electrode E00 and the group of upper layer electrodes. Further, PZT (lead zirconate titanate) or KNN (potassium sodium niobate) is made into a thin film with the thickness of about 2 μm and used as the piezoelectric element 300.

As shown in FIG. 10B, in the case of this example, the device housing is constituted with the bottom plate 200 and a cover 400, and the basic structure body 100 is housed inside the device housing. As described above, the basic structure body 100 is fixed to the upper surface of the bottom plate 200 by the fixing-portion plate-like member 110, and a weight body 150 is held in a suspended state inside the device housing. The cover 400 is constituted with a top plate 410 and a side plate 420. The weight body 150 undergoes displacement inside an internal space of the cover 400, thereby resulting in vibration.

A distance between the upper surface of the weight body 150 and the lower surface of the top plate 410 and a distance between the lower surface of the weight body 150 and the upper surface of the bottom plate 200 are set to appropriate dimensions, by which each of the top plate 410 and the bottom plate 200 is able to perform a function as a stopper member. That is, an inner wall surface of the device housing performs a function as a control member for controlling excessive displacement of the weight body 150. Thus, even where excessive acceleration (acceleration which may break each of the plate-like bridge portions 120, 130) is applied to the weight body 150, it is possible to control excessive displacement of the weight body 150, thereby preventing the plate-like bridge portions 120, 130 from being damaged. However, where a clearance dimension between the top plate 410 and the weight body 150 or a clearance dimension between the bottom plate 200 and the weight body 150 is excessively narrow, power generation efficiency is decreased by influences of air damping. This should be noted.

In the case of the example shown here, as shown in FIG. 10A, a group of upper layer electrodes is constituted with 12 upper layer electrodes Ex1 to Ex4; Ey1 to Ey4; Ez1 to Ez4 (hatching in the drawing is given for clearly indicating an electrode forming domain and not for indicating a cross section). FIG. 10A is a plan view of the power generating element when observed from above. Therefore, a piezoelectric element 300 which covers an entire surface of the basic structure body comes into sight. For convenience of description, however, in FIG. 10A, the position of each of the fixing-portion plate-like member 110, the first plate-like bridge portion 120, the second plate-like bridge portion 130, the weight body connection portion 140 and the weight body 150 is indicated by a symbol having an outgoing line of the broken line.

Roles of six upper layer electrodes arranged above the first plate-like bridge portion 120 are fundamentally similar to those of six upper layer electrodes arranged above the plate-like bridge portion 20 shown in FIGS. 3A and 3B. Similarly, roles of six upper layer electrodes arranged above the second plate-like bridge portion 130 are fundamentally similar to those of six upper layer electrodes arranged above the plate-like bridge portion 20 shown in FIGS. 3A and 3B.

Here, the four upper layer electrodes Ex1 to Ex4, each of which includes a symbol x, (side electrodes on both sides arranged so as to extend along a second longitudinal direction axis Lx on the second plate-like bridge portion 130) and the four upper layer electrodes Ey1 to Ey4, each of which includes a symbol y, (side electrodes on both sides arranged so as to extend along a first longitudinal direction axis Ly on the first plate-like bridge portion 120) are electrodes installed for playing a role of taking out charge generated on the basis of vibration energy of the weight body 150 mainly in the horizontal direction (in the direction of the X-axis and in the direction of the Y-axis). The four upper layer electrodes Ez1 to Ez4, each of which includes a symbol z, (central electrodes arranged on the first longitudinal direction axis Ly of the first plate-like bridge portion 120 and on the second longitudinal direction axis Lx of the second plate-like bridge portion 130) are electrodes installed for playing a role of taking out charge on the basis of vibration energy of the weight body 150 mainly in a perpendicular direction (in the direction of the Z-axis).

Here, of the 12 upper layer electrodes shown in FIG. 10A, three electrodes formed at the leading end of the first plate-like bridge portion 120 are respectively referred to as a first leading end-side right-hand side electrode Ey1, a first leading end-side central electrode Ez3 and a first leading end-side left-hand side electrode Ey2. Three electrodes formed at the base end of the first plate-like bridge portion 120 are respectively referred to as a first base end-side right-hand side electrode Ey3, a first base end-side central electrode Ez4 and a first base end-side left-hand side electrode Ey4. Three electrodes formed at the leading end of the second plate-like bridge portion 130 are respectively referred to as a second leading end-side right-hand side electrode Ex1, a second leading end-side central electrode Ez1, a second leading end-side left-hand side electrode Ex2. Three electrodes formed at the base end of the second plate-like bridge portion 130 are respectively referred to as a second base end-side right-hand side electrode Ex3, a second base end-side central electrode Ez2, and a second base end-side left-hand side electrode Ex4.

Here as well, the words "the right-hand side" and "the left-hand side" refer to the right and the left when the upper surface of each of the plate-like bridge portions 120, 130 is observed from the base end-side thereof. The central electrodes Ez3, Ez4 are arranged on the first longitudinal direction axis Ly (the center axis parallel to the Y-axis) which is given as the center line of the first plate-like bridge portion 120. The side electrodes on both sides Ey1 to Ey4 are arranged on the both sides so as to be symmetrical with the first longitudinal direction axis Ly. Similarly, the central electrodes Ez1, Ez2 are arranged on the second longitudinal direction axis Lx (the center axis parallel to the X-axis) which is given as the center line of the second plate-like bridge portion 130. The side electrodes on both sides Ex1 to Ex4 are arranged on the both sides thereof so as to be symmetrical with the second longitudinal direction axis Lx.

As shown in FIG. 10B, the power generating element is additionally provided with a power generating circuit 500. In FIG. 10B, the power generating circuit 500 is indicated just as a block. A specific circuit diagram thereof will be described below. As illustrated in the drawing, wiring is given between the power generating circuit 500, the lower layer electrode E00 and the 12 upper layer electrodes Ex1 to Ex4; Ey1 to Ey4; Ez1 to Ez4, and charge generated at each of the upper layer electrodes is taken out through the wiring by the power generating circuit 500. Actually, each of the wiring can be formed together with each of the upper layer electrodes by means of a conductive pattern made on the upper surface of the piezoelectric element 300. Further, where the basic structure body is constituted with a silicon substrate, the power generating circuit 500 can be formed on the silicon substrate (for example, a part of the fixing-portion plate-like member 110).

Resultantly, the power generating element of the second embodiment is a power generating element which generates electric power by converting vibration energy in the direction of each coordinate axis in the XYZ three-dimensional coordinate system into electric energy. The power generating element is provided with the first plate-like bridge portion 120 which is flexible and extends along the first longitudinal direction axis Ly parallel to the Y-axis, the second plate-like bridge portion 130 which is flexible and connected to the first plate-like bridge portion 120 (through an intermediate connection portion 125) to extend along the second longitudinal direction axis Lx parallel to the X-axis, the weight body 150 which is connected to the second plate-like bridge portion 130 (through the weight body connection portion 140), the device housing 400 which houses the first plate-like bridge portion 120, the second plate-like bridge portion 130 and the weight body 150, the fixing-portion (fixing-portion plate-like member 110) which fixes one end of the first plate-like bridge portion 120 to the device housing 400, the lower layer electrode E00 which is formed in a layered manner on the surfaces of the first plate-like bridge portion 120 and the second plate-like bridge portion 130, the piezoelectric element 300 which is formed in a layered manner on the surface of the lower layer electrode E00, the group of upper layer electrodes Ex1 to Ex4, Ey1 to Ey4, Ez1 to Ez4 which is composed of a plurality of upper layer electrodes locally formed on the surface of the piezoelectric element 300, and the power generating circuit 500 which rectifies current produced based on charge generated at each of the upper layer electrodes and the lower layer electrode to take out electric power.

As described above, in the thus structured power generating element, upon application of an external force which vibrates the device housing 400, the weight body 150 vibrates inside the device housing 400 due to deflection occurring at each of the plate-like bridge portions 120, 130. Then, deflection occurring at each of the plate-like bridge portions 120, 130 is transmitted to the piezoelectric element 300, resulting in similar deflection occurring at the piezoelectric element 300. The piezoelectric element 300 is apt to polarize in the thickness direction due to application of stress which expands and contracts in the layer direction. Therefore, charge is generated on the upper and lower surfaces of the piezoelectric element 300, and the thus generated charge is taken out from the upper layer electrodes Ex1 to Ex4; Ey1 to Ey4; Ez1 to Ez4 and the lower layer electrode E00.

In the case of the example shown here, as with the example described in Chapter 1, there is used the piezoelectric element 300 in which upon application of stress which expands in the layer direction, positive charge is generated on the upper surface, while negative charge is generated on the lower surface. In contrast, upon application of stress which contracts in the layer direction, negative charge is generated on the upper surface, while positive charge is generated on the lower surface. Of course, in the second embodiment as well, there may be used a piezoelectric element with any polarization characteristics.

Figure 11:
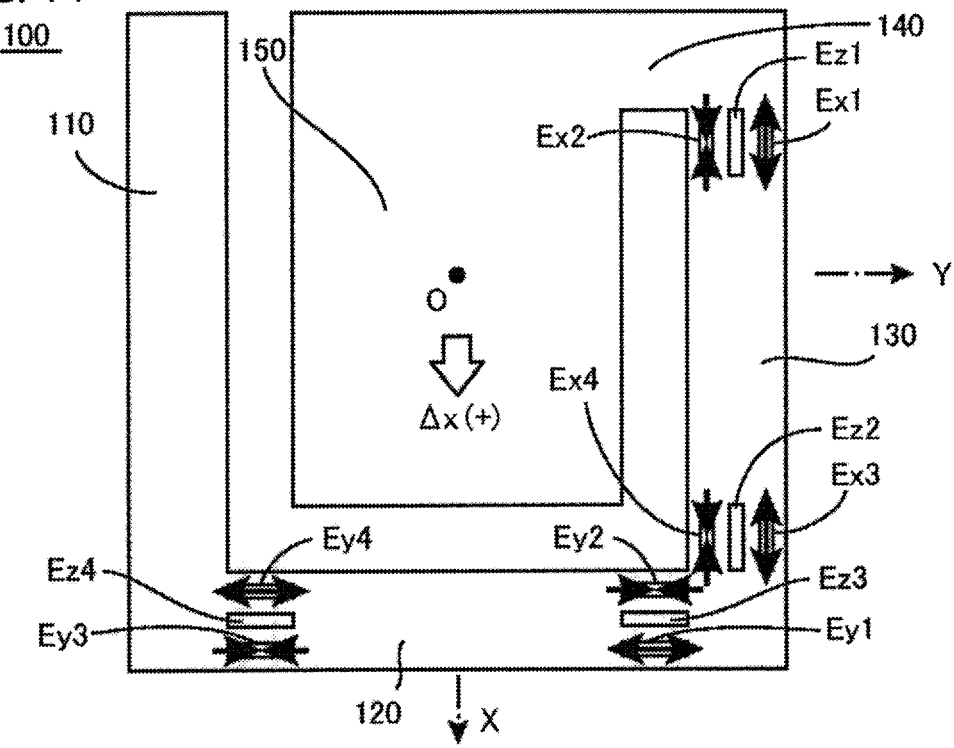
FIG. 11 is a plan view which shows an expansion/contraction state at a position at which each of upper layer electrodes is formed when a weight body 150 of the basic structure body 100 shown in FIGS. 9A and 9B yields displacement $\Delta x(+)$ in the positive direction of the X-axis.
Figure 12:
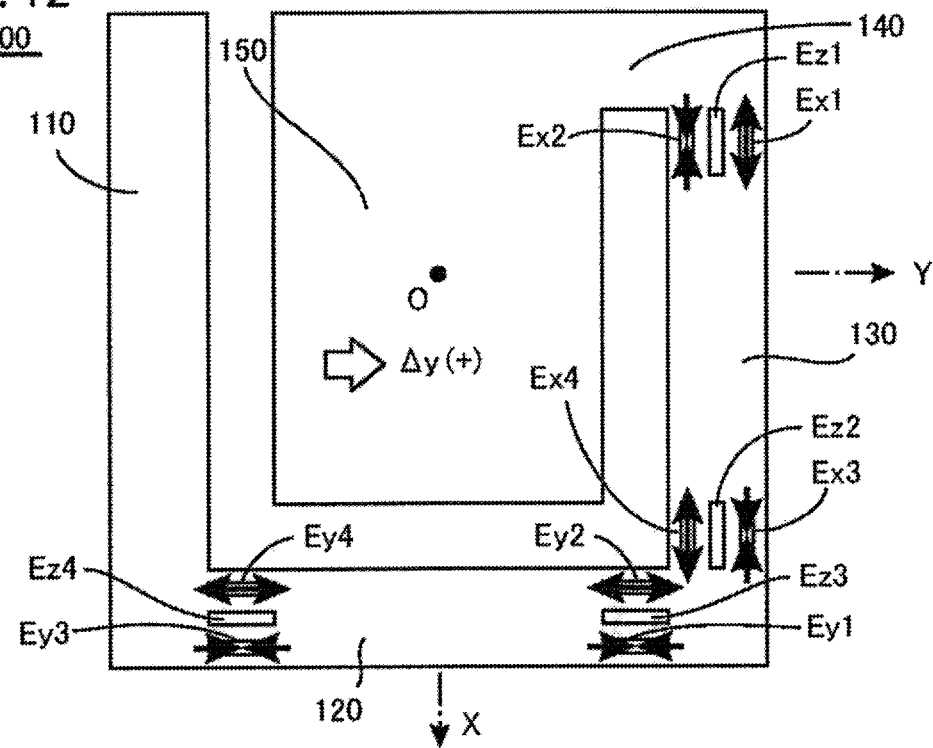
FIG. 12 is a plan view which shows an expansion/contraction state at a position at which each of the upper layer electrodes is formed when the weight body 150 of the basic structure body 100 shown in FIGS. 9A and 9B yields displacement $\Delta y(+)$ in the positive direction of the Y-axis.
Figures 13, 14:
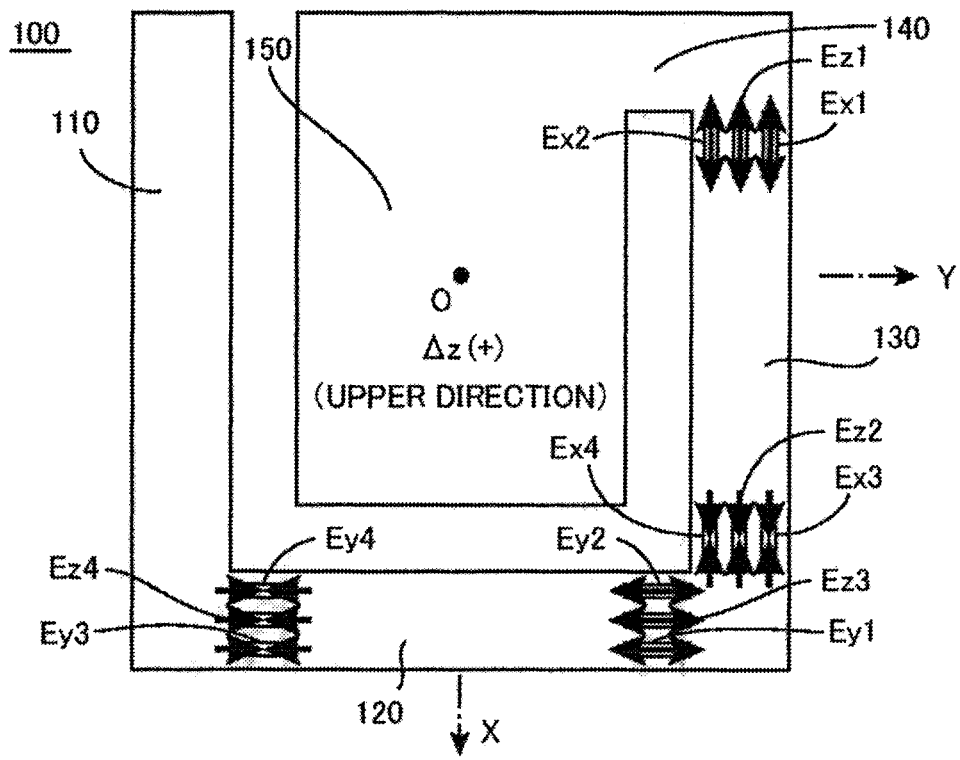
FIG. 13 is a plan view which shows an expansion/contraction state at a position at which each of the upper layer electrodes is formed when the weight body 150 of the basic structure body 100 shown in FIGS. 9A and 9B yields displacement $\Delta z(+)$ in the positive direction of the Z-axis.
FIG. 14 is a table which shows polarity of charge generated at each of upper layer electrodes Ex1 to Ez4 when displacement in the direction of each coordinate axis occurs at the weight body 150 of the power generating element shown in FIGS. 10A and 10B.

Next, the specific power generating motion of the power generating element is considered. FIG. 11 is a plan view which shows an expansion/contraction state at a position at which each of the upper layer electrodes is formed when the weight body 150 of the basic structure body 100 shown in FIGS. 9A and 9B undergoes displacement Δx(+) in the positive direction of the X-axis. Similarly, FIG. 12 is a plan view which shows an expansion/contraction state when it undergoes displacement Δy(+) in the positive direction of the Y-axis. FIG. 13 is a plan view which shows an expansion/contraction state when it undergoes displacement Δz(+)

in the positive direction of the Z-axis. The above-described displacement will occur when acceleration in the positive direction of each coordinate axis is applied on the weight body 150. This displacement imparts deflection at each of the plate-like bridge portions 120, 130, resulting in deformation of the basic structure body 100. However, in FIG. 11 to FIG. 13, for convenience of illustration, a displacement state of the basic structure body 100 is not illustrated and an expansion/contraction state at a position at which each of the upper layer electrodes has been formed is indicated by the arrow (a symbol with arrows on both sides indicates a state of expansion, and a symbol with a pair of mutually facing arrows indicates a state of contraction).

Where the weight body 150 undergoes displacement Δx(+) in the positive direction of the X-axis, as shown in FIG. 11, stress which expands in the longitudinal direction is applied on each of the second leading end-side right-hand side electrode Ex1, the second base end-side right-hand side electrode Ex3 and the first leading end-side right-hand side electrode Ey1 which are arranged outside the spiral basic structure body 100, whereas stress which contracts in the longitudinal direction is applied on the first base end-side right-hand side electrode Ey3. On the other hand, stress which contracts in the longitudinal direction is applied on each of the second leading end-side left-hand side electrode Ex2, the second base end-side left-hand side electrode Ex4 and the first leading end-side left-hand side electrode Ey2 which are arranged inside the spiral basic structure body 100, whereas stress which expands in the longitudinal direction is applied on the first base end-side left-hand side electrode Ey4.

Despite the fact that the first base end-side right-hand side electrode Ey3 is an electrode which is positioned outside the spiral basic structure body 100, it is reverse in an expansion/contraction state to those which are positioned outside, that is, the right-hand side electrodes Ex1, Ex3, Ey1. Despite the fact that the first base end-side right-hand side electrode Ey4 is an electrode which is positioned inside the spiral basic structure body 100, it is reverse in an expansion/contraction state to those which are positioned inside, that is, the left-hand side electrodes Ex2, Ex4, Ey2. A complicated theory is needed for describing reasons for the reverse of expansion/contraction occurring at the base end of the first plate-like bridge portion 120 and, therefore, the description thereof is omitted here. However, the inventor of the present invention has confirmed occurrence of the illustrated expansion/contraction stress by conducting a computer simulation on structural mechanics (refer to FIGS. 19A and 19B to be described below).

As for the four central electrodes Ez1 to Ez4 arranged on the center line, reverse stress is slightly applied between the right half and the left half of the central electrodes. It is thus considered that the stress is, as a whole, balanced to cause no expansion/contraction.

FIG. 11 shows a state of displacement Δx(+) occurring in the positive direction of the X-axis. Upon displacement Δx(−) occurring in the negative direction of the X-axis, the weight body 150 undergoes displacement in a reverse direction. An expansion/contraction state of each portion is reverse to the state shown in FIG. 11. Therefore, when vibration energy having a vibration component in the direction of the X-axis is applied to the device housing 400, the expansion/contraction state shown in FIG. 11 and a reversed state thereof will be repeated alternately at each portion of the basic structure body 100.

On the other hand, where the weight body 150 undergoes displacement Δy(+) in the positive direction of the Y-axis, as shown in FIG. 12, stress which contracts in the longitudinal direction is applied on each of the second base end-side right-hand side electrode Ex3, the first leading end-side right-hand side electrode Ey1 and the first base end-side right-hand side electrode Ey3 which are arranged outside the spiral basic structure body 100, whereas stress which expands in the longitudinal direction is applied on the second leading end-side right-hand side electrode Ex1. On the other hand, stress which expands in the longitudinal direction is applied on each of the second base end-side left-hand side electrode Ex4, the first leading end-side left-hand side electrode Ey2 and the first base end-side left-hand side electrode Ey4 which are arranged inside the spiral basic structure body 100, whereas stress which contracts in the longitudinal direction is applied on the second leading end-side left-hand side electrode Ex2.

Despite the fact that the second leading end-side right-hand side electrode Ex1 is an electrode which is positioned outside the spiral basic structure body 100, it is reverse in an expansion/contraction state to those which are positioned outside, that is, the right-hand side electrodes Ex3, Ey1, Ey3. Despite the fact that the second leading end-side left-hand side electrode Ex2 is an electrode which is positioned inside the spiral basic structure body 100, it is reverse in an expansion/contraction state to those which are positioned inside, that is, the left-hand side electrodes Ex4, Ey2, Ey4. A complicated theory is needed for describing reasons for the reverse of expansion/contraction occurring at the leading end of the second plate-like bridge portion 130 and, therefore, the description thereof is omitted here. The inventor of the present invention has confirmed occurrence of the illustrated expansion/contraction stress by conducting a computer simulation on structural mechanics (refer to FIGS. 20A and 20B to be described below).

In this case as well, as for the four central electrodes Ez1 to Ez4 arranged on the center line, reverse stress is slightly applied between the right half and the left half of the central electrodes. It is considered that the stress is, as a whole, balanced to cause no expansion/contraction.

FIG. 12 shows a state of displacement Δy(+) occurring in the positive direction of the Y-axis. Upon displacement Δy(−) occurring in the negative direction of the Y-axis, the weight body 150 undergoes displacement in a reverse direction, and an expansion/contraction state of each portion is reverse to the state shown in FIG. 12. Therefore, where vibration energy having a vibration component in the direction of the Y-axis is applied to the device housing 400, the expansion/contraction state shown in FIG. 12 and a reverse state thereof will be repeated alternately at each portion of the basic structure body 100.

Finally, where the weight body 150 undergoes displacement Δz(+) in the positive direction of the Z-axis, as shown in FIG. 13, stress which expands in the longitudinal direction is applied on the three electrodes Ey1, Ey2, Ez3 at the leading end-side of the first plate-like bridge portion 120 and the three electrodes Ex1, Ex2, Ez1 at the leading end-side of the second plate-like bridge portion 130. And, stress which contracts in the longitudinal direction is applied on the three electrodes Ey3, Ey4, Ez4 at the base end-side of the first plate-like bridge portion 120 and the three electrodes Ex3, Ex4, Ez2 at the base end-side of the second plate-like bridge portion 130. Although a detailed description will be omitted for reasons for application of the above-described stress, the inventor of the present invention has confirmed occurrence of the illustrated expansion/contraction stress by conducting a computer simulation on structural mechanics (refer to FIGS. 21A and 21B to be described below).

FIG. 13 shows a state of displacement Δz(+) occurring in the positive direction of the Z-axis. Upon displacement Δz(−) occurring in the negative direction of the Z-axis, the weight body 150 undergoes displacement in a reverse direction, and an expansion/contraction state of each portion is reverse to the state shown in FIG. 13. Therefore, when vibration energy having a vibration component in the direction of the Z-axis is applied to the device housing 400, the expansion/contraction state shown in FIG. 13 and a reverse state thereof will be repeated alternately at each portion of the basic structure body 100.

FIG. 14 is a table which shows the polarity of charge generated at each of the upper layer electrodes Ex1 to Ex4; Ey1 to Ey4; Ez1 to Ez4, when the weight body 150 undergoes displacement in the direction of each coordinate axis, with the lower layer electrode E00 given as a reference potential, in the power generating element shown in FIGS. 10A and 10B. In the table, a symbol of "+" denotes generation of positive charge, while a symbol of "−" denotes generation of negative charge. Further, a symbol of "0" denotes a state that no charge is generated or a state that charge is generated in a smaller quantity than the case indicated by the symbol of "+" or the symbol of "−." Actually, since charge indicated in a column corresponding to the symbol of "0" is not generated in a significant quantity, the charge will be disregarded in the following description.

As described above, when the weight body 150 undergoes displacement in the direction of each coordinate axis, the expansion/contraction stress shown in FIG. 11 to FIG. 13 is applied to individual parts of each of the plate-like bridge portions 120, 130. On the other hand, the piezoelectric element 300 is characterized in that its polarization is such that positive charge is generated on the upper surface thereof and negative charge is generated on the lower surface thereof upon 385 application of stress which expands in the layer direction, while negative charge is generated on the upper surface thereof and positive charge is generated on the lower surface thereof upon application of stress which contracts in the layer direction. With the above description taken into account, it will be easily understood that the results shown in the table of FIG. 14 are obtained.

For example, results on each column of "displacement Δx(+)" in the first row in FIG. 14 are such that "+" is given to a column of each of the upper layer electrodes which is an expanding part in the distribution of expansion/contraction shown in FIG. 11, "−" is given to a column of each of the upper layer electrodes which is a contracting part, and "0" is given to a column of each of the upper layer electrodes which is a part free of expansion/contraction as a whole. Similarly, results on individual columns of "displacement Δy(+)" in the second row are as indicated in the distribution of expansion/contraction shown in FIG. 12. Results on individual columns of "displacement Δz(+)" in the third row are as indicated in the distribution of expansion/contraction shown in FIG. 13.

The table of FIG. 14 shows charge generated at each of the upper layer electrodes upon displacement Δx(+), Δy(+), Δz(+) occurring in the positive direction of each coordinate axis on the weight body 150. Upon displacement Δx(−), Δy(−), Δz(−) occurring in the negative direction of each coordinate axis, obtained are such results that the symbols in the table of FIG. 14 are reversed. In most cases, when vibration energy is applied from the outside, the weight body 150 vibrates inside the device housing 400 to synchronize with a period of the vibration, and the symbols shown in the table of FIG. 14 are reversed. Then, generation of charge is periodically increased or decreased.

Actually, vibration energy applied from the outside is to have a direction component of each coordinate axis in an XYZ three-dimensional coordinate system. Therefore, displacement of the weight body 150 is synthesized displacement of Δx(±), Δy(±), Δz(±) and subject to change over time. Therefore, when, for example, displacement of Δx(+) and that of Δy(+) occur at the same time, or displacement of Δx(+) and that of Δz(+) occur at the same time, positive charge and negative charge are both generated at the upper layer electrodes Ex3, Ey2, as shown in the table of FIG. 14. Thus, charge is partially offset and cannot be effectively taken out.

As described above, power is not always generated efficiently at 100%, depending on a certain mode of vibration by the weight body 150. However, as a whole, electric power can be generated by taking out energy in the directions of three axes, that is, vibration energy of the weight body 150 in the direction of the X-axis, vibration energy in the direction of the Y-axis, and vibration energy in the direction of the Z-axis. Therefore, the power generating element according to the second embodiment of the present invention is characterized in that vibration energy of the weight body 150 for all three axes can be utilized to generate electric power. Due to the above-described characteristics, it is possible to realize an object that vibration energy which includes various direction components is converted into as much electric energy as possible without waste to generate electric power at high efficiency.

The power generating circuit 500 plays a role of rectifying current produced on the basis of charge generated at each of the upper layer electrodes Ex1 to Ez4 and at the lower layer electrode E00 to take out electric power. In the case of the example shown here, the lower layer electrode E00 performs a function to secure a reference potential as a common electrode. Therefore, actually, current flowing out from each of the upper layer electrodes Ex1 to Ez4 and current flowing into each of the upper layer electrodes Ex1 to Ez4 may be individually collected to store electricity.

Figure 15:
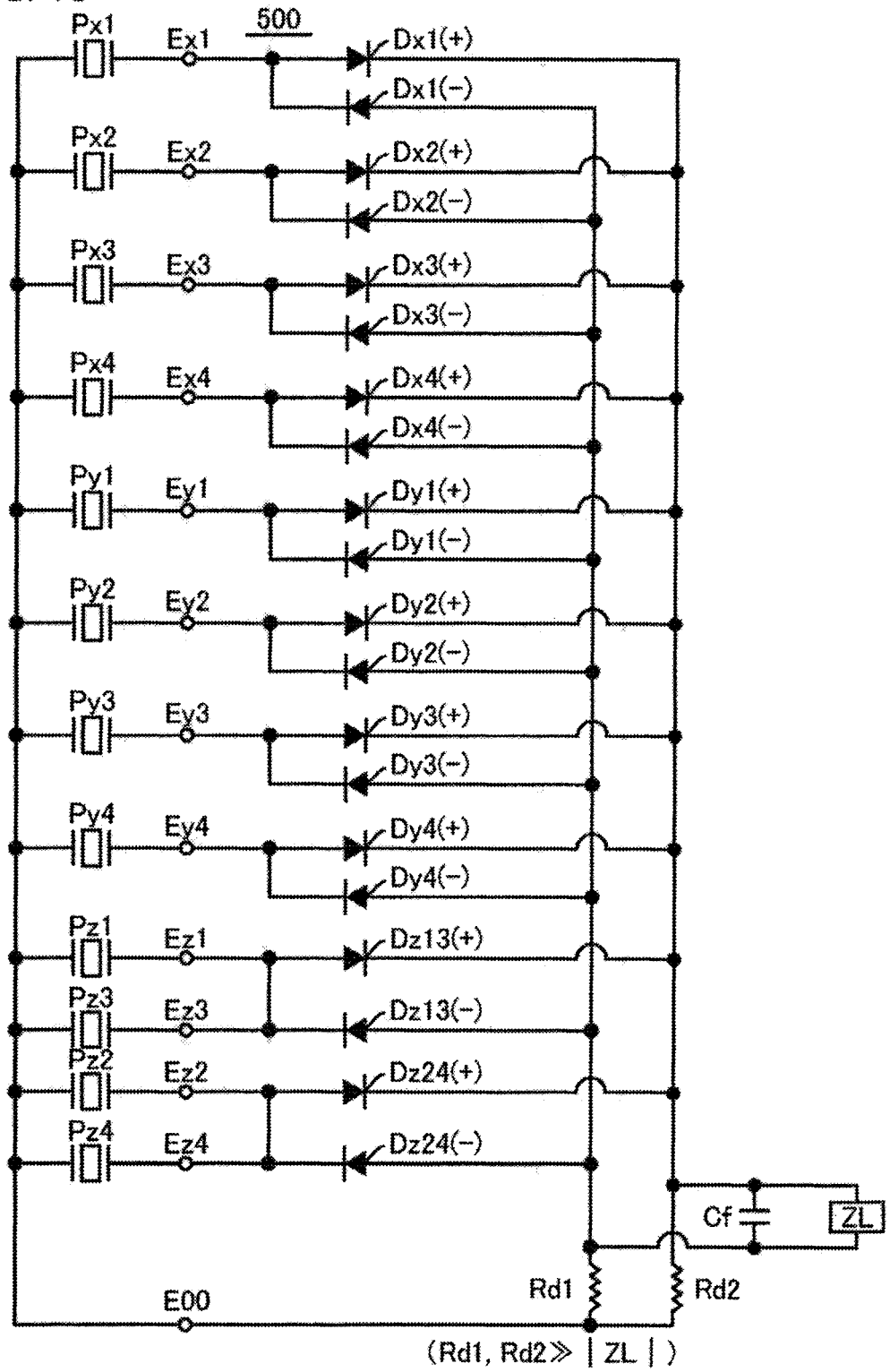
FIG. 15 is a circuit diagram which shows a specific constitution of a power generating circuit 500 used in the power generating element shown in FIGS. 10A and 10B.

FIG. 15 is a circuit diagram which shows a specific constitution of the power generating circuit 500 which is used in the power generating element shown in FIGS. 10A and 10B. A basic circuit constitution thereof is similar to that of the power generating circuit 60 shown in FIG. 5. That is, Px1 to Px4; Py1 to Py4; Pz1 to Pz4 show parts of the piezoelectric element 300, respectively corresponding to sites directly under the upper layer electrodes Ex1 to Ez4; Ey1 to Ey4; Ez1 to Ez4. Further, E00 indicated by the white circle on the circuit diagram corresponds to the lower layer electrode, and Ex1 to Ex4; Ey1 to Ey4; Ez1 to Ez4 indicated by the white circle correspond to the upper layer electrodes.

Dx1(+) to Dz24(−) denote rectifier cells (diodes). Each of the rectifier cells to which a symbol of (+) is given plays a role of taking out positive charge generated at each of the upper layer electrodes, and each of the rectifier cells to which a symbol of (−) is given plays a role of taking out negative charge generated at each of the upper layer electrodes.

A pair of mutually independent positive and negative rectifier cells Dx1(+), Dx1(−), . . . etc., are connected to each of the upper layer electrodes Ex1 to Ex4; Ey1 to Ey4. In contrast, to the upper layer electrodes Ez1, Ez3, a pair of positive and negative rectifier cells Dz13(+), Dz13(−) which are common to them are connected, and to the upper layer electrodes Ez2, Ez4, a pair of positive and negative rectifier cells Dz24 (+), Dz24(−) which are common to them are connected. This is because, as apparent from the table of FIG. 14, the upper layer electrodes Ez1, Ez3 constantly generate only charge with the same polarity and the upper layer electrodes Ez2, Ez4 also constantly generate charge with the same polarity, by which they can use the common rectifier cells.

On the other hand, a symbol of Cf denotes a smoothing capacitive element (capacitor). Positive charge which has been taken out is supplied to a positive-electrode terminal of the capacitor (an upper terminal in the drawing), and negative charge which has been taken out is supplied to a negative-electrode terminal thereof (a lower terminal in the drawing). As with the power generating circuit 60 shown in FIG. 5, the capacitive element Cf plays a role of smoothing pulsating current resulting from the thus generated charge. At a stationary time when the weight body 150 is stable in vibration, impedance of the capacitive element Cf is substantially negligible. In the power generating circuit 60 shown in FIG. 5, in order to take out charge generated at the lower layer electrode E0, the rectifier cells D0(+) and D0(−) are used. In the power generating circuit 500 shown in FIG. 15, there is adopted such a constitution that both terminals of the capacitive element Cf are connected to the lower layer electrode E00 through resistance elements Rd1, Rd2. This constitution is also able to take out charge generated both at the upper layer electrodes and at the lower layer electrode.

In this case as well, ZL which is connected in parallel to the capacitive element Cf indicates load of an appliance to which electric power generated by the power generating element is supplied. Resistance values of the resistance elements Rd1, Rd2 are set so as to be sufficiently larger than impedance of the load ZL. As with the power generating circuit 60 shown in FIG. 5, in order to improve the power generation efficiency, it is preferable that impedance of the load ZL is matched with internal impedance of the piezoelectric element 300. Therefore, where an appliance to which electric power is supplied is assumed in advance, it is preferable that a piezoelectric element which has internal impedance matched with impedance of the load ZL of the appliance is adopted to design the power generating element.

Resultantly, the power generating circuit 500 is provided with the capacitive element. Of, rectifier cells for positive charge Dx1 (+) to Dx24 (+) in which a direction of moving from each of the upper layer electrodes Ex1 to Ez4 to the positive electrode of the capacitive element Cf for guiding positive charge generated at each of the upper layer electrodes Ex1 to Ez4 toward the positive electrode of the capacitive element Cf is given as a forward direction, and rectifier cells for negative charge Dx1 (−) to Dz24 (−) in which a direction of moving from the negative electrode of the capacitive element Cf to each of the upper layer electrodes Ex1 to Ez4 for guiding negative charge generated at each of the upper layer electrodes Ex1 to Ez4 toward the negative electrode of the capacitive element Cf is given as a forward direction. Thus, the power generating circuit 500 performs a function to smooth electric energy converted from vibration energy by using the capacitive element Cf, thereby supplying the electric energy to the load ZL.

In the circuit shown in FIG. 15 as well, positive charge taken out from the rectifier cells for positive charge Dx1 (+) to Dz24 (+) and negative charge taken out from the rectifier cells for negative charge Dx1 (−) to Dz24 (−) are supplied to the load ZL. Therefore, in principle, a total quantity of positive charge generated at the individual upper layer electrodes Ex1 to Ez4 is at each instant made equal to a total quantity of negative charge thereof thus making it possible to generate electric power at the highest efficiency.

As described above, of the upper layer electrodes shown in FIGS. 10A and 10B, the side electrodes on both sides are all arranged so as to be symmetrical with each other, with the longitudinal direction axis Lx or Ly given as the center axis. The above-described symmetrical structure is adopted, by which where the weight body 150 vibrates in the direction of the X-axis, as shown in FIG. 11, positive charge generated at a pair of left-hand side and right-hand side electrodes arranged at the same place is made substantially equal in total quantity to negative charge thereof. Similarly, where the weight body 150 vibrates in the direction of the Y-axis, as shown in FIG. 12, positive charge generated at a pair of left-hand side and right-hand side electrodes arranged at the same place is made substantially equal in total quantity to negative charge thereof. As described above, a pair of electrodes, that is, the right-hand side electrode and the left-hand side electrode, are arranged on both sides of the central electrode, which is advantageous in that with regard to vibration in the direction of the X-axis and vibration in the direction of the Y-axis, there is obtained such an effect that positive charge is made equal in total quantity to negative charge.

Of course, in the second embodiment as well, electric power can be generated most efficiently where resonance frequency of the weight body 150 which is determined on the basis of a structure unique to the basic structure body 100 is matched with frequency of vibration applied from the outside. Therefore, where frequency of vibration applied from the outside is assumed in advance, it is preferable that design is made so that resonance frequency is matched with the frequency concerned at a stage of designing a structure of the basic structure body 100.

Chapter 4. Power Generating Device Using the Second Embodiment

Here, a description will be given of an embodiment in which a plurality of sets of the power generating elements according to the second embodiment (elements shown in FIGS. 10A and 10B) described in Chapter 3 are provided to realize more efficient power generation. In the present application, for convenience of terminology classification, one set of elements shown in the first embodiment described in Chapter 1, the modification example described in Chapter 2 and the second embodiment described in Chapter 3 is referred to as a "power generating element." A device which uses a plurality of sets of the "power generating elements" and has a function to supply to the outside electric power taken out by the individual power generating elements is referred to as a "power generating device."

Figure 16:
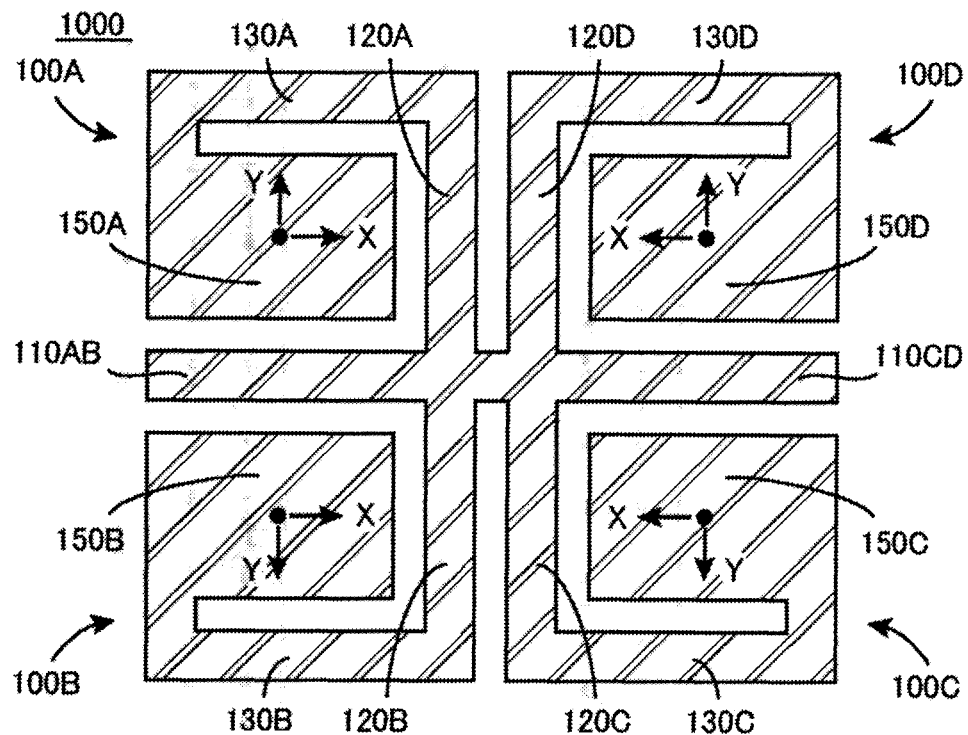
FIG. 16 is a plan view which shows a structure of a basic structure body of a power generating device in which four sets of the power generating elements shown in FIGS. 10A and 10B (hatching is given to interior parts of the structure body in order to clearly indicate a planar shape thereof).

FIG. 16 is a plan view which shows a structure of a basic structure body 1000 of a power generating device in which four sets of the power generating elements shown in FIGS. 10A and 10B are used (hatching is given to interior parts of the structure body in order to clearly indicate a planar shape thereof. The basic structure body 1000 is such that four sets of basic structure bodies 100A, 100B, 100C, 100D are integrated. Each of the basic structure bodies, 100A, 100B, 100C, 100D is similar in structure to the basic structure body 100 shown in FIGS. 9A and 9B, each of which is provided with individual portions of a fixing-portion plate-like member 110, a first plate-like bridge portion 120, a second plate-like bridge portion 130 and a weight body 150.

In FIG. 16, A to D are given to the ends of symbols which respectively indicate the basic structure bodies 100A, 100B, 100C, 100D. For example, the basic structure body 100A is provided with individual portions of a fixing-portion plate-like member 110A, a first plate-like bridge portion 120A, a second plate-like bridge portion 130A and a weight body 150A. However, the basic structure bodies vertically adjacent in the drawing are structured in such a manner that a pair of fixing-portion plate-like members 110 are integrated. Thus, the fixing-portion plate-like member 110A of the basic structure body 100A is actually integrated with the fixing-portion plate-like member 110B of the basic structure body 100B, thereby constituting a single fixing-portion plate-like member 110AB. Similarly, the fixing-portion plate-like member 110C of the basic structure body 100C is actually integrated with the fixing-portion plate-like member 110D of the basic structure body 100D, thereby constituting a single fixing-portion plate-like member 110CD.

Of course, an actual power generating device is constituted by adding to the basic structure body 1000 shown in FIG. 16, a lower layer electrode, a piezoelectric element, upper layer electrodes and a power generating circuit. Specifically, for example, a common lower layer electrode may be formed all over on the upper surface of the basic structure body 1000, a common piezoelectric element may be formed all over on an upper surface of the lower layer electrode, and a plurality of upper layer electrodes may be individually locally formed at predetermined sites on an upper surface of the piezoelectric element (of course, each of the lower layer electrode and the piezoelectric element may be provided as an independent constitution).

Here, the power generating circuit may be a circuit suitable for the four sets of power generating elements integrated so as to collectively output charge taken out from the four sets of power generating elements.

Specifically, when the power generating circuit 500 shown in FIG. 15 is used, a rectifier cell may be connected to each of the upper layer electrodes in the power generating element, however, a single common capacitive element Cf may be provided for all of the four sets of power generating elements, thereby storing here electric energy obtained from all the power generating elements. Further, the lower layer electrodes E00 of the four sets of power generating elements are connected to each other to be equal in potential. Of course, resistance elements Rd1, Rd2 may be used commonly in the four sets of power generating elements.

One set of the power generating elements shown in FIGS. 10A and 10B is to generate electric power on the basis of charge collected from twelve upper layer electrodes. The power generating device composed of four sets of the above-described power generating elements is able to generate electric power on the basis of charge collected from a total of forty-eight upper layer electrodes.

Where a plurality of sets of power generating elements are combined to constitute a power generating device, it is preferable that some of the power generating elements are arranged in such a manner that the direction of the X-axis thereof or the direction of the Y-axis thereof or the both directions thereof are different from those of the other power generating elements. The above-described arrangement is adopted to realize such an effect that a total quantity of positive charge generated at the individual upper layer electrodes is at each instant made equal to a total quantity of negative charge thereof as much as possible, and electric power can be generated more efficiently.

For example, in the case of the basic structure body 1000 shown in FIG. 16, coordinate axes of the individual basic structure bodies 100A to 100D are illustrated in the drawing (the X-axis and the Y-axis which are defined in the basic structure body 100 in FIGS. 9A and 9B). It is apparent that they are different from each other in combination direction.

That is, the basic structure body 100A corresponds to such that the basic structure body 100 shown in FIGS. 9A and 9B is turned counter-clockwise by 90 degrees. Where the basic structure body 100A is used as a reference, the basic structure body 100B is a mirror image vertically in the drawing. Further, where each of the basic structure bodies 100A, 100B, shown in the left half of the drawing, is used as a reference, each of the basic structure bodies 100C, 100D, shown in the right half of the drawing, is a mirror image laterally in the drawing.

Resultantly, the power generating device constituted with the basic structure body 1000 shown in FIG. 16 is provided with four sets of power generating elements. When the direction of the X-axis and the direction of the Y-axis in the first power generating element (an element in which the basic structure body 100A is used) are used as a reference, the second power generating element (an element in which the basic structure body 100B is used) is arranged in such a direction that the direction of the Y-axis is reversed, the third power generating element (an element in which the basic structure body 100D is used) is arranged in such a direction that the direction of the X-axis is reversed, and the fourth power generating element (an element in which the basic structure body 100C is used) is arranged in such a direction that the direction of the X-axis and the direction of the Y-axis are both reversed. As a result, the direction of the Z-axis of the first power generating element and that of the fourth power generating element are in a direction moving perpendicularly above the sheet surface. In contrast, the direction of the Z-axis of the second power generating element and that of the third power generating element are in a direction moving perpendicularly below the sheet surface.

As described above, the power generating device is constituted by arranging four sets of the power generating elements in a mutually complementary manner. Thereby, even where acceleration is applied in a specific direction to displace a weight body of each of the power generating elements in the specific direction, displacement occurs in a mutually complementary direction in each coordinate system due to a difference in direction of the coordinate system defined for each of the power generating elements. Therefore, where positive charge is generated at a specific upper layer electrode of one certain power generating element, negative charge is to be generated at an upper layer electrode to which another power generating element corresponds. Thus, when four sets of the power generating elements are observed as a whole, there is obtained such an effect that positive charge to be generated is made equal in total quantity to negative charge thereof.

Incidentally, as described above, in order to efficiently generate electric power on the basis of vibration applied from the outside, it is preferable that resonance frequency of the weight body 150 is matched with frequency of vibration application from the outside. Therefore, for example, where a specific vehicle in which the power generating element of the present invention is used by being mounted thereon is assumed in advance and where frequency f given from the vehicle is known, it is preferable that at a stage of designing a structure of the basic structure body 100, the design is made so that the resonance frequency of the weight body 150 is matched with the frequency f, applied from the vehicle.

However, where the power generating element of the present invention is made available as a general commercial item, it is impossible to design the power generating element as an exclusive item. Thus, there is no way but to determine the frequency f of vibration which is considered to be most commonly used and design the power generating element so that the resonance frequency thereof is matched with the frequency f. In an actual use environment, if vibration having a frequency close to the resonance frequency f is provided, electric power can be efficiently provided. However, it is true that the further the frequency of external vibration is deviated from the resonance frequency f, the lower the power generation efficiency becomes.

Therefore, in order to generate electric power in response to a wider frequency of vibration, as described above, such an approach can be adopted that a plurality of sets of power generating elements are combined to constitute a power generating device so that the weight body of each of the plurality of power generating elements is different in resonance frequency to each other.

Figure 17:
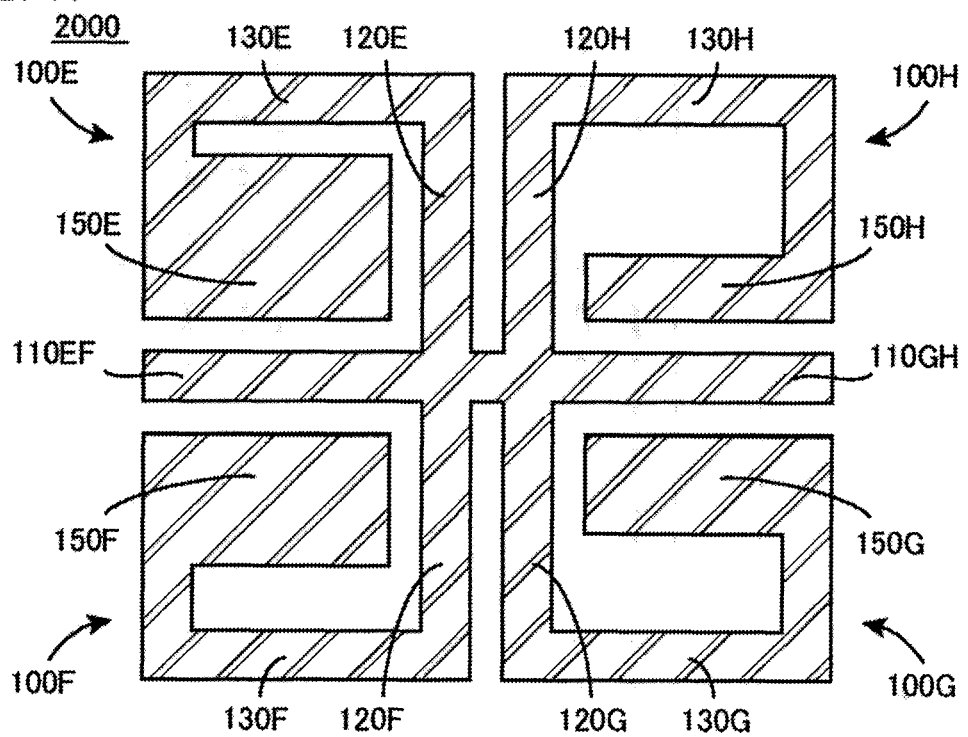
FIG. 17 is a plan view which shows a structure of the basic structure body of the power generating device which is a modification example of the power generating device shown in FIG. 16 (hatching is given to interior parts of the structure body in order to clearly indicate a planar shape thereon.

One of the specific methods of changing the resonance frequency for each of the power generating elements is to change the mass of each of the weight bodies. FIG. 17 is a plan view which shows a structure of the basic structure body of the power generating device according to the modification example of the power generating device shown in FIG. 16 (hatching is given to interior parts of the structure body in order to clearly indicate a planar shape thereof). In this modification example, each of the weight bodies in four sets of the power generating elements is changed in planar area to vary the mass thereof.

A basic structure body 2000 shown in FIG. 17 is such that four sets of basic structure bodies, 100E, 100F, 100G, 100H are formed in an integral manner. Since each of the basic structure bodies 100E, 100F, 100G, 100H is fundamentally similar in structure to the basic structure body 100 shown in FIGS. 9A and 9B, here, E to H are given to the ends of individual symbols 110, 120, 130, 150 of the basic structure bodies (as with the example shown in FIG. 16, fixing-portion plate-like members 110EF and 110GH are formed commonly).

In the case of the basic structure body 1000 shown in FIG. 16, four sets of the basic structure bodies are equal in magnitude (mass) of each of the weight bodies 150A, 150B, 150C, 150D. However, in the case of the basic structure body 2000 shown in FIG. 17, four sets of the basic structure bodies are decreased in magnitude (mass) of the weight bodies 150E, 150F, 150G, 150H in the following order of 150E>150F>150G>150H.

Specifically, each of the weight bodies 150E, 150F, 150G, 150H is a plate-like member equal in thickness. However, as shown in FIG. 17, they are set so as to be mutually different in area of a projection image on the XY plane and different in mass.

Of course, each of the weight bodies may be changed in thickness (dimension in the direction of the Z-axis), thereby changing the mass of each of them. In short, each of the weight bodies may be set so as to be mutually different in area of the projection image on the XY plane, each of them may be set so as to be mutually different in thickness in the direction of the Z-axis, or each of them may be set so as to realize the above-described two conditions, thereby to be different in mass from each of the plurality of the weight bodies in the power generating elements.

A weight body differs in resonance frequency, depending on the mass thereof. Thus, where the mass of each of the weight bodies 150E, 150F, 150G, 150H is given respectively as mE, mF, mG, mH (in the case of the example shown in FIG. 17, the order of mass is mE>mF>mG>mH), they are mutually different in resonance frequencies of fE, fF, fG, fM.

Another method of changing the resonance frequency of the weight body in each of the power generating elements is to change a structure of each of the plate-like bridge portions. Specifically, a first plate-like bridge portion, a second plate-like bridge portion, or both of them in each of the plurality of power generating elements may be set so as to be mutually different in area of a projection image on the XY plane, or may be set so as to be mutually different in thickness in the direction of the Z-axis, or may be set so as to realize the both conditions. Even where they are set as described above, it is possible to make the weight bodies 150E, 150F, 150G, 150H mutually different in resonance frequencies of fE, fF, fG, fM.

As described above, the weight body of each of four sets of the power generating elements is made different in resonance frequency, thus making it possible to generate electric power in response to a wider frequency of vibration. For example, the above example has the four resonance frequencies of fE, fF, fG, fH which are set so as to be different from each other. Therefore, if a frequency of vibration applied from the outside is proximate to any one of the resonance frequencies, a power generating element which has a proximate frequency thereof as the resonance frequency is expected to efficiently generate electric power.

Of course, where a specific vehicle in which the power generating element is used by being mounted thereon is assumed in advance and frequency f, given from the vehicle is known, it is most preferable that the resonance frequency of each of the weight bodies is set to be f in four sets of the power generating elements. However, in the case of the power generating device which is made available as a general commercial item, it is impossible to specify a vibration environment in which the device is to be used. In this case, a range of frequencies of vibration which is considered most common may be estimated to design the basic structure body of each of the power generating elements in such a manner that four different resonance frequencies of fE, fF, fG, fH are distributed within the estimated range.

Chapter 5. Modification Examples of Second Embodiment

Here, a description will be given of some modification examples of the three-axis power generation type power generating element of second embodiment described in Chapter 3.

5-1. Modification Example on the Number of Upper Layer Electrodes

In Chapter 2-1, the modification example is described in which the three upper layer electrodes E31 to E33 shown in FIG. 6 are used in place of the six upper layer electrodes E11 to E23 used in the two-axis power generation type power generating element shown in FIGS. 3A and 3B. Thus, the above-described modification example which is changed in the number of upper layer electrodes is also applicable to the three-axis type power generating element shown in FIGS. 10A and 10B.

Specifically, of six upper layer electrodes formed at the first plate-like bridge portion 120 in FIG. 10A, a pair of central electrodes Ez3, Ez4 arranged on the first longitudinal direction axis Ly may be integrated into an elongated single central electrode, a pair of right side electrodes Ey1, Ey3 arranged on the right-hand side thereof may be integrated into an elongated single right side electrode, a pair of left side electrodes Ey2, Ey4 arranged on the left-hand side may be integrated into an elongated single left side electrode. Thereby, as with the upper layer electrode formed at the plate-like bridge portion 20 in the modification example shown in FIG. 6, three elongated upper layer electrodes which extend in a direction parallel to the Y-axis are to be arranged at the first plate-like bridge portion 120. Similarly, six upper layer electrodes formed at the second plate-like bridge portion 130 in FIG. 10A can also be replaced by three elongated upper layer electrodes which extend in a direction parallel to the X-axis.

Resultantly, in the above-described modification example, the number of upper layer electrodes is decreased to six pieces, with no change in constitution of a basic structure body 100. That is, also in the basic structure body 100 of the modification example, the base end of a first plate-like bridge portion 120 is fixed to a bottom plate 200 of a device housing by a fixing-portion plate-like member 110 which performs a function as a fixing-portion, the leading end of the first plate-like bridge portion 120 is connected to the base end of a second plate-like bridge portion 130, and a weight body 150 is connected to the leading end of the second plate-like bridge portion 130. Upon application of an external force which causes the device housing to vibrate, the first plate-like bridge portion 120 and the second plate-like bridge portion 130 undergo deflection, by which the weight body 150 vibrates inside the device housing in the direction of each coordinate axis. This is identical in the case of the power generating element shown in FIGS. 10A and 10B.

Further, a piezoelectric element 300 is apt to polarize in the thickness direction by application of stress which expands and contracts in the layer direction. A group of upper layer electrodes is constituted in an identical manner with the power generating element shown in FIGS. 10A and 10B in that a group of first upper layer electrodes is formed through a lower layer electrode E00 and the piezoelectric element 300 on the surface of the first plate-like bridge portion 120 and a group of second upper layer electrodes is formed through the lower layer electrode E00 and the piezoelectric element 300 on the surface of the second plate-like bridge portion 130.

Here, the group of first upper layer electrodes formed at the first plate-like bridge portion 120 is provided with three types of upper layer electrodes, that is, a first central electrode (integration of the electrodes Ez3 and Ez4 shown in FIG. 10A), a first right side electrode (integration of the electrodes Ey1 and Ey3 shown in FIG. 10A) and a first left side electrode (integration of the electrodes Ey2 and Ey4 shown in FIG. 10A). Each of the upper layer electrodes is arranged so as to extend along a first longitudinal direction axis Ly and opposed to a predetermined domain of the lower layer electrode E00, facing each other with the piezoelectric element 300 therebetween. The first central electrode is arranged at a position of the center line along the first longitudinal direction axis Ly on the upper surface of the first plate-like bridge portion 120. The first right side electrode is arranged on one side of the first central electrode, and the first left side electrode is arranged on the other side of the first central electrode.

Further, the group of second upper layer electrodes formed at the second plate-like bridge portion 130 is provided with three types of upper layer electrodes, that is, a second central electrode (integration of the electrodes Ez1 and Ez2 shown in FIG. 10A), a second right side electrode (integration of the electrodes Ex1 and Ex3 shown in FIG. 10A) and a second left side electrode (integration of the electrodes Ex2 and Ex4 shown in FIG. 10A). Each of the upper layer electrodes is arranged so as to extend along a second longitudinal direction axis Lx and opposed to a predetermined domain of the lower layer electrode E00, facing each other with the piezoelectric element 300 therebetween. The second central electrode is arranged at a position of the center line along the second longitudinal direction axis Lx on the upper surface of the second plate-like bridge portion 130. The second right side electrode is arranged on one side of the second central electrode. The second left side electrode is arranged on the other side of the second central electrode.

As described above, also in the modification example in which the twelve upper layer electrodes of the three-axis type power generation type power generating element shown in FIGS. 10A and 10B are integrated into the six upper layer electrodes, the upper layer electrode is constituted with three types of electrodes, that is, a central electrode, a right side electrode and a left side electrode. Therefore, there is obtained such an effect that vibration in the direction of the X-axis or that in the direction of the Y-axis can be balanced as much as possible in total quantity between the generated positive charge and generated negative charge generated.

Nevertheless, in practice, as shown in FIGS. 10A and 10B, it is more preferable to adopt the example which uses the twelve upper layer electrodes than the above-described modification example which uses six upper layer electrodes. This is because the former is able to realize higher power generation efficiency than the latter. Reasons thereof are as follows.

In the example of FIGS. 10A and 10B which uses the twelve upper layer electrodes, there are used two sets of plate-like bridge portions 120, 130 which are arranged in the L-letter shape so as to be orthogonal to each other. When these plate-like bridge portions 120, 130 are taken as a single body, each of them is similar in structure to the plate-like bridge portion 20 shown in FIGS. 3A and 3B and provided with six upper layer electrodes arranged on the upper surface side. However, they are slightly different in behavior of expansion/contraction stress occurring upon displacement of the weight body.

That is, in the case of the plate-like bridge portion 20 shown in FIGS. 3A and 3B, when the weight body 30 undergoes displacement in the positive direction of the X-axis, as shown in FIG. 2A, the left-hand side (the upper side in the drawing) of the plate-like bridge portion 20 expands both on the side of the fixing-portion 10 and on the side of the weight body 30, while the right-hand side (the lower side in the drawing) of the plate-like bridge portion 20 contracts both on the side of the fixing-portion 10 and on the side of the weight body 30. As described above, an expansion/contraction state on the same side surface of the plate-like bridge portion 20 is similar both on the side of the fixing-portion 10 and on the side of the weight body 30. Therefore, even where the pair of right side electrodes E11, E21 shown in FIG. 3A are integrated and replaced by the right side electrode E31 shown in FIG. 6 and the pair of left side electrodes E13, E23 shown in FIG. 3A are integrated and replaced by the left side electrode E33 shown in FIG. 6, there is no chance that charge is offset and disappears, because the pair of electrodes to be integrated are equal in polarity of generated charge.

However, in the case of two sets of the plate-like bridge portions 120, 130 shown in FIGS. 10A and 10B, when the weight body 150 undergoes displacement in the positive direction of the X-axis, as shown in FIG. 11, the first leading end-side right side electrode Ey1 and the first base end-side right side electrode Ey3 arranged on the right-hand side of the first plate-like bridge portion 120 are mutually reverse in expansion/contraction state. Therefore, if they are integrated and replaced by an elongated single electrode, they are offset by each other due to a difference in polarity of the charge. This is also found in the first leading end-side left side electrode Ey2 and the first base end-side left side electrode Ey4 arranged on the left-hand side of the first plate-like bridge portion 120.

Further, in the case of two sets of the plate-like bridge portions 120, 130 shown in FIGS. 10A and 10B, when the weight body 150 undergoes displacement in the positive direction of the Y-axis, as shown in FIG. 12, the second leading end-side right side electrode Ex1 and the second base end-side right side electrode Ex3 arranged on the right-hand side of the second plate-like bridge portion 130 are mutually reverse in expansion/contraction state. Therefore, where they are integrated and replaced by an elongated single electrode, they are offset by each other due to a difference in polarity of the charge. This is also found in the second leading end-side left side electrode Ex2 and the second base end-side left side electrode Ex4 arranged on the left-hand side of the second plate-like bridge portion 130.

With the above description taken into account, in practice, as shown in the example of FIG. 10A, it is preferable that a total of twelve upper layer electrodes which are electrically independent are arranged. That is, the group of first upper layer electrodes is constituted with the group of first base end-side electrodes (Ey3, Ey4, Ez4) arranged in the vicinity of the base end of the first plate-like bridge portion 120 and the group of first leading end-side electrodes (Ey1, Ey2, Ez3) arranged in the vicinity of the leading end of the first plate-like bridge portion 120. Similarly, the group of second upper layer electrodes is constituted with the group of second base end-side electrodes (Ex3, Ex4, Ez2) arranged in the vicinity of the base end of the second plate-like bridge portion 130 and the group of second leading end-side electrodes (Ex1, Ex2, Ez1) arranged in the vicinity of the leading end of the second plate-like bridge portion 130. Here, the group of first base end-side electrodes, the group of first leading end-side electrodes, the group of second base end-side electrodes and the group of second leading end-side electrodes are each provided with three types of upper layer electrodes, that is, a central electrode, a right side electrode and a left side electrode.

As described above, the three-axis power generation type power generating element shown in FIGS. 10A and 10B is slightly different in behavior of motion from the two-axis power generation type power generating element shown in FIGS. 3A and 3B and not such that two sets of the plate-like bridge portions 20 shown in FIGS. 3A and 3B are simply combined. That is, as shown in FIG. 11 and FIG. 12, when the weight body undergoes displacement in the direction of the X-axis and in the direction of the Y-axis, there exists a part which is reverse in mode of expansion/contraction although on the same side of the plate-like bridge portion.

Further, in the two-axis power generation type power generating element shown in FIGS. 3A and 3B, power generation is decreased in efficiency greatly upon application of vibration energy in the direction of the Y-axis, as compared with a case where vibration energy in the direction of the X-axis or in the direction of the Z-axis is applied (as described above, since vibration in the direction of the Y-axis is caused by deformation motion which expands or compresses the plate-like bridge portion 20 in its entirety, the vibration is considered to be low in mechanical deformation efficiency). In the three-axis power generation type power generating element shown in FIGS. 10A and 10B, as shown in FIG. 11 and FIG. 12, where vibration energy in the direction of the X-axis or in the direction of the Y-axis is applied, in either case, it is possible to extract charge at sufficient efficiency from all the eight upper layer electrodes Ex1 to Ex4; Ey1 to Ey4.

With the above description taken into account, it is true that the three-axis power generation type power generating element which uses the twelve upper layer electrodes shown in FIGS. 10A and 10B is a power generating element quite high in power generation efficiency.

5-2. Modification Example on Lateral Arrangement of Upper Layer Electrodes

In Chapter 2-2, a description has been given of variations of the arrangement mode in the upper layer electrodes of the power generating element of first embodiment shown in FIGS. 3A and 3B by referring to FIGS. 8A to 8D. These variations are also applicable to the power generating element of the second embodiment shown in FIGS. 10A and 10B.

The side sectional view of FIG. 10B shows an example in which a lower layer electrode E00 is arranged on the upper surface of a second plate-like bridge portion 130, a piezoelectric element 300 is arranged on the upper surface of the lower layer electrode, and a right side electrode Ex1, a central electrode Ez1 and a left side electrode Ex2 are arranged on the upper surface of the piezoelectric element. This example adopts the variation shown in FIG. 8A.

That is, in this example, the lower layer electrode E00 is formed on the upper surfaces of a first plate-like bridge portion 120 and the second plate-like bridge portion 130 (actually, the lower layer electrode E00 is formed all over the upper surface of the basic structure body 100), and the piezoelectric element 300 is formed on the upper surface of the lower layer electrode E00. Then, first central electrodes Ez3, Ez4, first right side electrodes Ey1, Ey3 and first left side electrodes Ey2, Ey4 are also formed on the upper surface of the first plate-like bridge portion 120 through the lower layer electrode E00 and the piezoelectric element 300. Second central electrodes Ez1, Ez2, second right side electrodes Ex1, Ex3 and second left side electrodes Ex2, Ex4 are formed on the upper surface of the second plate-like bridge portion 130 through the lower layer electrode E00 and the piezoelectric element 300.

In contrast, where the variation shown in FIG. 8B is adopted, a lower layer electrode E00 is formed not only on the upper surfaces of a first plate-like bridge portion 120 and a second plate-like bridge portion 130 but also on the side surfaces of them, and a piezoelectric element 300 is formed on the surface of the lower layer electrode E00. Then, first central electrodes Ez3, Ez4 may be formed on the upper surface of the first plate-like bridge portion 120 through the lower layer electrode E00 and the piezoelectric element 300. First right side electrodes Ey1, Ey3 and first left side electrodes Ey2, Ey4 may be formed on the side surfaces of the first plate-like bridge portion 120 through the lower layer electrode E00 and the piezoelectric element 300. Similarly, second central electrodes Ez1, Ez2 may be formed on the upper surface of the second plate-like bridge portion 130 through the lower layer electrode E00 and the piezoelectric element 300. And, second right side electrodes Ex1, Ex3 and second left side electrodes Ex2, Ex4 may be formed on the side surfaces of the second plate-like bridge portion 130 through the lower layer electrode E00 and the piezoelectric element 300.

On the other hand, where the variation shown in FIG. 8C is adopted, a lower layer electrode E00 is formed not only on the upper surfaces of a first plate-like bridge portion 120 and a second plate-like bridge portion 130 but also on the side surfaces of them, and a piezoelectric element 300 is formed on the surface of the lower layer electrode E00. Then, first central electrodes Ez3, Ez4 may be formed on the upper surface of the first plate-like bridge portion 120 through the lower layer electrode E00 and the piezoelectric element 300. First right side electrodes Ey1, Ey3 and first left side electrodes Ey2, Ey4 may be formed from the upper surface to the side surfaces of the first plate-like bridge portion 120 through the lower layer electrode E00 and the piezoelectric element 300. Similarly, second central electrodes Ez1, Ez2 may be formed on the upper surface of the second plate-like bridge portion 130 through the lower layer electrode E00 and the piezoelectric element 300, and second right side electrodes Ex1, Ex3 and second left side electrodes Ex2, Ex4 may be formed from the upper surface to the side surfaces of the second plate-like bridge portion 130 through the lower layer electrode E00 and the piezoelectric element 300.

Of course, the power generating element of the second embodiment can be provided in combination with the arrangement modes of the upper layer electrodes in the examples shown in FIG. 8A to FIG. 8C on the basis of each part. It is also possible to adopt, for example, the mode illustrated in FIG. 8D.

Further, the piezoelectric element 300 is not necessarily formed in an integrated structure but may be arranged so as to be independent at a position corresponding to each of the upper layer electrodes. However, in practice, the integrated structure can be manufactured more easily. Similarly, the lower layer electrode E00 may be arranged so as to be independent at a position corresponding to each of the upper layer electrodes. In practice, the integrated structure can be manufactured more easily.

<5-3. Fixing-Portion Composed of Annular Structure Body>

Here, a description will be given of an example in which a fixing-portion is constituted with an annular structure body as the modification example of FIGS. 10A and 10B described in Chapter 3. FIGS. 18A and 18B covers a plan view 18(a) which shows a structure of a basic structure body 100I in the power generating device of the modification example and a side sectional view (FIG. 18B) obtained by cutting the basic structure body along the YZ plane. In the plan view of FIG. 18A, for clearly indicating a planar shape, hatching is given to interior parts of the structure body and positions of twelve upper layer electrodes are indicated by rectangles.

In the example shown in FIGS. 10A and 10B, there is used the fixing-portion plate-like member 110 which extends along the longitudinal direction axis L0 parallel to the X-axis as a fixing-portion which fixes one end of the first plate-like bridge portion 120 to the bottom plate 200 of the device housing. In contrast, in the modification example shown in FIGS. 18A and 18B, an annular structure body 110I is used as a fixing-portion. As illustrated in the drawing, the annular structure body 110I is a rectangular frame-like structure body having four sides, that is, a left side 110I1, a lower side 110I2, a right side 110I3, and an upper side 110I4. As shown in FIG. 18B, the lower surface of the annular structure body 110I in its entirety is firmly attached to the upper surface of a bottom plate 200I of a device housing.

On the other hand, the base end of a first plate-like bridge portion 120I is connected to the vicinity of the lower end of the left side 110I1 of the annular structure body 110I in the drawing. Then, the leading end of the first plate-like bridge portion 120I is connected to the base end of a second plate-like bridge portion 130I through an intermediate connection portion 125I. The leading end of the second plate-like bridge portion 130I is connected to a weight body 150I through a weight body connection portion 140I. Resultantly, the modification example is structured in such a manner that the fixing-portion is constituted with the annular structure body 110I, and the first plate-like bridge portion 120I, the second plate-like bridge portion 130I and the weight body 150I are arranged in an internal domain surrounded by the annular structure body 110I.

As described above, where such a structure is adopted that peripheries of the first plate-like bridge portion 120I, the second plate-like bridge portion 130I and the weight body 150I are surrounded by the annular structure body 110I, with a predetermined distance kept, the annular structure body 110I is able to play a role as a stopper member which controls excessive displacement of the first plate-like bridge portion 120I, the second plate-like bridge portion 130I and the weight body 150I. That is, even where the weight body 150I is subjected to excessive acceleration (such acceleration that may break each of the plate-like bridge portions 120I, 130I), each portion can be controlled for excessive displacement. It is, therefore, possible to avoid a situation that the plate-like bridge portions 120I, 130I may be broken.

5-4. Addition of Eaves Structure Portion

The modification example shown in FIGS. 18A and 18B is also characterized in that the intermediate connection portion 125I is provided with an eaves structure portion α1 which projects outside from the side surface of the leading end of the first plate-like bridge portion 120I and an eaves structure portion α2 which projects outside from the side surface of the base end of the second plate-like bridge portion 130I, and the weight body connection portion 140I is provided with an eaves structure portion α3 which projects outside from the side surface of the leading end of the second plate-like bridge portion 130I. As these eaves structure portions α1, α2 and α3 are provided, a recess is formed at a position corresponding to each of the eaves structure portions α1, α2, α3 in an internal part of the annular structure body 110I.

The inventor of the present invention has found that a structure having the illustrated eaves structure portions α1, α2 and α3 can be adopted to further improve the power generation efficiency of the power generating element. This is because adoption of the structure having the eaves structure portions α1, α2, α3 enables to enhance further expansion/contraction stress on a position at which each of the upper layer electrodes is formed. This will be explained by referring to results obtained by conducting a computer simulation on structural mechanics.

Figure 19A:
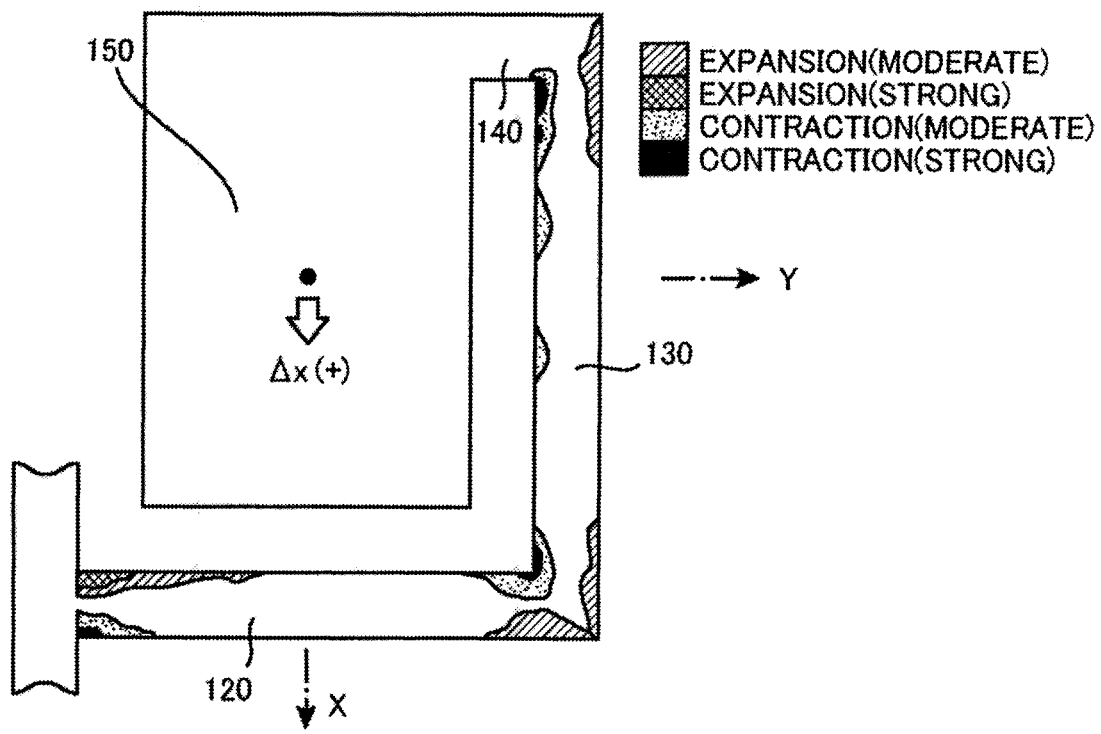
FIG. 19A is a stress distribution diagram that shows the magnitude of stress occurring at each of the plate-like bridge portions when the weight body 150 yields displacement $\Delta x(+)$ in the positive direction of the X-axis in relation to the basic structure body of the power generating element shown in FIGS. 10A and 10B and FIG. 19B is a stress distribution diagram in relation to the basic structure body of the power generating element shown in FIGS. 18A and 18B.
Figure 19B:
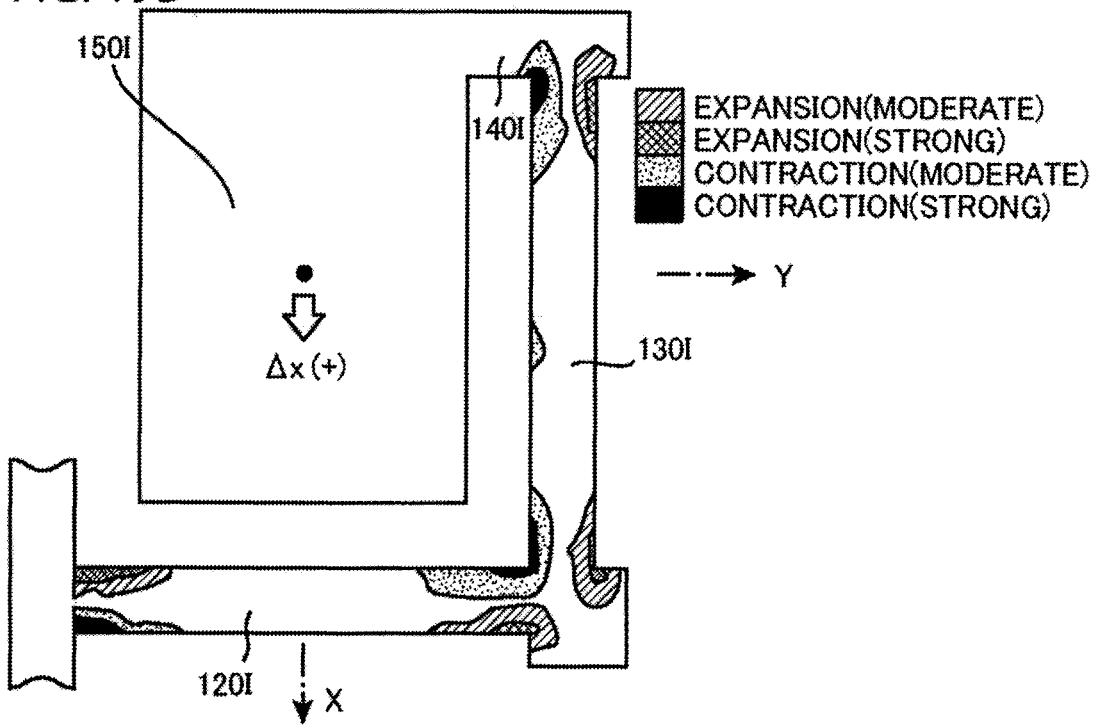

FIG. 19A is a stress distribution diagram which shows the magnitude of stress occurring at each of the plate-like bridge portions 120, 130 when the weight body 150 undergoes displacement Δx(+) in the positive direction of the X-axis in the basic structure body of the power generating element shown in FIGS. 10A and 10B. On the other hand, FIG. 19B is a stress distribution diagram which shows the magnitude of stress occurring at each of the plate-like bridge portions when the weight body 150 undergoes displacement Δx(+) in the positive direction of the X-axis in the basic structure body of the power generating element shown in FIGS. 18A and 18B (an element which adopts a structure having the eaves structure portions α1, α2, α3). In both of the distribution diagrams, individually unique hatching is given to domains at which moderate expanding stress, strong expanding stress, moderate contracting stress and strong contracting stress are applied upon occurrence of predetermined displacement (refer to remarks above on the right in each of the drawings).

Figure 20A:
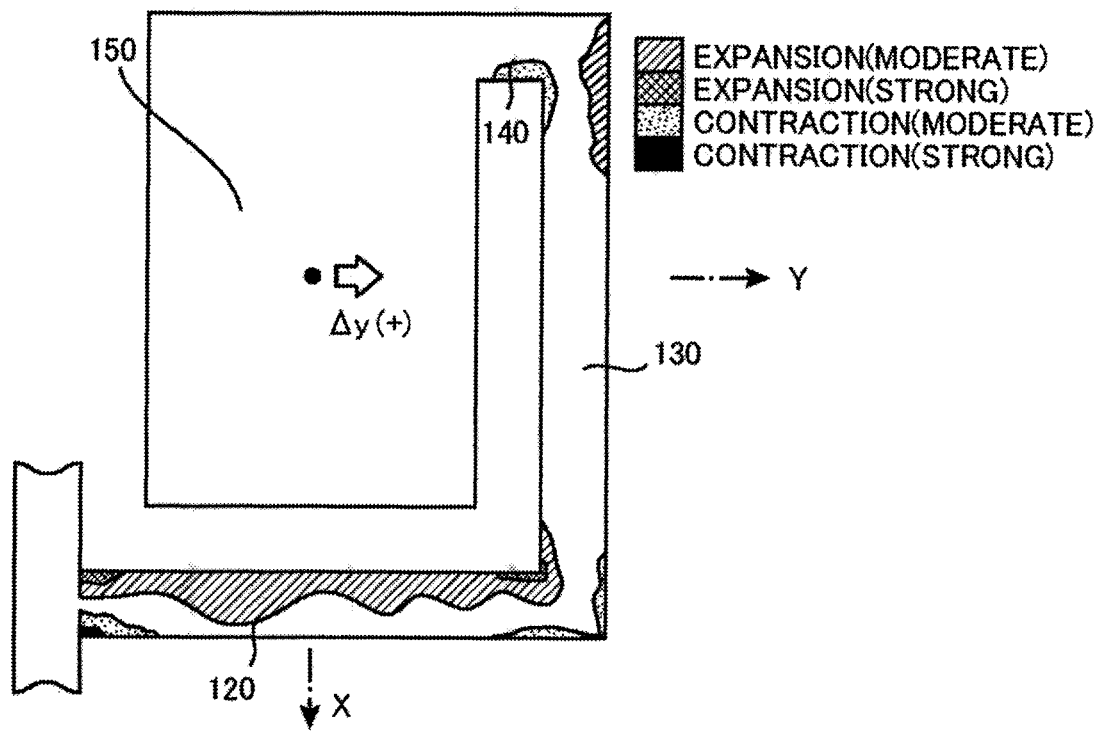
FIG. 20A is a stress distribution diagram which shows the magnitude of stress occurring at each of the plate-like bridge portions when the weight body 150 yields displacement $\Delta y(+)$ in the positive direction of the Y-axis in relation to the basic structure body of the power generating element shown in FIGS. 10A and 10B and FIG. 20B is a stress distribution diagram in relation to the basic structure body of the power generating element shown in FIGS. 18A and 18B.
Figure 20B:
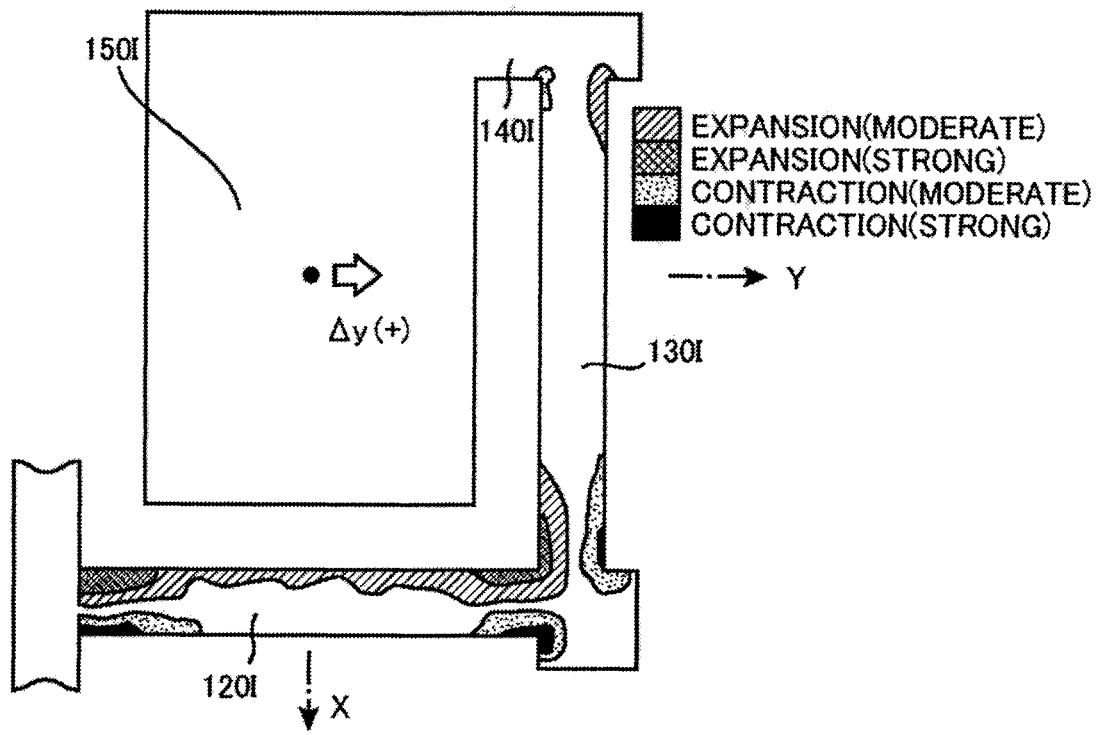
Figure 21A:
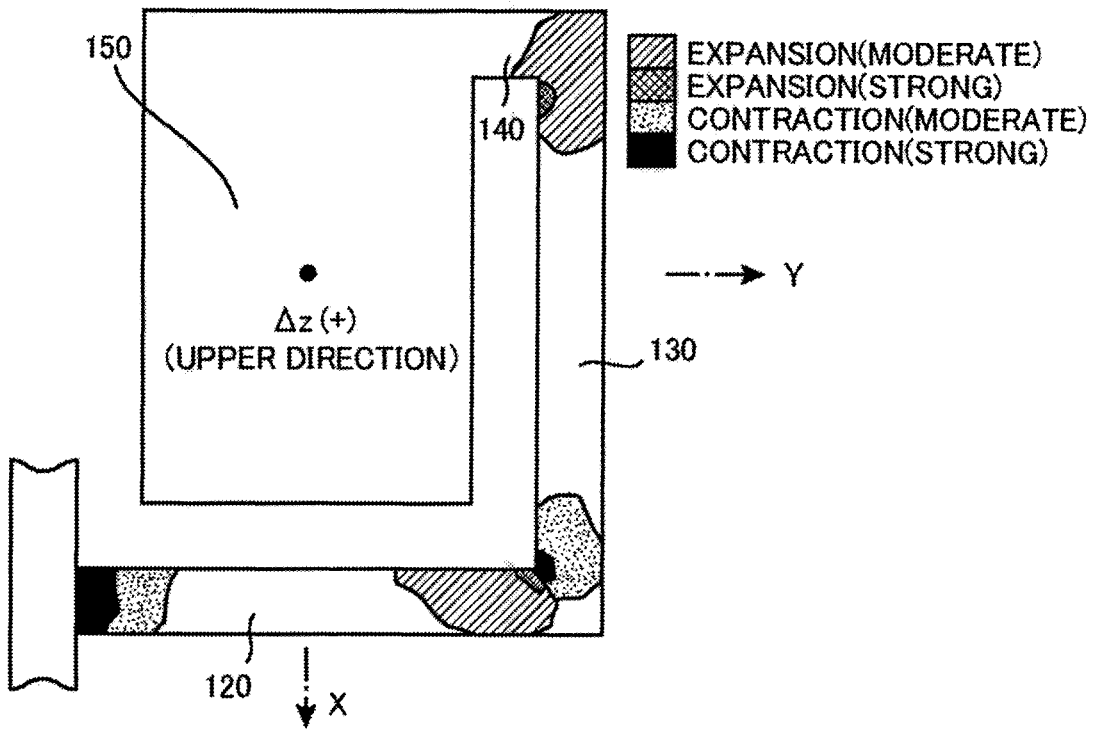
FIG. 21A is a stress distribution diagram which shows the magnitude of stress occurring at each of the plate-like bridge portions when the weight body 150 yields displacement $\Delta z(+)$ in the positive direction of the Z-axis in relation to the basic structure body of the power generating element shown in FIGS. 10A and 10B and FIG. 21B is a stress distribution diagram in relation to the basic structure body of the power generating element shown in FIGS. 18A and 18B.

Similarly, FIG. 20A is a stress distribution diagram which shows the magnitude of stress occurring at each of the plate-like bridge portions when the weight body 150 undergoes displacement Δy(+) in the positive direction of the Y-axis at the basic structure body of the power generating element shown in FIGS. 10A and 10B and FIG. 20B is a stress distribution diagram thereof at the basic structure body of the power generating element shown in FIGS. 18A and 18B. FIG. 21A is a stress distribution diagram which shows the magnitude of stress occurring at each of the plate-like bridge portions when the weight body 150 undergoes displacement Δz(+) in the positive direction of the Z-axis at the basic structure body of the power generating element shown in FIGS. 10A and 10B and FIG. 21B is a stress distribution diagram thereof at the basic structure body of the power generating element shown in FIGS. 18A and 18B.

With reference to the stress distribution diagrams of FIG. 19A, 19B and FIG. 20A, 20B, it is found that when the weight body 150 undergoes displacement in the direction of the X-axis or in the direction of the Y-axis, a relatively great expansion/contraction stress occurs at positions at which side electrodes on both sides Ex1 to Ex4; Ey1 to Ey4 are formed. On the other hand, with reference to the stress distribution diagrams of FIG. 21A, 21B, it is found that when the weight body 150 undergoes displacement in the direction of the Z-axis, a relatively great expansion/contraction stress occurs at positions at which all the upper layer electrodes Ex1 to Ex4; Ey1 to Ey4; Ez1 to Ez4 are formed. Therefore, it will be understood that the twelve upper layer electrodes shown in FIGS. 10A and 10B are optimally arranged.

Figure 21B:
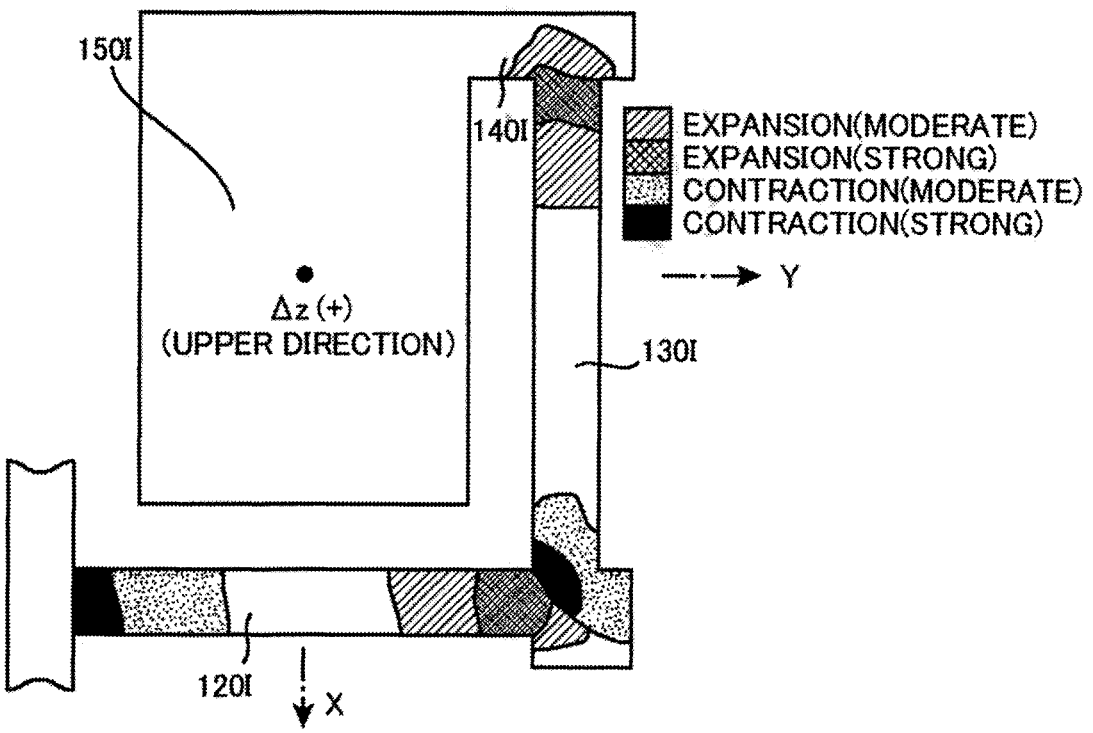

In addition, with regard to each of FIG. 19A to FIG. 21B, when FIG. 19A, FIG. 20A and FIG. 21A are compared with FIG. 19B, FIG. 20B and FIG. 21B respectively, it is found that the stress distribution diagram of FIG. 19B, FIG. 20B and FIG. 21B, in general, show a relatively great expansion/contraction stress. This fact means that, as shown in FIG. 18A, adoption of the structure having the eaves structure portions α1, α2, α3 makes it possible to efficiently concentrate stress on the base end and the leading end of the first plate-like bridge portion 120I as well as at the base end and the leading end of the second plate-like bridge portion 130I, thereby further improving power generation efficiency of the power generating element. Therefore, in practice, it is preferable to adopt the structure having the eaves structure portions α1, α2, α3, as shown in FIG. 18A.

5-5. Annular Weight Body

Next, a description will be given of a modification example in which a weight body is provided outside to give an annular structure. This modification example is such that roles of the fixing-portion (annular structure body 110I) and those of the weight body (150I) in the modification example shown in FIGS. 18A and 18B are reversed. That is, the annular structure body 110I which has functioned as a fixing-portion in the modification example shown in FIGS. 18A and 18B is allowed to function as a weight body, and the plate-like body which has functioned as the weight body 150I is allowed to function as a fixing-portion. In order to attain the above-described functions, the lower surface of the plate-like body which has functioned as the weight body 150I in FIGS. 18A and 18B may be fixed to the upper surface of a bottom plate of a device housing, and the annular structure body 110I which has functioned as the fixing-portion in FIGS. 18A and 18B may be in a suspended state of floating above the bottom plate of the device housing, with no external force applied.

FIG. 22A is a plan view which shows a structure of a basic structure body 100J of the power generating element of the modification example in which the functions are reversed as described above and FIG. 22B is a side sectional view obtained by cutting the basic structure body along the YZ plane. When comparison is made only for the plan view given as FIG. 18A and the plan view given as FIG. 22A, the basic structure body 100I shown in FIGS. 18A and 18B appears to be identical in structure to the basic structure body 100J shown in FIGS. 22A and 22B. However, when comparison is made for the side sectional views given as FIG. 18B and FIG. 22B at the respective lower parts thereof it is well understood that they are different in structure.

In the case of the basic structure body 100J shown in FIGS. 22A and 22B, a plate-like member 150J arranged at the center is given as a plate-like fixing-portion or a portion which is greater in thickness than other portions. Then, the lower surface of the plate-like fixing-portion 150J is firmly attached to the upper surface of a bottom plate 200J of a device housing. On the other hand, as shown in FIG. 22A, the base end of a first plate-like bridge portion 130J (the upper end in the drawing) is connected to a right upper corner of the plate-like fixing-portion 150J through a fixing end connection portion 140J. Further, the base end (the right end in the drawing) of a second plate-like bridge portion 120J is connected to the leading end (the lower end in the drawing) of the first plate-like bridge portion 130J through an intermediate connection portion 125J, and an annular weight body 110J is also connected to the leading end (the left end in the drawing) of the second plate-like bridge portion 120J.

As shown in FIG. 22A, the annular weight body 110J is a rectangular frame-like structure body having four sides, that is, a left side 110J1, a lower side 110J2, a right side 110J3 and an upper side 110J4. And, as shown in FIG. 22B, it is suspended so as to be in a state of floating above the bottom plate 200J of the device housing.

In the examples described above, the weight body is arranged at a position inside the basic structure body. However, in the case of the modification example shown in FIGS. 22A and 22B, the annular weight body 110J is arranged at a position outside the basic structure body 100J. As described above, where there is adopted such a structure that the annular weight body is arranged outside, in general, the mass of the weight body can be easily secured, which is advantageous in increasing the mass of the weight body to enhance power generation efficiency.

5-6. Spiral Structure Body

Figure 23:
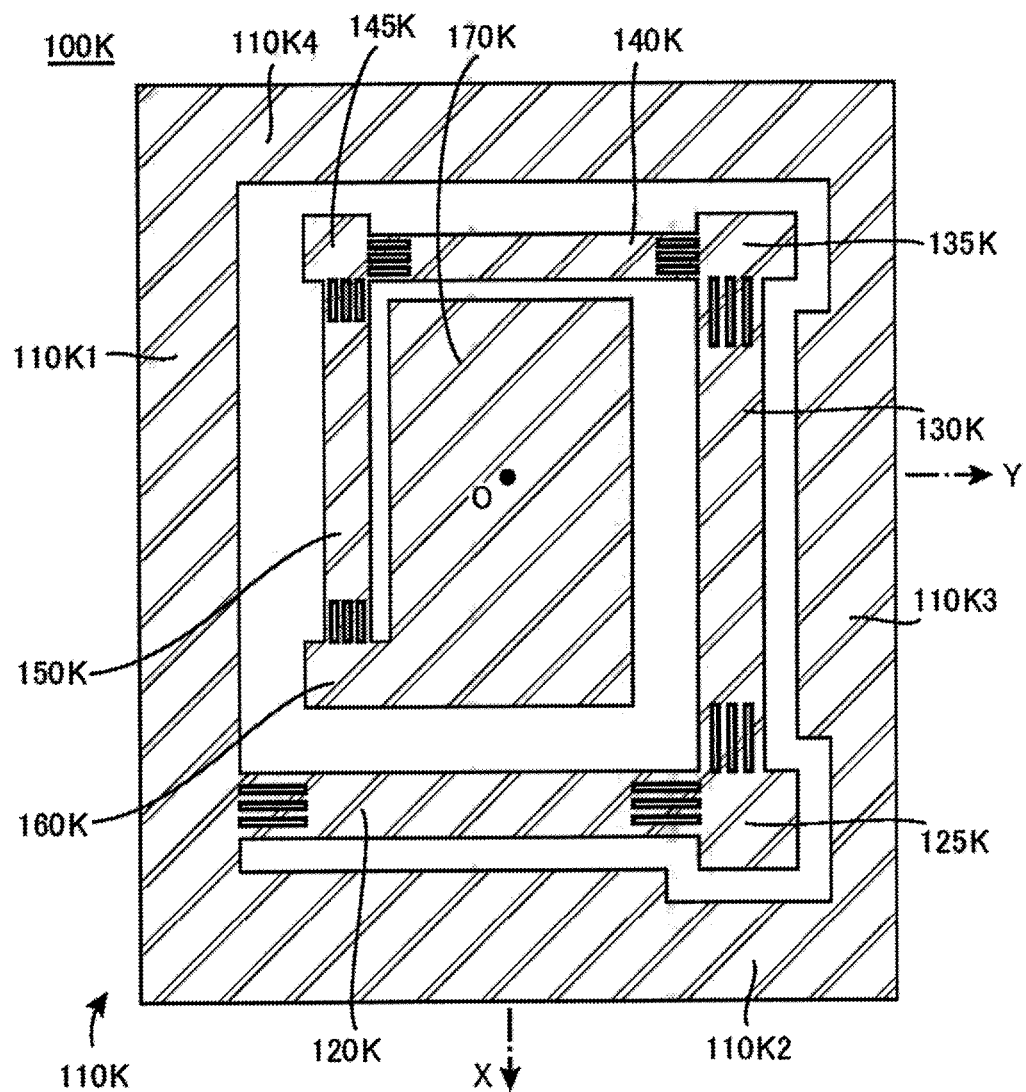
FIG. 23 is a plan view which shows a structure of a basic structure body of a power generating element which is another modification example of the power generating element shown in FIGS. 18A and 18B (hatching is given to interior parts of the structure body in order to clearly indicate a planar shape thereof).

Here, a description will be given of a modification example in which the number of the plate-like bridge portions is further increased to constitute a spiral structure body. FIG. 23 is a plan view which shows a structure of a basic structure body 100K of the power generating device in this modification example. In this drawing as well, hatching is given to interior parts of the structure body in order to clearly indicate a planar shape thereof to indicate positions of twenty-four upper layer electrodes by using rectangles.

The modification example adopts such a structure that in place of the weight body connection portion 140I of the modification example shown in FIGS. 18A and 18B, a weight body 170K is supported through a third plate-like bridge portion 140K, an intermediate connection portion 145K, a fourth plate-like bridge portion 150K and a weight body connection portion 160K.

Specifically, as illustrated in the drawing, a rectangular frame-like annular structure body 110K having four sides, that is, a left side 110K1, a lower side 110K2, a right side 110K3, an upper side 110K4, is used as a fixing-portion. The lower surface thereof in its entirety is firmly attached to the upper surface of a bottom plate of a device housing. On the other hand, the base end of a first plate-like bridge portion 120K is connected to the vicinity of the lower end of the left side 110K1 of the annular structure body 110K in the drawing. Then, the leading end of the first plate-like bridge portion 120K is connected through an intermediate connection portion 125K to the base end of a second plate-like bridge portion 130K. The leading end of the second plate-like bridge portion 130K is connected through an intermediate connection portion 135K to the base end of a third plate-like bridge portion 140K. The leading end of the third plate-like bridge portion 140K is connected through an intermediate connection portion 145K to the base end of a fourth plate-like bridge portion 150K. The leading end of the fourth plate-like bridge portion 150K is connected through the weight body connection portion 160K to a weight body 170K.

Resultantly, the modification example is structured in such a manner that a fixing-portion is constituted with the annular structure body 110K, and the first plate-like bridge portion 120K, the second plate-like bridge portion 130K, the third plate-like bridge portion 140K, the fourth plate-like bridge portion 150K, and the weight body 170 are arranged inside an internal domain surrounded by the annular structure body 110K. Here, the first plate-like bridge portion 120K and the third plate-like bridge portion 140K extend along a first and a third longitudinal direction axis parallel to the Y-axis, while the second plate-like bridge portion 130K and the fourth plate-like bridge portion 150K extend along a second and a fourth longitudinal direction axis parallel to the X-axis. As a result, the weight body 170K is supported by the structure body which is constituted by coupling the four plate-like bridge portions 120K, 130K, 140K, 150K in a spiral form.

A lower layer electrode is formed on the upper surface of each of these four plate-like bridge portions 120K, 130K, 140K, 150K, a piezoelectric element is arranged on the upper surface of the lower layer electrode, and further a group of upper layer electrodes is provided locally at a predetermined site on the upper surface of the piezoelectric element, which is similar in the examples described above. In the example shown in the drawing, three upper layer electrodes are arranged both at the base end and at the leading end of each of the four plate-like bridge portions 120K, 130K, 140K, 150K, thereby forming a total of twenty-four upper layer electrodes.

Although more complicated in structure than the examples described above, this modification example is such that a power generating circuit is able to take out electric power from charge generated at a total of twenty-four upper layer electrodes and the common lower layer electrode. Therefore, the modification example is able to improve the power generation efficiency.

FIG. 23 shows the example in which the four plate-like bridge portions 120K, 130K, 140K, 150K are provided. Of course, only three plate-like bridge portions 120K, 130K, 140K may be provided and the weight body may be directly or indirectly connected to the leading end of the third plate-like bridge portion 140K. Further, the weight body may be connected to an end at which five or more plate-like bridge portions are coupled.

In general terms, in a structure body having a first plate-like bridge portion and a second plate-like bridge portion which has been described as a basic example, a third plate-like bridge portion to a Kth plate-like bridge portion may also be provided between the second plate-like bridge portion and a weight body, and the weight body may be connected to an end at which a total of the K number of plate-like bridge portions are coupled (where, $K \geq 3$). At this time, the leading end of an ith plate-like bridge portion (where, $1 \leq i \leq K-1$) is directly or indirectly connected to the base end of an (i+1)th plate-like bridge portion, the leading end of the Kth plate-like bridge portion is directly or indirectly connected to the weight body, and a jth plate-like bridge portion (where, $1 \leq j \leq K$) extends along a jth longitudinal direction axis parallel to the Y-axis where j is an odd number and extends along a jth longitudinal direction axis parallel to the X-axis where j is an even number.

Further, the structure body from the base end of the first plate-like bridge portion to the leading end of the Kth plate-like bridge portion forms a spiral channel, and the weight body is arranged at the center position which is surrounded by the spiral channel. Thereby, as shown in the example of FIG. 23, it is possible to efficiently arrange the K number of plate-like bridge portions and the weight body at a limited space. The example shown in FIG. 23 is an example in which K is set to be equal to four in the above-described general terms.

As shown in the example of FIG. 23, where there is adopted such a constitution that the fixing-portion is constituted with the annular structure body 110K and the first plate-like bridge portion to the Kth plate-like bridge portion and the weight body are arranged in an internal domain surrounded by the annular structure body 110K, it is possible to efficiently house all the structures into the annular structure body 110K.

The above-described structure body is used to provide a lower layer electrode, a piezoelectric element and a group of upper layer electrodes also on the surfaces of the third plate-like bridge portion to the Kth plate-like bridge portion. Thereby, a power generating circuit is able to take out electric power from charge generated at these upper layer electrodes and the lower layer electrode to improve the power generation efficiency.

In the modification example shown in FIG. 23 as well, such a structure is adopted that each of the intermediate connection portions 125K, 135K, 145K and the weight body connection portion 160K have an eaves structure portion which projects outside from the side surface of the leading end of each of the plate-like bridge portions 120K, 130K, 140K, 150K, thereby providing an effect of enhancing expansion/contraction stress on a position at which each of the upper layer electrodes is formed.

That is, in general terms, where such a structure is adopted that the leading end of an ith plate-like bridge portion (where, $1 \leq i \leq K-1$) is connected to the base end of an (i+1)th plate-like bridge portion through the ith intermediate connection portion, and the leading end of a Kth plate-like bridge portion is connected to a weight body through a weight body connection portion, an ith intermediate connection portion has an eaves structure portion which projects outside from the side surface of the leading end of the ith plate-like bridge portion and the weight body connection portion has an eaves structure portion which projects outside from the side surface of the leading end of the Kth plate-like bridge portion. It is, thereby, possible to obtain an effect of enhancing expansion/contraction stress on a position at which each of the upper layer electrodes is formed and to realize more efficient electric power generation.

Of course, also in the modification example shown in FIG. 23, as with the modification example described in Chapter 5-5, it is possible that the annular structure body 110K is used as a weight body and the weight body 170K is used as a fixing-portion by reversing their roles.

<5-7. Addition of Auxiliary Weight Body>

Finally, a description will be given of a modification example in which some modification is made to adjust the mass of a weight body. As described above, in order to efficiently generate electric power on the basis of vibration applied from the outside, it is preferable that resonance frequency of the weight body is matched with frequency of vibration applied from the outside. For example, where an exclusive power generating element is mounted on a specific vehicle, it is preferable that at a stage of designing a structure, the design is made so that the resonance frequency is matched with the frequency given from the vehicle. A method adopted to adjust the mass of a weight body is the simplest way in changing the resonance frequency of a power generating element. Here, a description will be given of an example in which an auxiliary weight body is added for adjusting the mass of a weight body in each of the power generating elements.

Figure 24:
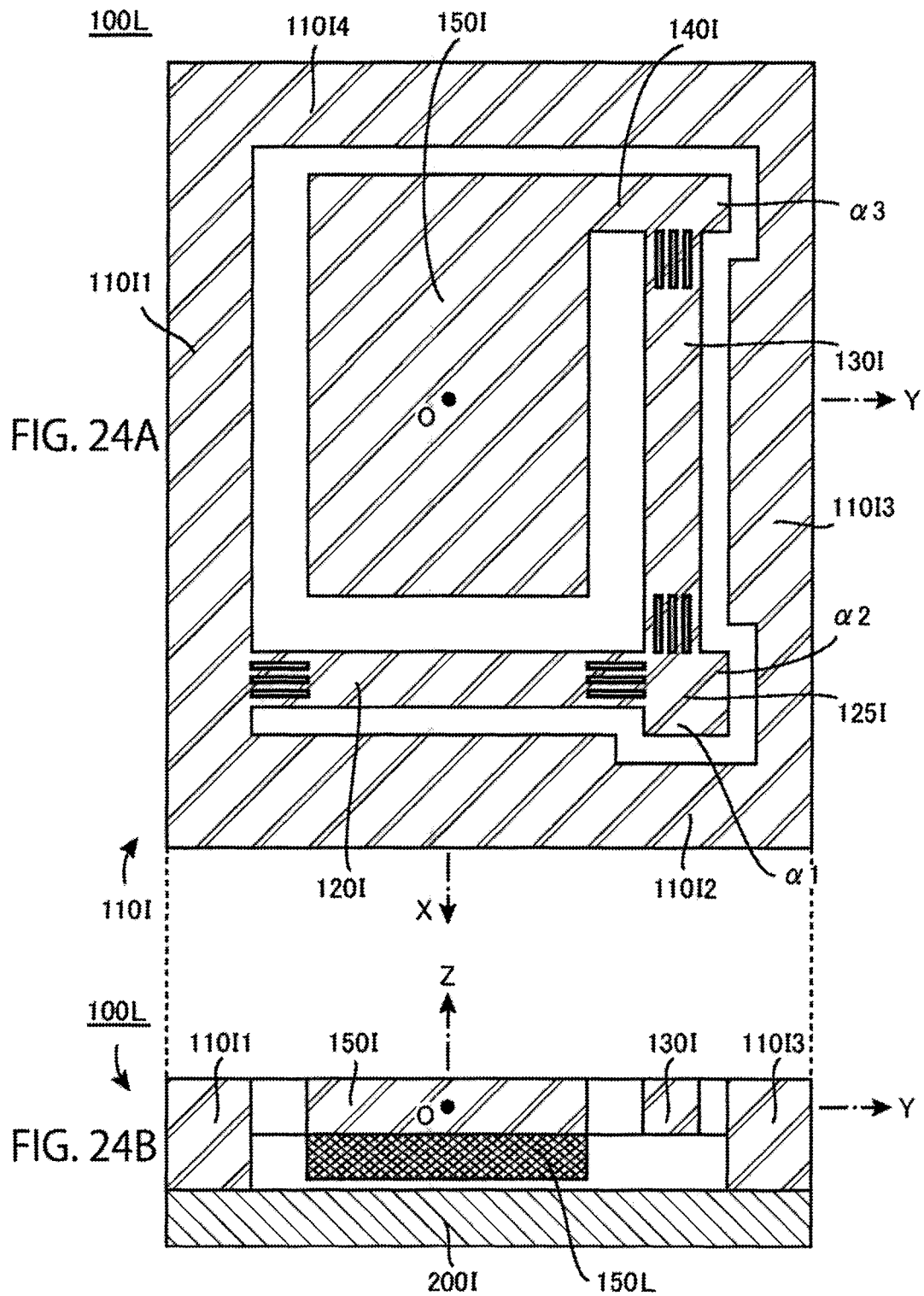
FIG. 24A is a plan view which shows a structure of a basic structure body of a power generating element which is still another modification example of the power generating element shown in FIGS. 18A and 18B (hatching is given to interior parts of the structure body in order to clearly indicate a planar shape thereon and FIG. 24B is a side sectional view when the basic structure body is cut along the YZ plane.

FIG. 24A is a plan view and FIG. 24B is a side sectional view, which are obtained by cutting the basic structure body along the YZ plane, of a modification example, in which an auxiliary weight body 150L is added to the basic structure body 100I of the power generating element shown in FIGS. 18A and 18B, thereby adjusting the mass of the weight body in its entirety. As shown in the plan view of FIG. 24A, a structure of a basic structure body 100L according to the modification example is identical in structure to the basic structure body 100I shown in FIG. 18A, when observed from above. Here, individual portions are given the same symbols as those of the basic structure body 100I shown in FIG. 18A.

On the other hand, as apparent from the side sectional view of FIG. 24B, in the basic structure body 100L of this modification example, the auxiliary weight body 150L is firmly attached to the lower surface of a weight body 150I, and an assembled body composed of the weight body 150I and the auxiliary weight body 150L performs a function as a weight body in the basic structure body 100L. In other words, the auxiliary weight body 150L is added, thus making it possible to increase the mass of the weight body in the basic structure body 100L and decrease the resonance frequency. The auxiliary weight body 150L can be adjusted for the mass by changing a material (specific density) and dimensions (thickness in the direction of the Z-axis and area of projection image on the XY plane). Therefore, the auxiliary weight body 150L is determined appropriately for the material and dimensions, by which the basic structure body 100L can be adjusted for the resonance frequency to any given value.

Figure 25:
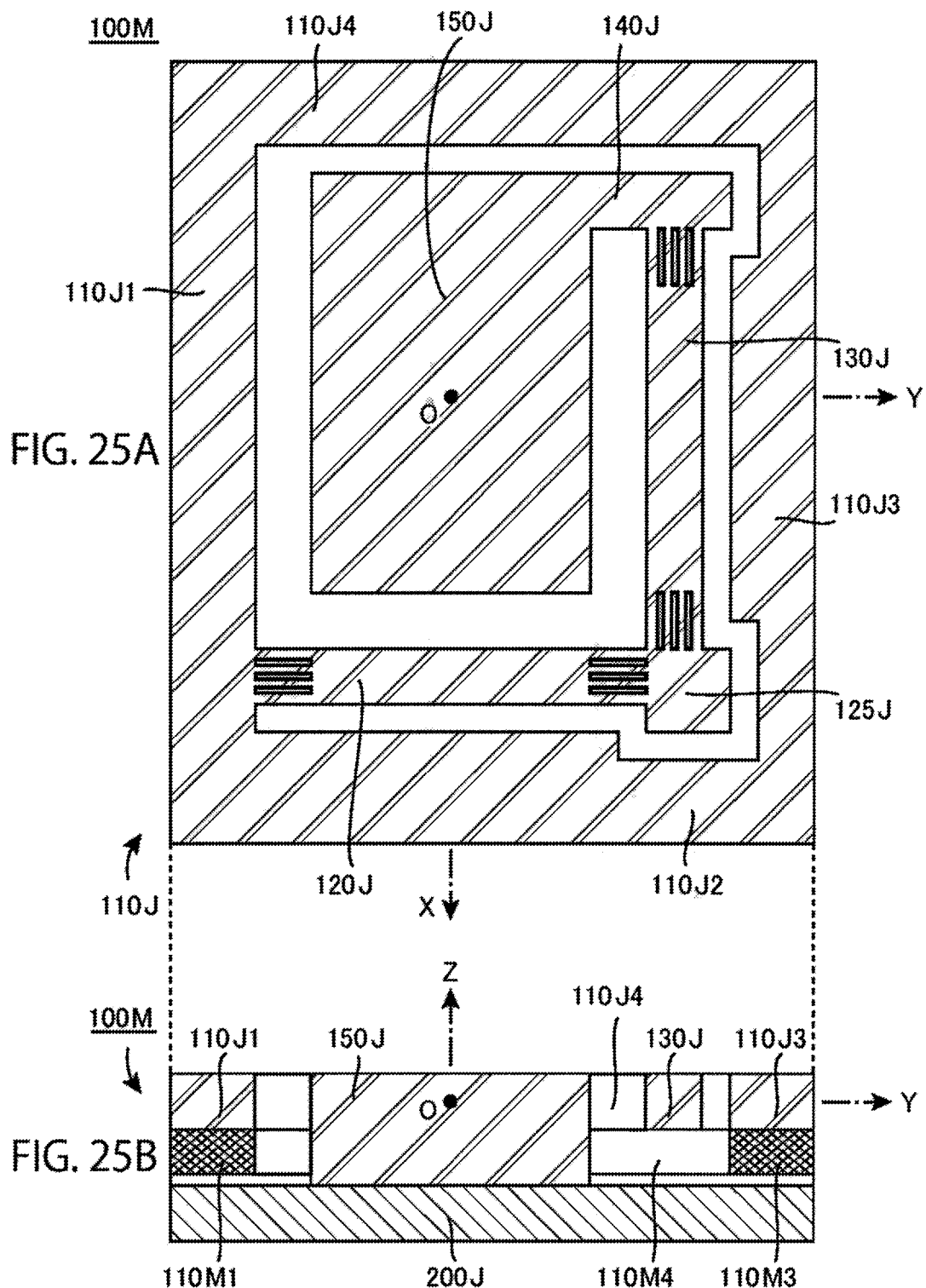
FIG. 25A is a plan view which shows a structure of a basic structure body of a power generating element which is a modification example of the power generating element shown in FIGS. 22A and 22B (hatching is given to interior parts of the structure body in order to clearly indicate a planar shape thereof and FIG. 25B is a side sectional view when the basic structure body is cut along the YZ plane.

Therefore, of course, a method of adding the auxiliary weight body to adjust the resonance frequency is also applicable to any of the examples described above. FIG. 25A is a plan view and FIG. 25B is a side sectional view, which are obtained by cutting the basic structure body along the YZ plane, of a modification example in which auxiliary weight bodies 110M1 to 110M4 are added to the basic structure body of the power generating element shown in FIGS. 22A and 22B to adjust the mass of a weight body in its entirety As shown in the plan view of FIG. 25A, a structure of a basic structure body 100M according to this modification example is identical in structure to the basic structure body 100J shown in FIG. 22A, when observed from above. Here, individual portions are given the same symbols as those of the basic structure body 100J shown in FIG. 22A.

In the example shown in FIGS. 25A and 25B, a center plate-like member 150J is given as a fixing-portion which is fixed to a device housing, and an annular structure body 110J at the periphery (a rectangular frame composed of four sides, 110J1 to 110J4) performs a function as a weight body. Here, auxiliary weight bodies are firmly attached to the lower surface of the annular structure body 110J to increase the mass. That is, as apparent from the side sectional view of FIG. 25B, in a basic structure body 100M of the modification example, the auxiliary weight bodies 110M1 to 110M4 are firmly attached to the respective lower surfaces of the respective sides 110J1 to 110J4 of the annular structure body. An assembled body composed of the annular weight body 110J and the auxiliary weight bodies 110M1 to 110M4 performs a function as a weight body in the basic structure body 100M. Therefore, it is possible to increase the mass of the weight body and decrease the resonance frequency.

In the case of the illustrated example, the auxiliary weight bodies 110M1 to 110M4 are installed on all four sides 110J1 to 110J4 of the annular weight body 110J. However, the auxiliary weight body may be installed only on a lower surface of a specific side. In order to attain well-balanced stable vibration by positioning the center of gravity of the weight body in its entirety near the origin O, however, as with the example shown in the drawing, it is preferable that the auxiliary weight bodies are evenly installed on all four sides 110J1 to 110J4. The auxiliary weight body can be adjusted for the mass by changing the thickness in the direction of the Z-axis.

Since various materials can be used as the auxiliary weight body, it is possible to select an appropriate material depending on the necessity of mass adjustment. For example, where a slight adjustment is needed, a material low in specific density such as aluminum or glass may be used. Where a great increase in mass is needed, a material high in specific density such as tungsten may be used.

In practice, the basic structure body 100I shown in FIGS. 18A and 18B or the basic structure body 100J shown in FIGS. 22A and 22B may be used to mass-produce general commercial items having a standard resonance frequency suitable for the most common use environment, auxiliary weight bodies each having appropriate mass may be added to these general commercial items to constitute the basic structure body 100L shown in FIGS. 24A and 24B or the basic structure body 100M shown in FIGS. 25A and 25B, thereby providing custom-made products having resonance frequency optimal for individual use environments. Accordingly, it is possible to lower costs of general commercial items by mass production and at the same time provide custom-made products which are optimal for individual use environments.

In each of the examples shown in FIGS. 24A and 24B and FIGS. 25A and 25B, the auxiliary weight bodies are installed on the lower surface of the original weight body. It is also possible to install an auxiliary weight body on the upper surface or side surfaces of the original weight body.

Where an auxiliary weight body is installed on the lower surface of the original weight body, it can be housed inside a space formed between the lower surface of the weight body and a bottom plate of a device housing. Therefore, for the purpose of saving space, it is preferable to install the auxiliary weight body on the lower surface of the original weight body as illustrated in the example.

A description has been given above of a method for installing the auxiliary weight bodies on the weight body to improve the power generation efficiency by matching the resonance frequency with the frequency used in an environment. Even where a power generating element is used for dissonance, an auxiliary weight body is added to increase the mass of a weight body in its entirety. Thus, there is also obtained an effect of improving power generation efficiency.

Chapter 6. Other Modification Examples

Finally, a description will be given of some other modification examples with regard to the various embodiments and modification examples described above.

<6-1. Modification Example on Arrangement of Upper Layer Electrodes>

In the embodiments described above, three types of upper layer electrodes, that is, a central electrode, a right side electrode and a left side electrode, are arranged in the vicinity of the leading end of each of plate-like bridge portions and in the vicinity of the base end thereof. Any of the upper layer electrodes is arranged so as to extend along the longitudinal direction axis of the plate-like bridge portion and opposed to a predetermined domain of the lower layer electrode, facing each other with the piezoelectric element therebetween. Here, the central electrode is arranged at a position of the center line along the longitudinal direction axis of the plate-like bridge portion. The right side electrode is arranged on one side of the central electrode, and the left side electrode is arranged on the other side of the central electrode.

The three types of upper layer electrodes are arranged as described above, by which charge of the polarity shown in the tables of FIG. 4, FIG. 7 and FIG. 14 is generated on the basis of displacement in the direction of each coordinate axis, thus making it possible to efficiently convert vibration energy including various direction components into electric energy.

Nevertheless, in carrying out the present invention, it is not always necessary to arrange three types of upper layer electrodes, that is, a central electrode, a right side electrode and a left side electrode. It is also possible to omit some of these electrodes. Hereinafter, a description will be given of some of such modification examples.

Figure 26:
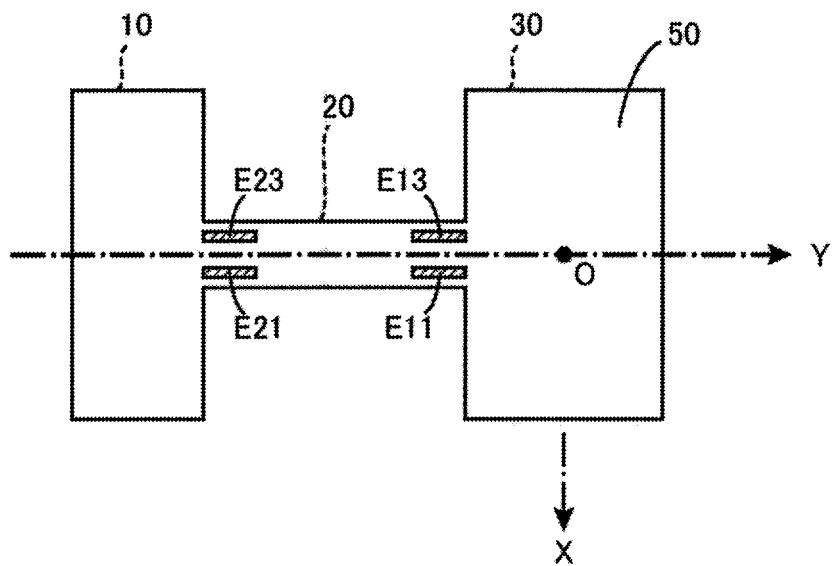
FIG. 26 is a plan view which shows a modification example in which the central electrode in the embodiment shown in FIGS. 3A and 3B is omitted.

FIG. 26 is a plan view which shows a modification example in which the central electrodes E12, E22 of the embodiment shown in FIGS. 3A and 3B are omitted. This modification example is identical to the embodiment shown in FIGS. 3A and 3B except that the central electrodes are omitted. The central electrodes E12, E22 shown in FIGS. 3A and 3B are arranged at a position of the center line along the longitudinal direction axis (Y-axis) of the plate-like bridge portion 20. As shown in the table of FIG. 4, they are electrodes which are exclusively used for electric power generation on the basis of vibration of the weight body 30 in the direction of the Z-axis. However, as shown in the table, power generation on the basis of vibration of the weight body 30 in the direction of Z-axis is also made possible by using the side electrodes E11, E13; E21, E23 on both sides (on the columns of ΔZ(+) in the table of FIG. 4, a symbol of "−" is given to all electrodes, indicating that charge is generated at all the electrodes).

Therefore, as shown in the modification example of FIG. 26, where the central electrodes are omitted and only the side electrodes on both sides E11, E13; E21, E23 are installed, it is possible to convert both vibration energy in the direction of the X-axis and vibration energy in the direction of the Z-axis into electric energy. As the power generating circuit used in the modification example, there may be used such a circuit that partial piezoelectric elements P12, P22, central electrodes E12, E22 and rectifier cells D12(+), D12(−) are omitted from the power generating circuit 60 shown in FIG. 5.

Figure 27:
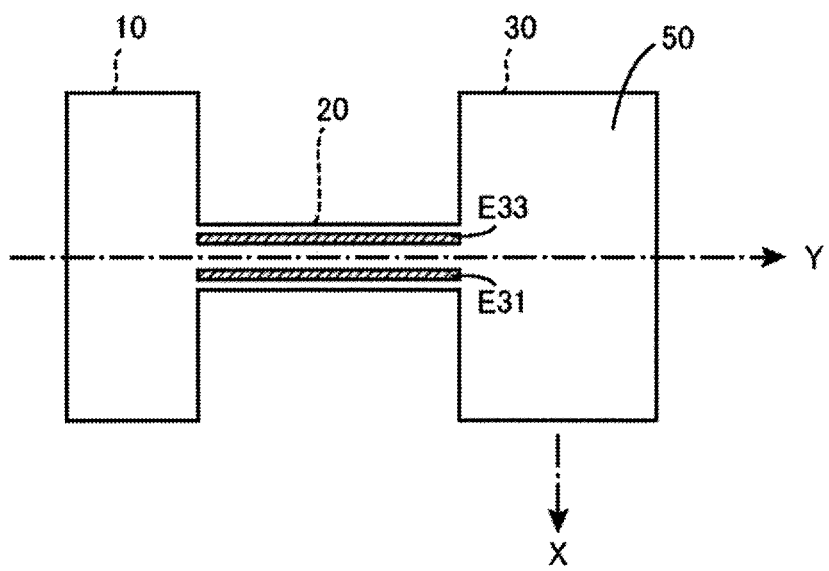
FIG. 27 is a plan view which shows a modification example in which the central electrode in the embodiment shown in FIG. 6 is omitted.

FIG. 27 is a plan view which shows a modification example in which the central electrode in the embodiment shown in FIG. 6 is omitted. This modification example is also identical to the embodiment shown in FIG. 6 except that the central electrode is omitted. The central electrode E32 shown in FIG. 6 is arranged at a position of the center line along the longitudinal direction axis (Y-axis) of the plate-like bridge portion 20. As shown in the table of FIG. 7, it is an electrode which is exclusively used in generating electric power on the basis of vibration of the weight body 30 in the direction of the Z-axis. As shown in the table, power generation on the basis of vibration of the weight body 30 in the direction of the Z-axis is also made possible by using the side electrodes on both sides E31, E33 (on the columns of ΔX(+) in the table of FIG. 7, a symbol "−" is given to all electrodes, indicating that charge is generated at all the electrodes).

Therefore, as described in the modification example of FIG. 27, even where the central electrode is omitted and only the side electrodes on both sides, E31, E33 are installed, it is possible to convert both vibration energy in the direction of the X-axis and vibration energy in the direction of Z-axis into electric energy. As the power generating circuit used in this modification example, there may be used a circuit which rectifies current produced on the basis of charge generated at the side electrodes on both sides E31, E33 by using the rectifier cells.

In short, each of the modification examples shown in FIG. 26 and FIG. 27 is an example in which, in the two-axis power generation type power generating element described in the first embodiment of Chapter 1, as the group of upper layer electrodes, only two types of upper layer electrodes composed of a right side electrode and a left side electrode are arranged, with a central electrode omitted. The right side electrode and the left side electrode are arranged so as to extend along the longitudinal direction axis of the plate-like bridge portion and opposed to a predetermined domain of the lower layer electrode, facing each other with the piezoelectric element therebetween. Then, when the center line along the longitudinal direction axis is defined, the right side electrode is arranged on one side of the center line, and the left side electrode is arranged on the other side of the center line.

FIG. 28 is a plan view which shows a modification example in which the central electrodes Ez1 to Ez4 of the embodiment shown in FIG. 10A are omitted. This modification example is identical to the embodiment shown in FIGS. 10A and 10B except that the central electrodes are omitted. The central electrodes Ez1 to Ez4 shown in FIG. 10A are arranged at a position of the center line (Ly or Lx) along the longitudinal direction axis of the first plate-like bridge portion 120 or the second plate-like bridge portion 130.

And, as shown in the table of FIG. 14, they are electrodes which are exclusively used for generating electric power on the basis of vibration of the weight body 150 in the direction of the Z-axis. As shown in the table, however, power generation on the basis of vibration of the weight body 150 in the direction of the Z-axis is also made possible by using the side electrodes on both sides Ex1 to Ex4; Ey1 to Ey4, (on the columns of Δz(+) in the table of FIG. 14, a symbol, "−" or "+" is given to all electrodes, indicating that charge is generated at all the electrodes).

Therefore, as described in the modification example shown in FIG. 28, even where the central electrodes are omitted and only the side electrodes on both sides Ex1 to Ex4; Ey1 to Ey4 are installed, it is possible to convert vibration energy in directions of three axes, the X-axis, the Y-axis and the Z-axis, into electric energy. As the power generating circuit used in this modification example, there may be used such a circuit that the partial piezoelectric elements Pz1 to Pz4, the central electrodes Ez1 to Ez4 and the rectifier cells Dz13(+), Dz13(−), Dz24(+), Dz24(−) are omitted from the power generating circuit 500 shown in FIG. 15. In short, the modification example shown in FIG. 28 is an example in which the following modification is made for the three-axis power generation type power generating element of the second embodiment described in Chapter 3.

First, a group of first upper layer electrodes is such that only two types of upper layer electrodes composed of a first right side electrode and a first left side electrode are arranged, with a first central electrode omitted. Here, the first right side electrode and the first left side electrode are arranged so as to extend along a first longitudinal direction axis Ly of a first plate-like bridge portion and opposed to a predetermined domain of a lower layer electrode, facing each other with a piezoelectric element therebetween. Then, when a first center line along the longitudinal direction axis Ly is defined, the first right side electrode is arranged on one side of the first center line, and the first left side electrode is arranged on the other side of the first center line.

On the other hand, a group of second upper layer electrodes is such that only two types of upper layer electrodes composed of a second right side electrode and a second left side electrode are arranged, with a second central electrode omitted. Here, the second right side electrode and the second left side electrode are arranged so as to extend along a second longitudinal direction axis Lx of a second plate-like bridge portion and opposed to a predetermined domain of the lower layer electrode, facing each other with the piezoelectric element therebetween. Then, when a second center line along the longitudinal direction axis Lx is defined, the second right side electrode is arranged on one side of the second center line, and the second left side electrode is arranged on the other side of the second center line.

In an example shown by FIG. 29A, in general terms, where a plate-like bridge portion 80 is connected to a fixing-portion 70, three types of upper layer electrodes, that is, a right side electrode E1, a central electrode E2, a left side electrode E3, are formed in the vicinity of the base end. In an example shown by FIG. 29B, in comparison with FIG. 29A, two types of upper layer electrodes, that is, a right side electrode E10 and a left side electrode E20 are formed.

All the three sets of upper layer electrodes shown in FIG. 29A are arranged so as to extend along a longitudinal direction axis L of the plate-like bridge portion 80. Where the longitudinal direction axis L is given as a center line in relation to the longitudinal direction of the plate-like bridge portion 80, the central electrode E2 is arranged on the center line L, the right side electrode E1 is arranged on one side of the central electrode E2 (on the right-hand side when observed from the fixing-portion 70 side), and the left side electrode E3 is arranged on the other side thereof (on the left-hand side when observed from the fixing-portion 70). In addition, in the example shown in the drawing, an arrangement pattern of the three types of upper layer electrodes assumes line symmetry with the center line L.

The above-described arrangement pattern is adopted, by which charge is generated at the central electrode E2 arranged on the center line L when a weight body undergoes displacement in a direction perpendicular to the sheet surface. However, no significant charge is generated when the weight body undergoes displacement in a direction parallel to the sheet surface. In contrast, significant charge is generated at the right side electrode E1 and the left side electrode E3 arranged on both sides of the center line L (a position deviated from the center line L) when the weight body undergoes displacement in the direction perpendicular to the sheet surface and also when undergoing displacement in the direction parallel to the sheet surface (specifically, a direction orthogonal to the center axis L).

Therefore, where three types of upper layer electrodes, the right side electrode E1, the central electrode E2 and the left side electrode E3, are formed, or even where only two types of upper layer electrodes, the right side electrode E1 and the left side electrode E3 are formed, with the central electrode E2 omitted, it is possible to convert vibration energy of the weight body in the direction perpendicular to the sheet surface and also vibration energy in the direction parallel to the sheet surface into electric energy, which remains unchanged.

Each of the modification examples shown in FIG. 26 to FIG. 28 is an example in which a central electrode is omitted on the basis of the above-described viewpoint. In FIG. 26 to FIG. 28, there is shown a modification example in which the central electrode is simply removed. In practice, however, in carrying out the modification example in which the central electrode is omitted, it is preferable that a right side electrode and a left side electrode are increased in area to increase generation of charge. FIG. 29B is such that in the example shown in FIG. 29A, the central electrode E2 is omitted and the right side electrode E1 and the left side electrode E3 are increased in area which are respectively changed into the right side electrode E10 and the left side electrode E20.

The right side electrode E10 and the left side electrode E20 shown in FIG. 29B are similar in mode of generating charge respectively to the right side electrode E1 and the left side electrode E3 shown in FIG. 29A.

However, charge is generated in an increased quantity due to an increase in area. Stress occurring at each portion upon displacement of the weight body in a direction orthogonal to the center axis L is accordingly decreased as moving closer to the center axis L. Therefore, charge to be generated is not necessarily increased in proportion to an area. Of course, the right side electrode E10 and the left side electrode E20 may be installed on the side surfaces of the plate-like bridge portion, as with each of the side electrodes E21B, E23B shown in FIG. 8B. Alternatively, they may be installed from the upper surface to the side surfaces of the plate-like bridge portion, as with each of the side electrodes E21C, E23C shown in FIG. 8C.

As described by referring to FIG. 26 to FIG. 29B, a description has been given above of the examples in which the right side electrode and the left side electrode are arranged on both sides of the center line, facing each other with the center line of the plate-like bridge portion therebetween. However, in performing a function as the power generating element, it is not always necessary to arrange both the right side electrode and the left side electrode. For example, even only one of the four upper layer electrodes of the modification example shown in FIG. 26 makes it possible to generate electric power on the basis of two axis vibration. In addition, even only one of the eight upper layer electrodes shown in the modification example of FIG. 28 makes it possible to generate electric power on the basis of three-axis vibration. However, in practice, in order to improve the power generation efficiency as much as possible, it is preferable that two types of electrodes, that is, a right side electrode and a left side electrode, are arranged in the vicinity of the base end of each of the plate-like bridge portions and in the vicinity of the leading end thereof. Alternatively, it is also preferable that three types of electrodes, that is, a central electrode, a right side electrode and a left side electrode, are arranged.

6-2. Modification Example in which Stopper Structure is Installed

As described above, the basic structure body (composed of the fixing-portion, the plate-like bridge portion and the weight body) of the power generating element according to the present invention can be constituted with a silicon substrate. However, the plate-like bridge portion is required to have such thickness that keeps flexibility at a stage of design and, therefore, not impart sufficient in rigidity. As a result, when the weight body undergoes excessive displacement due to great vibration, the plate-like bridge portion is apt to be damaged at the both ends, etc.

Therefore, in practice, it is preferable to provide a control structure for controlling excessive displacement of the weight body.

Figure 30:
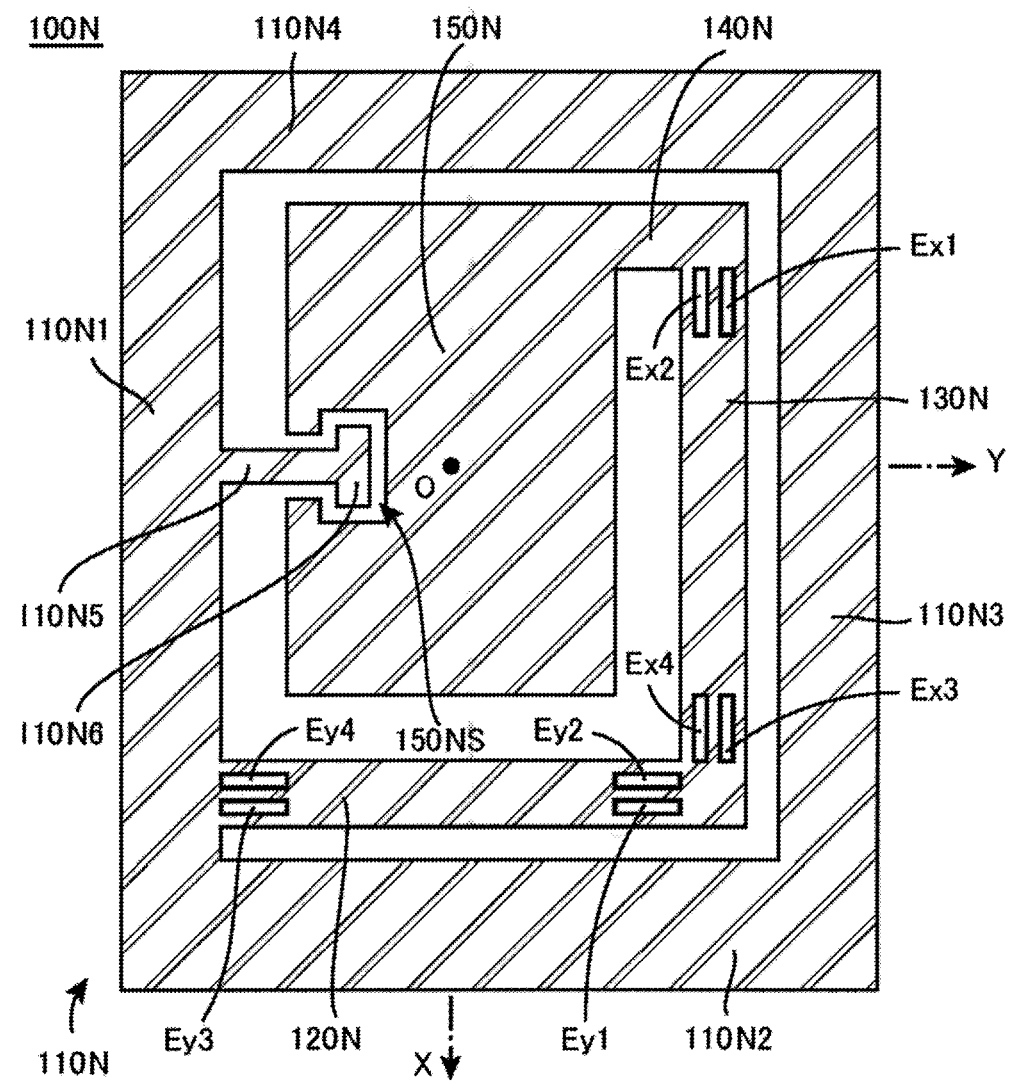
FIG. 30 is a plan view which shows a modification example in which a stopper structure is adopted in the basic structure body shown in FIGS. 18A and 18B (hatching is given to interior parts of the structure body in order to clearly indicate a planar shape thereof).

FIG. 30 is a plan view which shows a modification example in which a stopper structure is adopted for the basic structure body shown in FIGS. 18A and 18B (hatching is given to interior parts of the structure body in order to clearly indicate a planar shape thereof). As illustrated in the drawing, similarly to the example shown in FIGS. 18A and 18B, a basic structure body 100N of the modification example is such that an annular structure body 110N is used as a fixing-portion. The annular structure body 110N is a rectangular frame-like structure body having four sides, that is, a left side 110N1, a lower side 110N2, a right side 110N3, an upper side 110N4, and the lower surface thereof in its entirety is firmly attached to the upper surface of a bottom plate of a device housing.

Further, the base end of a first plate-like bridge portion 120N is connected to the vicinity of the lower end of the left side 110N1 of the annular structure body 110N. And, the leading end of the first plate-like bridge portion 120N is connected to the base end of a second plate-like bridge portion 130N. The leading end of the second plate-like bridge portion 130N is connected to a weight body 150N through a weight body connection portion 140N.

The modification example shown in FIG. 30 is characterized in that a stopper projection 110N5, 110N6, which projects in a direction toward a weight body 150N, is installed at a fixing-portion 110N and a stopper groove 150NS which houses the leading end of the stopper projection is installed on the weight body 150N.

More specifically, in the example shown in the drawing, the stopper projection stem 110N5 projects from the vicinity of the center of the left side 110N1 of the annular structure body (fixing-portion) 110N toward the weight body 150N, and the stopper projection head 110N6 is attached at the leading end of the stopper projection stem 110N5. Here, a hammer-like structure body composed of the stopper projection stem 110N5 and the stopper projection head 110N6 is a stopper projection, and the stopper groove 150NS is formed on the weight body 150N so as to house the leading end of the stopper projection. The leading end of the stopper projection is kept fitted into the stopper groove 150NS as illustrated in the drawing. However, they are not fitted to each other in a close-contact manner, but a predetermined void area is maintained between an external surface of the leading end of the stopper projection and an inner surface of the stopper groove 150NS, with no external force applied on the weight body 150N.

Although the stopper projection is in a state of being fixed to the fixing-portion 110N, the weight body 150N will yield displacement due to application of an external force. Therefore, when the weight body 150N undergoes displacement to a great extent, the outer surface of the leading end of the stopper projection is brought into contact with the inner surface of the stopper groove 150NS, thereby preventing further displacement. In other words, displacement of the weight body 150N is suppressed within a dimensional range of the void area secured between the outer surface of the leading end of the stopper projection and the inner surface of the stopper groove 150NS. As a result, even where excessive acceleration (acceleration which may break each of plate-like bridge portions 120N, 130N) is applied to the weight body 150N, excessive displacement to each portion can be suppressed. Thus, it is possible to avoid a situation that the plate-like bridge portions 120N, 130N are broken.

The example shown in FIGS. 18A and 18B indicates positions of a total of twelve upper layer electrodes, whereas the example shown in FIG. 30 indicates positions of only eight upper layer electrodes. This is because of adoption of the modification example on an arrangement of the upper layer electrodes described in Chapter 6-1. Therefore, a first leading end-side right side electrode Ey1 and a first leading end-side left side electrode Ey2 are installed in the vicinity of the leading end of the first plate-like bridge portion 120N. A first base end-side right side electrode Ey3 and a first base end-side left side electrode Ey4 are installed in the vicinity of the base end of the first plate-like bridge portion 120N. Similarly, a second leading end-side right side electrode Ex1 and a second leading end-side left side electrode Ex2 are installed in the vicinity of the leading end of the second plate-like bridge portion 130N. A second base end-side right side electrode Ex3 and a second base end-side left side electrode Ex4 are installed in the vicinity of the base end of the second plate-like bridge portion 130N. Of course, central electrodes may also be installed to arrange a total of 12 upper layer electrodes.

6-3. Modification Example in which Double-Arms Supporting Method is Adopted

Figure 31:
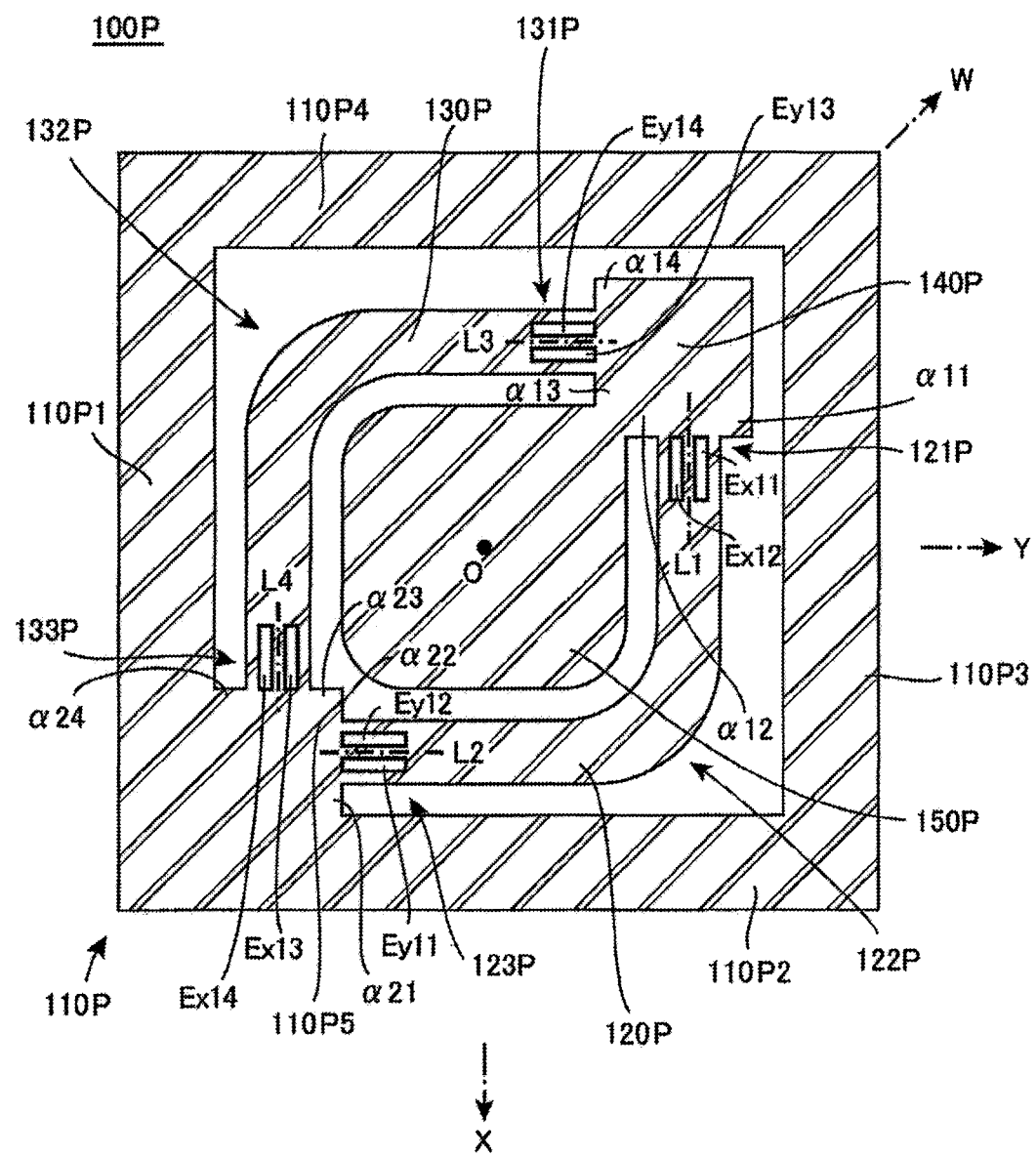
FIG. 31 is a plan view which shows a modification example in which a double-arms supporting method is adopted in the basic structure body shown in FIGS. 18A and 18B (hatching is given to interior parts of the structure body in order to clearly indicate a planar shape thereof).

FIG. 31 is a plan view which shows still another modification example of second embodiment shown in FIGS. 18A and 18B (hatching is given to interior parts of the structure body in order to clearly indicate a planar shape thereof). As illustrated in the drawing, as with the example shown in FIGS. 18A and 18B, a basic structure body 100P of the modification example is such that an annular structure body 110P is used as a fixing-portion. The annular structure body 110P is a rectangular frame-like structure body having four sides, that is, a left side 110P1, a lower side 110P2, a right side 110P3 and an upper side 110P4. This annular structure body is greatly different from that shown in FIGS. 18A and 18B in that such a structure is adopted that a starting portion 110P5 is provided below the left side of the annular structure body and two arms extending from the starting portion 110P5 support a weight body 150P.

Hereinafter, the structure of supporting the weight body by the two arms is referred to as a double-arms supporting method.

As illustrated in the drawing, a basic structure body of the double-arms supporting method is provided with a flexible first plate-like bridge portion 120P as a first arm and a flexible second plate-like bridge portion 130P as a second arm. The weight body 150P is directly or indirectly connected to both the leading end of the first plate-like bridge portion 120P and the leading end of the second plate-like bridge portion 130P.

In the example shown in the drawing, the leading end of the first plate-like bridge portion 120P and the leading end of the second plate-like bridge portion 130P are both connected to an intermediate connection portion 140P, and the weight body 150P is connected to the intermediate connection portion 140P. In other words, the weight body 150P is indirectly connected to both the leading end of the first plate-like bridge portion 120P and the leading end of the second plate-like bridge portion 130P through the intermediate connection portion 140P.

The annular structure body 110P which includes the starting portion 110P5 performs a function as a fixing-portion, and the lower surface thereof in its entirety is firmly attached to the upper surface of a bottom plate of a device housing. On the other hand, the first plate-like bridge portion 120P, the second plate-like bridge portion 130P, the intermediate connection portion 140P and the weight body 150 are such that each of the lower surfaces thereof is positioned above the lower surface of the annular structure body 110P and in a state of floating above the bottom plate of the device housing, with no external force applied. That is, the first plate-like bridge portion 120P, the second plate-like bridge portion 130P, the intermediate connection portion 140P and the weight body 150P are housed into the device housing in a state of being suspended and supported at the starting portion 110P5. The base end of the first plate-like bridge portion 120P and the base end of the second plate-like bridge portion 130P are fixed to the device housing through the starting portion 110P5 which performs a function as the fixing-portion.

A layered electrode and a piezoelectric element of the power 25, generating element using the basic structure body 100P are similar in constitution to those of the example shown in FIGS. 18A and 18B. That is, a layered lower layer electrode is formed on the surfaces of the first plate-like bridge portion 120P and the second plate-like bridge portion 130P, a layered piezoelectric element is formed on the surface of the lower layer electrode, and a plurality of upper layer electrodes are locally formed on the surface of the piezoelectric element. Further, there is used a power generating circuit which rectifies current produced on the basis of charge generated at the upper layer electrodes and the lower layer electrode and takes out electric power. This is also similar to the example shown in FIGS. 18A and 18B.

When an external force which causes vibration to the device housing is applied on the power generating element, the first plate-like bridge portion 120P and the second plate-like bridge portion 130P undergo deflection, by which the weight body 150P vibrates inside the device housing in the direction of each coordinate axis. The piezoelectric element is apt to polarize in the thickness direction due to application of stress which expands and contracts in the layer direction. Therefore, as with the example shown in FIGS. 18A and 18B, the power generating circuit can be used to take out electric power.

In the double-arms supporting method, the base end of the first plate-like bridge portion 120P and the base end of the second plate-like bridge portion 130P are connected to the same starting portion 110P5 of the annular structure body 110P (the fixing-portion). Therefore, there is provided such a structure that the weight body 150P is supported like a cantilever beam in relation to the fixing-portion, thereby causing the weight body 150P to efficiently vibrate. Further, the two plate-like bridge portions are provided, which is advantageous in increasing charge generated by the piezoelectric element.

In the example shown in FIG. 31, the basic structure body is formed in a predetermined shape so that electric power can be generated efficiently on the basis of a vibration component in the direction of the X-axis and a vibration component in the direction of the Y-axis. That is, in the example shown here, a leading end vicinity 121P of the first plate-like bridge portion 120P extends in a direction parallel to the X-axis, and a base end vicinity 123P of the first plate-like bridge portion 120P extends in a direction parallel to the Y-axis. Then, an intermediate portion 122P between the leading end vicinity 121P and the base end vicinity 123P is bent so as to give a curved line. Similarly, a leading end vicinity 131P of the second plate-like bridge portion 130P extends in a direction parallel to the Y-axis, and a base end vicinity 133P of the second plate-like bridge portion 130P extends in a direction parallel to the X-axis. Then, an intermediate portion 132P between the leading end vicinity 131P and the base end vicinity 133P is bent to give a curved line.

The example shown in FIG. 31 indicates positions of a total of eight upper layer electrodes adopted in the modification example described in Chapter 6-1 on arrangement of the upper layer electrodes (the central electrode is omitted, and the right side electrode and the left side electrode are arranged on both sides of the center line).

That is, a group of upper layer electrodes is constituted with a group of first leading end-side upper layer electrodes, Ex11, Ex12, which is formed on the surface of the leading end vicinity 121P of the first plate-like bridge portion 120P through the lower layer electrode and the piezoelectric element, a group of first base end-side upper layer electrodes, Ey11, Ey12, which is formed on the surface of the base end vicinity 123P of the first plate-like bridge portion 120P through the lower layer electrode and the piezoelectric element, a group of second leading end-side upper layer electrodes, Ey13, Ey14, which is formed on the surface of the leading end vicinity 131P of the second plate-like bridge portion 130P through the lower layer electrode and the piezoelectric element, and a group of second base end-side upper layer electrodes, Ex13, Ex14, which is formed on the surface of the base end vicinity 133P of the second plate-like bridge portion 130P through the lower layer electrode and the piezoelectric element.

Here, the group of first leading end-side upper layer electrodes is provided with two types of upper layer electrodes composed of the first leading end-side right side electrode Ex11 and the first leading end-side left side electrode Ex12. Each of the upper layer electrodes is arranged so as to extend along the direction of the X-axis and opposed to a predetermined domain of the lower layer electrode, facing each other with the piezoelectric element therebetween. When a first leading end-side center line L1 parallel to the X-axis is defined at the leading end vicinity 121P of the first plate-like bridge portion 120P, the first leading end-side right side electrode Ex1 is arranged on one side of the first leading end-side center line L1, and the first leading end-side left side electrode Ex12 is arranged on the other side of the first leading end-side center line L1.

Further, the group of first base end-side upper layer electrodes is provided with two types of upper layer electrodes composed of the first base end-side right side electrode Ey11 and the first base end-side left side electrode Ey12. Each of the upper layer electrodes is arranged so as to extend along the direction of the Y-axis and opposed to a predetermined domain of the lower layer electrode, facing each other with the piezoelectric element therebetween. When a first base end-side center line L2 parallel to the Y-axis is defined at the base end vicinity of the first plate-like bridge portion 120P, the first base end-side right side electrode Ey11 is arranged on one side of the first base end-side center line L2. The first base end-side left side electrode Ey12 is arranged on the other side of the first base end-side center line L2.

Then, the group of second leading end-side upper layer electrodes is provided with two types of upper layer electrodes composed of the second leading end-side right side electrode Ey13 and the second leading end-side left side electrode Ey14. Each of the upper layer electrodes is arranged so as to extend along the direction of the Y-axis and opposed to a predetermined domain of the lower layer electrode, facing each other with the piezoelectric element therebetween. When a second leading end-side center line L3 parallel to the Y-axis is defined at the leading end vicinity 131P of the second plate-like bridge portion 130P, the second leading end-side right side electrode Ey13 is arranged on one side of the second leading end-side center line L3, and the second leading end-side left side electrode Ey14 is arranged on the other side of the second leading end-side center line L3.

Finally, the group of second base end-side upper layer electrodes is provided with two types of upper layer electrodes composed of the second base end-side right side electrode Ex13 and the second base end-side left side electrode Ex14. Each of the upper layer electrodes is arranged so as to extend along the direction of the X-axis and opposed to a predetermined domain of the lower layer electrode, facing each other with the piezoelectric element therebetween. When a second base end-side center line L4 parallel to the X-axis is defined at the base end vicinity 133P of the second plate-like bridge portion 130P, the second base end-side right side electrode Ex13 is arranged on one side of the second base end-side center line L4, and the second base end-side left side electrode Ex14 is arranged on the other side of the second base end-side center line L4.

Of course, it is possible to form a total of twelve upper layer electrodes without omitting the central electrode. In this case, a first leading end-side central electrode may be installed between the first leading end-side right side electrode Ex11 and the first leading end-side left side electrode Ex12, a first base end-side central electrode may be installed between the first base end-side right side electrode Ey11 and the first base end-side left side electrode Ey12, a second leading end-side central electrode may be installed between the second leading end-side right side electrode Ey13 and the second leading end-side left side electrode Ey14, and a second base end-side central electrode may be installed between the second base end-side right side electrode Ex13 and the second base end-side left side electrode Ex14.

In the example shown in FIG. 31 as well, in order to concentrate stress on the leading end and the base end of each of the plate-like bridge portions 120P, 130P, an eaves structure portion is formed at the intermediate connection portion 140P. That is, the intermediate connection portion 140P is provided with eaves structure portions $\alpha 11$, $\alpha 12$ which project laterally on both sides from side surfaces of the leading end of the first plate-like bridge portion 120P and eaves structure portions $\alpha 13$, $\alpha 14$ which project laterally on both sides from side surfaces of the leading end of the second plate-like bridge portion 130P.

Similarly, the starting portion 110P5 which performs a function as the fixing-portion is also provided with an eaves structure portion. That is, the starting portion 110P5 is provided with eaves structure portions $\alpha 21$, $\alpha 22$ which project laterally on both sides from side surfaces of the base end of the first plate-like bridge portion 120P and eaves structure portions $\alpha 23$, $\alpha 24$ which project laterally on both sides from side surfaces of the base end of the second plate-like bridge portion 130P.

As shown in the sample of FIG. 31, such a mode is adopted that the fixing-portion is constituted with the annular structure body 110P, at an internal domain surrounded by the annular structure body 110P, the first plate-like bridge portion 120P, the second plate-like bridge portion 130P and the weight body 150P are arranged, the first plate-like bridge portion 120P and the second plate-like bridge portion 130P are structured so as to be curved, and the weight body 150P is arranged in a domain, the periphery of which is surrounded by these bridge portions. Thereby, it is possible to efficiently house the individual members in a planar manner and also to use the annular structure body 110P as it is as a part of the device housing.

Charge generated at each of the upper layer electrodes Ex11, Ex12, Ey11, Ey12 on the first plate-like bridge portion 120P, the arrangement of which is shown in FIG. 31, is similar in characteristics to charge generated at each of the upper layer electrodes Ex1, Ex2, Ey3, Ey4 in the example shown in FIG. 10A (refer to the table of FIG. 14). Further, since the example shown in FIG. 31 assumes line symmetry with a symmetric axis W in the drawing (the axis in which the Y-axis is inclined by 45 degrees) in terms of the planar shape, charge generated at each of the upper layer electrodes formed on the second plate-like bridge portion 130P has characteristics of line symmetry with the symmetric axis W, as compared with the characteristics of charge generated at each of the upper layer electrodes formed on the first plate-like bridge portion 120P.

Of course, in the example shown in FIG. 31 as well, in order that roles of the fixing-portion and those of the weight body are reversed, by which the annular structure body 110P which has functioned as the fixing-portion is allowed to function as a weight body and the plate-like body 150P which has functioned as the weight body is allowed to function as a fixing-portion, it is possible to adopt such a mode that the lower surface of the plate-like body 150P is fixed to the upper surface of a bottom plate of a device housing and the annular structure body 110P is in a suspended state of floating above the bottom plate of the device housing, with no external force applied.

Further, each of the right side electrodes and each of the left side electrodes may be installed on side surfaces of the plate-like bridge portion, as described in each of the side electrodes E21B, E23B shown in FIG. 8B or may be installed from the upper surface to the side surfaces of the plate-like bridge portion, as described in each of the side electrodes E21C, E23C shown in FIG. 8C.

Figure 32:
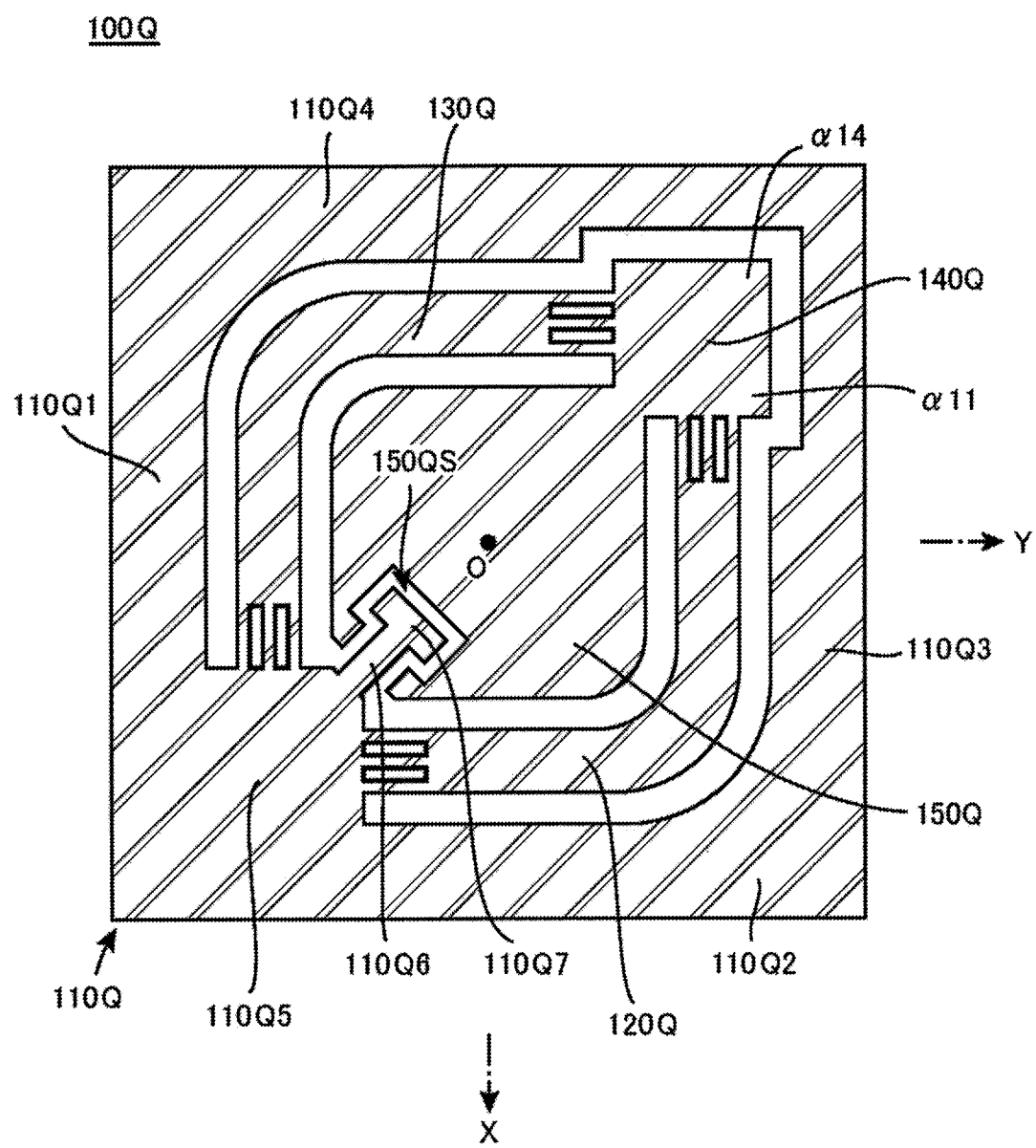
FIG. 32 is a plan view which shows a modification example in which a stopper structure is adopted in the basic structure body shown in FIG. 31 (hatching is given to interior parts of the structure body in order to clearly indicate a planar shape thereof).

FIG. 32 is a plan view which shows a modification example in which the stopper structure described in Chapter 6-2 is adopted as the basic structure body shown in FIG. 31. A basic structure body 100Q of this modification example is similar in basic structure to the basic structure body 100P shown in FIG. 31. That is, an annular structure body 110Q which performs a function as a fixing-portion is a rectangular frame-like structure body having four sides, that is, a left side 110Q1, a lower side 110Q2, a right side 110Q3 and an upper side 110Q4. The lower surface thereof in its entirety is firmly attached to the upper surface of a bottom plate of a device housing.

Further, a starting portion 110Q5 is installed below the left side of the annular structure body 110Q. An intermediate connection portion 140Q is supported by a first plate-like bridge portion 120Q and a second plate-like bridge portion 130Q each extending from the starting portion 110Q5, and a weight body 150Q is connected to the intermediate connection portion 140Q.

The modification example shown in FIG. 32 is characterized in that a stopper projection 110Q6, 110Q7 which projects in a direction toward the weight body 150Q is installed at the fixing-portion 110Q, and a stopper groove 150QS which houses the leading end of the stopper projection is installed at the weight body 150Q.

More specifically, in the example shown in the drawing, a stopper projection stem 110Q6 projects toward the weight body 150Q from the starting portion 110Q5 of the annular structure body 110Q (fixing-portion).

A stopper projection head 110Q7 is attached at the leading end of the stopper projection stem 110Q6. Here, a hammer-like structure body composed of the stopper projection stem 110Q6 and the stopper projection head 110Q7 is a stopper projection. The stopper groove 150QS is formed on the weight body 150Q so as to house the leading end of the stopper projection. The leading end of the stopper projection is kept fitted into the stopper groove 150QS as illustrated in the drawing. They are not fitted to each other in a close-contact manner, but a predetermined void area is maintained between an external surface of the leading end of the stopper projection and an inner surface of the stopper groove 150QS in a state that no external force is applied on the weight body 150Q.

The above-described stopper structure is able to suppress excessive displacement at each portion, even where excessive acceleration (acceleration which will break each of the plate-like bridge portions 120Q, 130Q) is applied to the weight body 150Q. Thus, as already described in Chapter 6-2, it is possible to avoid such a situation that the plate-like bridge portions 120Q, 130Q may be broken.

In the modification example shown in FIG. 32, the annular structure body 110Q is also slightly modified in its shape. That is, an internal shape of the annular structure body 110Q is formed so as to be in agreement with an external shape of each of the first plate-like bridge portion 120Q, the second plate-like bridge portion 130Q and the intermediate connection portion 140Q so that a clearance between them is set in predetermined dimensions. The predetermined dimensions are set so as to have appropriate values in suppressing excessive displacement at each portion by bringing an external surface of each of the first plate-like bridge portion 120Q, the second plate-like bridge portion 130Q and the intermediate connection portion 140Q into contact with an internal surface of the annular structure body 110Q, when excessive acceleration is applied on the weight body 150Q.

Therefore, the modification example shown in FIG. 32 is provided with both a function to control displacement by the stopper projection and a function to control displacement by the internal surface of the annular structure body 110Q. These functions to control displacement are able to protect the plate-like bridge portions 120Q, 130Q from breakage even when excessive acceleration is applied to the weight body 150Q.

Figure 33:
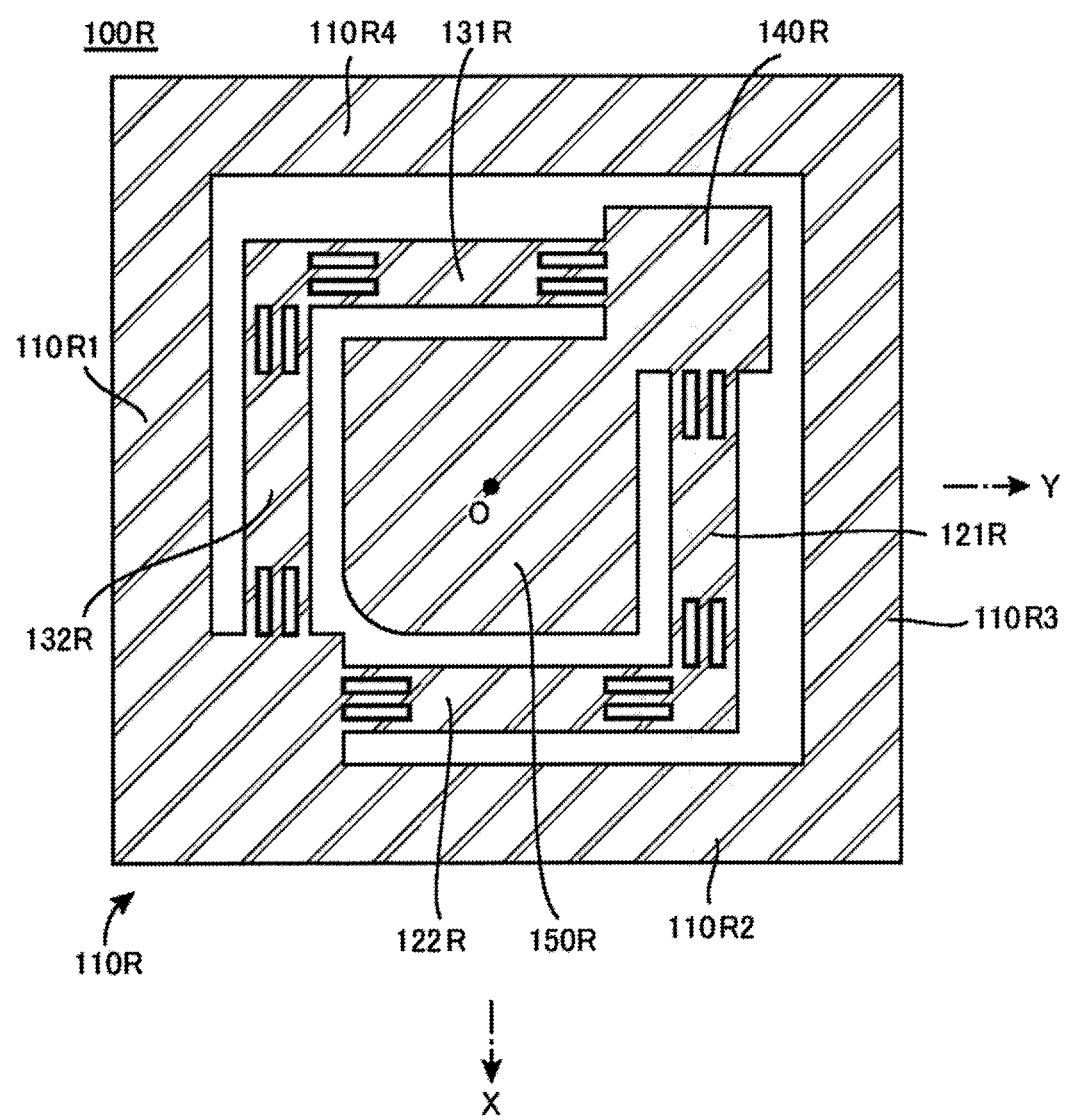
FIG. 33 is a plan view which shows a modification example in which the plate-like bridge portion of the basic structure body shown in FIG. 31 is changed in shape (hatching is given to interior parts of the structure body in order to clearly indicate a planar shape thereof).

FIG. 33 is a plan view which shows another modification example of the basic structure body 100P shown in FIG. 31. A basic structure body 100R shown in FIG. 33 is also such that a fixing-portion is constituted with a rectangular frame-like annular structure body 110R having four sides, that is, a left side 110R1, a lower side 110R2, a right side 110R3 and an upper side 110R4, two arm portions are provided at an internal domain of the annular structure body, and a weight body 150R is supported through an intermediate connection portion 140R, which is similar to the example shown in FIG. 31. They are different in structure of the two arm portions.

In the example shown in FIG. 31, the two arms are constituted with the first plate-like bridge portion 120P and the second plate-like bridge portion 130P, each of which is bent so as to give a curved line at the intermediate portion. In the example shown in FIG. 33, however, the two arms are each formed by an L-letter shaped plate-like bridge portion which is bent at a right angle at an intermediate portion. That is, a first arm is structured so that a first plate-like leading end-side bridge portion 121R extending in a direction parallel to the X-axis is combined in an L-letter shape with a first plate-like base end-side bridge portion 122R extending in a direction parallel to the Y-axis. A second arm is structured so that a second plate-like leading end-side bridge portion 131R extending in a direction parallel to the Y-axis is combined in an L-letter shape with a second plate-like base end-side bridge portion 132R extending in a direction parallel to the X-axis.

Further, FIG. 31 indicates positions of a total of eight upper layer electrodes which are arranged at positions on both sides of each of the arms. FIG. 33 indicates positions of a total of sixteen upper layer electrodes in which two electrodes (a right side electrode and a left side electrode) are arranged each at positions on both sides of the first plate-like leading end-side bridge portion 121R, at positions on both sides of the first plate-like base end-side bridge portion 122R, at positions on both sides of the second plate-like leading end-side bridge portion 131R and at positions on both sides of the second plate-like base end-side bridge portion 132R. This is because an intermediate portion of the arm is bent at a right angle, thus resulting in concentration of stress on the vicinity of the bent portion. Of course, central electrodes may also be arranged at the above-described individual positions to install a total of twenty-four upper layer electrodes.

Charge generated at each of the upper layer electrodes is similar in characteristics to charge generated at each of the upper layer electrodes shown in the example of FIGS. 10A and 10B (refer to the table of FIG. 14).

Here, a detailed description will be omitted.

Chapter 7. Basic Concept of the Present Invention

Finally, a basic concept of the present invention described above by referring to various embodiments and modification examples thereof will be briefly described for each of the power generating elements different in mode of the basic structure body.

(1) Invention Described as First Embodiment in Chapter 1 and Chapter 2 (Two-Axis Power Generation Type)

This invention relates to a power generating element which is provided with a flexible bridge portion which extends along a predetermined longitudinal direction axis, a weight body which is connected to one end of the bridge portion, a device housing which houses the bridge portion and the weight body, a fixing-portion which fixes the other end of the bridge portion to the device housing, a piezoelectric element which is fixed at a predetermined position on the surface of the bridge portion, and a power generating circuit which rectifies current produced on the basis of charge generated at the piezoelectric element to take out electric power, thereby generating electric power by converting vibration energy into electric energy.

The power generating element is constituted so that upon application of an external force which causes the device housing to vibrate, the weight body vibrates inside the device housing due to deflection of the bridge portion. The piezoelectric element is arranged at a position on the surface of the bridge portion at which expansion/contraction deformation occurs on the basis of vibration of the weight body, that is, at a position deviating from the center line along the longitudinal direction axis and is apt to generate charge on the basis of the expansion/contraction deformation. As described above, the piezoelectric element which is arranged at the position deviating from the center line has a function to convert both vibration energy of the weight body in a perpendicular direction and vibration energy in a horizontal direction into electric energy, thus realizing two-axis power generation type.

(2) Invention Described as Second Embodiment in Chapter 3 and Chapter 5 (Three-Axis Power Generation Type)

This invention relates to a power generating element which is provided with a flexible first bridge portion which extends along a first longitudinal direction axis, a flexible second bridge portion which is directly or indirectly connected to the first bridge portion, extends along a longitudinal direction axis, a weight body which is directly or indirectly connected to the second bridge portion, a device housing which houses the first bridge portion, the second bridge portion and the weight body, a fixing-portion which fixes one end of the first bridge portion to the device housing, a piezoelectric element which is fixed to a predetermined position on the surface of each of the first bridge portion and the second bridge portion, and a power generating circuit which rectifies current produced on the basis of charge generated at the piezoelectric element to take out electric power, thereby generating electric power by converting vibration energy into electric energy.

In the power generating element, the fixing-portion fixes the base end of the first bridge portion to the device housing, the leading end of the first bridge portion is directly or indirectly connected to the base end of the second bridge portion, and the weight body is directly or indirectly connected to the leading end of the second bridge portion. Then, the power generating element is constituted so that the weight body vibrates inside the device housing due to deflection of the first bridge portion and the second bridge portion upon application of an external force which causes the device housing to vibrate. The piezoelectric element is arranged at a position at which expansion/contraction deformation occurs on the basis of vibration of the weight body on the surface of each of the first bridge portion and the second bridge portion and apt to generate charge on the basis of the expansion/contraction deformation. In order to effect efficient three-axis power generation, it is preferable that the piezoelectric element is at least partially arranged at a position deviating from the center line along the longitudinal direction axis of each of the plate-like bridge portions.

(3) Invention Described as the Modification Example of Second Embodiment in Chapter 6-3 (Double-Arms Supporting Method)

This invention relates to a power generating element which is provided with a flexible first bridge portion and a flexible second bridge portion, a weight body which is directly or indirectly connected to both the leading end of the first bridge portion and the leading end of the second bridge portion, a device housing which houses the first bridge portion, the second bridge portion and the weight body, a fixing-portion which fixes the base end of the first bridge portion and the base end of the second bridge portion to the device housing, a piezoelectric element which is fixed at a predetermined position on the surface of each of the first bridge portion and the second bridge portion, and a power generating circuit which rectifies current produced on the basis of charge generated at the piezoelectric element to take out electric power, thereby generating electric power by converting vibration energy into electric energy.

In the power generating element, the base end of the first bridge portion and the base end of the second bridge portion are connected to the same starting portion of the fixing-portion. An intermediate portion between the leading end vicinity of the first bridge portion and the base end vicinity thereof is curved or bent, and an intermediate portion between the leading end vicinity of the second bridge portion and the base end vicinity thereof is curved or bent. Then, the power generating element is constituted so that the weight body vibrates inside the device housing due to deflection of the first bridge portion and the second bridge portion when an external force which causes the device housing to vibrate is applied. The piezoelectric element is arranged at a position on the surface of each of the first bridge portion and the second bridge portion at which expansion/contraction deformation occurs on the basis of vibration of the weight body and apt to generate charge on the basis of the expansion/contraction deformation. Since each of the first bridge portion and the second bridge portion is curved or bent at the intermediate portion, various types of stress occur at the leading end vicinity and the base end vicinity, which is effective in converting vibration energy in various directions into electric energy. In order to realize efficient three-axis power generation, it is preferable that the piezoelectric element is at least partially arranged at a position which deviates from the center line along the longitudinal direction axis of each of the plate-like bridge portions.

(4) In the description and drawings given above in the present application, for convenience of description, a description has been given of the structure, shape and arrangement of each portion by using an XYZ three-dimensional coordinate system. And, the XYZ three-dimensional coordinate system is a system in which the X-axis, the Y-axis and the Z-axis are orthogonal to each other.

However, in carrying out the present invention, the XYZ three-dimensional coordinate system which has been referred to in the description is not necessarily a three-dimensional orthogonal coordinate system in which the X-axis, the Y-axis and the Z-axis are orthogonal to each other. The present invention can be designed by using a three-dimensional non-orthogonal coordinate system. This three-dimensional non-orthogonal coordinate system refers to a three-dimensional coordinate system in which at least the X-axis is not orthogonal to the Y-axis. The present invention can be designed by using as a three-dimensional coordinate system, for example, a coordinate system in which the X-axis and the Y-axis are defined as a coordinate axis that intersects at any given angle so as not to be orthogonal and the Z-axis is defined as a coordinate axis that is orthogonal to both the X-axis and the Y-axis.

The examples described above by using the three-dimensional orthogonal coordinate system have a function to efficiently convert vibration energy applied in the direction of each coordinate axis of the three-dimensional orthogonal coordinate system into electric energy and also have been characterized by simplifying a manufacturing process. The basic concept of the present invention is as described above, and the power generating element obtained by embodying the basic concept may be such that the longitudinal direction axis of each of the bridge portions is in any given direction. For example, in the basic structure body shown in FIG. 31, the leading end vicinity and the base end vicinity of each of the bridge portions are set in such a direction that each of the center axes L1 to L4 is parallel to the X-axis or the Y-axis in the three-dimensional orthogonal coordinate system. However, the center axes L1 to L4 may be given in any individually different directions.

Of course, where a power generating element is known in advance to be used in a vibration environment in which the power generating element is oriented in a specific direction, it is preferable that the power generating element is designed so as to be optimal in the vibration environment concerned. For example, the power generating element shown in FIGS. 1A and 1B is optimal in efficiently converting vibration energy in the direction of the X-axis and vibration energy in the direction of the Z-axis in the three-dimensional orthogonal coordinate system into electric energy. The power generating element shown in FIGS. 10A and 10B is optimal in efficiently converting vibration energy in the direction of each coordinate axis in the three-dimensional orthogonal coordinate system into electric energy.

However, in practice, it is difficult to exactly understand a direction of vibration in an environment where a power generating element is actually mounted. In the case of a general-use power generating element, such an element will be sufficient that the longitudinal direction axis of each bridge portion is set in any given direction and any number of piezoelectric elements (as many piezoelectric elements as possible will be preferable in improving the power generation efficiency) are arranged at any given sites of the bridge portion (a site on which stress will concentrate is preferable in improving the power generation efficiency). Even generation of charge with any polarity at these piezoelectric elements will not pose any problem, as long as current is rectified and electric power is taken out by using a power generating circuit.

Figure 34:
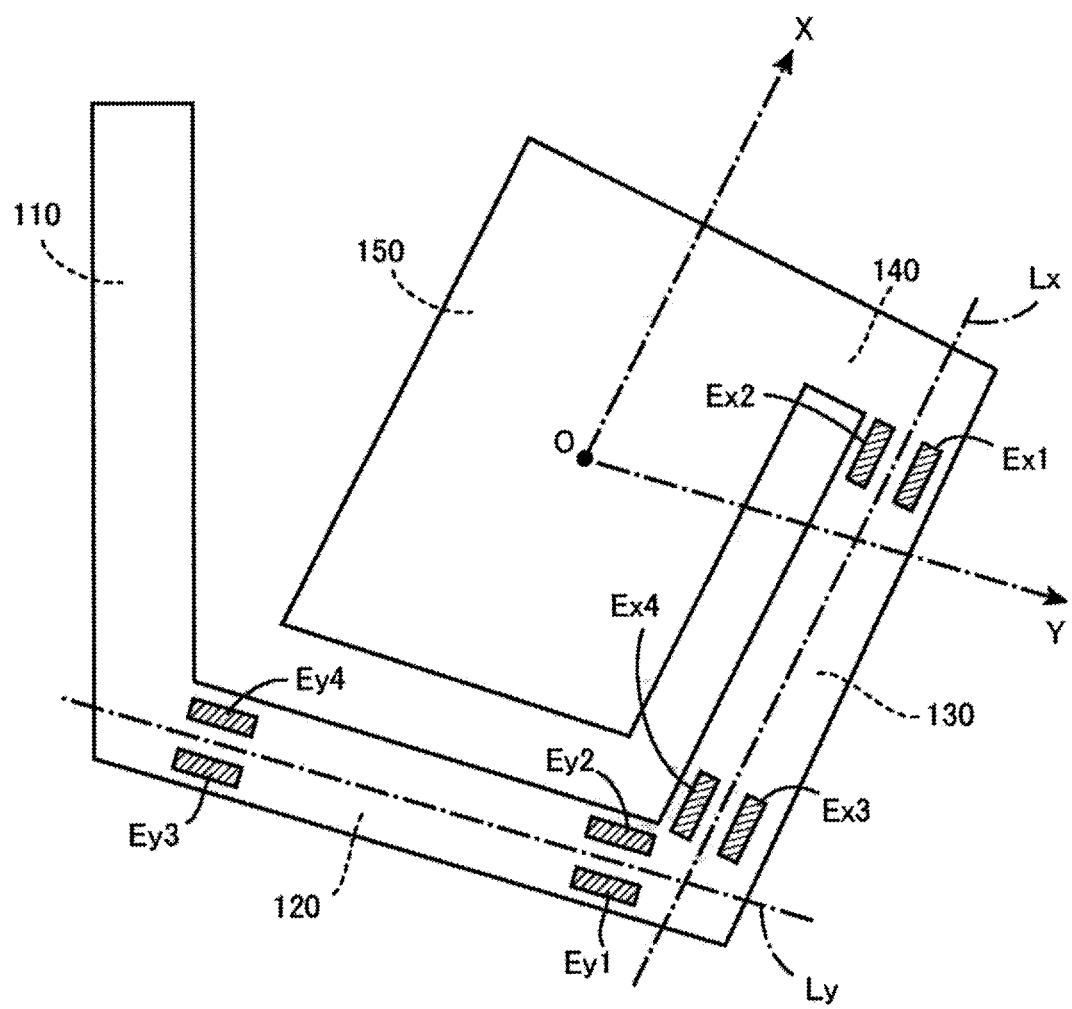
FIG. 34 is a plan view which shows a modification example in which the orthogonal coordinate system in the power generating element of FIGS. 10A and 10B is changed to a non-orthogonal coordinate system.

FIG. 34 is a plan view which shows a modification example in which the orthogonal coordinate system of the power generating element shown in FIGS. 10A and 10B is changed to a non-orthogonal coordinate system to omit the central electrodes Ez1 to Ez4. For convenience of description, the same symbols as those of the example shown in FIGS. 10A and 10B are used to indicate individual portions of the modification example shown in FIG. 34. Constituents with the same symbol are fundamentally similar in function. Since the non-orthogonal coordinate system is used in the modification example shown in FIG. 34, the X-axis is not orthogonal to the Y-axis (the Z-axis is in a direction perpendicular to the sheet surface). Therefore, a first longitudinal direction axis Ly which is defined as an axis parallel to the Y-axis and a second longitudinal direction axis Lx which is defined as an axis parallel to the X-axis are not mutually orthogonal axes. A first plate-like bridge portion 120 and a second plate-like bridge portion 130 are arranged in an inclined manner. Further, a weight body 150 is also formed in a trapezoidal plate-like member. As described above, a basic structure body is formed in an irregular shape, which will not, however, pose any problem at all to a basic function as the power generating element.

(5) A description has been given above of various embodiments and their modification examples. These embodiments and modification examples can be freely used in combination. In the description of the present application and drawings, only examples in which some of them have been combined are disclosed. However, these embodiments and modification examples may be combined in any manner to carry out the present invention, as long as contradictions are found with each other.

INDUSTRIAL APPLICABILITY

The power generating element of the present invention is widely applicable to technologies which convert vibration energy into electric energy to generate electric power. A basic principle thereof is to impart periodic deflection to a piezoelectric element by vibration of a weight body, thereby taking out to the outside charge generated on the basis of stress applied on the piezoelectric element. Therefore, the power generating element is attached to vehicles such as automobiles, trains and ships as well as vibration sources such as refrigerators and air conditioners, by which vibration energy which would be otherwise wasted in most cases can be effectively utilized as electric energy.

The invention claimed is:

1. A power generating element which converts vibration energy in at least one coordinate direction of an XYZ three-dimensional coordinate system into electric energy to generate electric power, the power generating element, comprising:
a flexible plate-like bridge portion which extends along a longitudinal direction axis parallel to a Y-axis;
a weight body which is directly connected to the plate-like bridge portion;
a device housing which houses the plate-like bridge portion and the weight body;
a fixing-portion which fixes an end of the plate-like bridge portion to the device housing;
a lower layer electrode which is layered on a surface of the plate-like bridge portion;
a piezoelectric element which is layered on a surface of the lower layer electrode;
a plurality of upper layer electrodes which are formed locally on a surface of the piezoelectric element; and
a power generating circuit which rectifies current produced on the basis of charge generated at the upper layer electrodes and the lower layer electrode to take out electric power; wherein
the fixing-portion fixes a base end of the plate-like bridge portion to the device housing, a leading end of the plate-like bridge portion is directly connected to the weight body,
the weight body is constituted so as to vibrate inside the device housing due to deflection of the plate-like bridge portion, when there is applied an external force which causes the device housing to vibrate,
the piezoelectric element is apt to polarize in a thickness direction due to application of stress which expands or contracts in a layer direction, the plate-like bridge portion extends along the Y-axis from the base end to the leading end, the plurality of upper layer electrodes include a leading end-side electrode arranged in a vicinity of the leading end of the plate-like bridge portion and a base end-side electrode arranged in a vicinity of the base end of the plate-like bridge portion, both the leading end-side electrode and the base end-side electrode are electrodes to take out charges generated by a vibration of the weight body.

2. The power generating element according to claim 1, wherein the plate-like bridge portion is placed in a XY plane, charges of the same sign are generated in the leading end-side electrode and the base end-side electrode when a vibration energy in a direction of a Z-axis is applied to the weight body.

3. A power generating element which converts vibration energy in at least one coordinate direction of an XYZ three-dimensional coordinate system into electric energy to generate electric power, the power generating element, comprising:

a flexible plate-like bridge portion which extends along a longitudinal direction axis parallel to a Y-axis;

a weight body which is indirectly connected to the plate-like bridge portion;

a device housing which houses the plate-like bridge portion and the weight body;

a fixing-portion which fixes an end of the plate-like bridge portion to the device housing;

a lower layer electrode which is layered on a surface of the plate-like bridge portion;

a piezoelectric element which is layered on a surface of the lower layer electrode;

a plurality of upper layer electrodes which are formed locally on a surface of the piezoelectric element; and a power generating circuit which rectifies current produced on the basis of charge generated at the upper layer electrodes and the lower layer electrode to take out electric power; wherein the fixing-portion fixes a base end of the plate-like bridge portion to the device housing, a leading end of the plate-like bridge portion is indirectly connected to the weight body, the weight body is constituted so as to vibrate inside the device housing due to deflection of the plate-like bridge portion, when there is applied an external force which causes the device housing to vibrate, the piezoelectric element is apt to polarize in a thickness direction due to application of stress which expands or contracts in a layer direction, the plate-like bridge portion extends along the Y-axis from the base end to the leading end, the plurality of upper layer electrodes include a leading end-side electrode arranged in a vicinity of the leading end of the plate-like bridge portion and a base end-side electrode arranged in a vicinity of the base end of the plate-like bridge portion, both the leading end-side electrode and the base end-side electrode are electrodes to take out charges generated by a vibration of the weight body.

4. The power generating element according to claim 3, wherein the plate-like bridge portion is placed in a XY plane, charges of different sign are generated in the leading end-side electrode and the base end-side electrode when a vibration energy in a direction of a Z-axis is applied to the weight body.

* * * * *